(12) United States Patent
Funk et al.

(10) Patent No.: US 7,502,709 B2
(45) Date of Patent: Mar. 10, 2009

(54) DYNAMIC METROLOGY SAMPLING FOR A DUAL DAMASCENE PROCESS

(75) Inventors: Merritt Funk, Austin, TX (US); Radha Sundararajan, Dripping Springs, TX (US); Daniel Joseph Prager, Hopewell Junction, NY (US); Wesley Natzle, New Paltz, NY (US)

(73) Assignees: Tokyo Electron, Ltd., Tokyo (JP); International Business Machines Corporation, Armonk, NY (US)

( * ) Notice: Subject to any disclaimer, the term of this patent is extended or adjusted under 35 U.S.C. 154(b) by 275 days.

(21) Appl. No.: 11/390,412

(22) Filed: Mar. 28, 2006

(65) Prior Publication Data

US 2007/0231930 A1  Oct. 4, 2007

(51) Int. Cl.
  *G06F 3/00*  (2006.01)
(52) U.S. Cl. .................. 702/127; 702/128; 702/183
(58) Field of Classification Search .................. 702/35, 702/64, 127, 183, 189, 182; 356/369; 438/637, 438/692
See application file for complete search history.

(56) References Cited

U.S. PATENT DOCUMENTS

| | | | |
|---|---|---|---|
| 6,352,591 B1 | 3/2002 | Yieh et al. | |
| 6,828,542 B2 | 12/2004 | Ye et al. | |
| 6,881,665 B1* | 4/2005 | Tsui et al. | 438/637 |
| 6,947,141 B2* | 9/2005 | Bischoff et al. | 356/369 |
| 7,078,344 B2* | 7/2006 | Bailey et al. | 438/692 |
| 2002/0193899 A1 | 12/2002 | Shanmugasundram et al. | |
| 2003/0204348 A1 | 10/2003 | Suzuki et al. | |
| 2004/0267399 A1 | 12/2004 | Funk | |
| 2005/0132306 A1 | 6/2005 | Smith et al. | |
| 2005/0187649 A1 | 8/2005 | Funk et al. | |
| 2006/0007453 A1 | 1/2006 | Horak et al. | |
| 2006/0042543 A1 | 3/2006 | Funk et al. | |
| 2006/0047356 A1 | 3/2006 | Funk et al. | |
| 2006/0064193 A1 | 3/2006 | Yamashita et al. | |

OTHER PUBLICATIONS

International Search Report in Application No. PCT/US07/060953 mailed Feb. 14, 2008.
International Search Report in Application No. PCT/US07/060960 mailed Feb. 20, 2008.
International Search Report issued in International Application No. PCT/US07/60951, dated Sep. 25, 2007.
International Preliminary Report on Patentability issued in Application No. PCT/US07/060953 mailed Oct. 9, 2008.
International Preliminary Report on Patentability issued in Application No. PCT/US07/060960 mailed Oct. 9, 2008.

* cited by examiner

*Primary Examiner*—Eliseo Ramos Feliciano
*Assistant Examiner*—Felix E Suarez
(74) *Attorney, Agent, or Firm*—DLA Piper LLP US

(57) ABSTRACT

A method of monitoring a dual damascene procedure that includes calculating a pre-processing confidence map for a damascene process, the pre-processing confidence map including confidence data for a first set of dies on the wafer. An expanded pre-processing measurement recipe is established for the damascene process when one or more values in the pre-processing confidence map are not within confidence limits established for the damascene process. A reduced pre-processing measurement recipe for the first damascene process is established when one or more values in the pre-processing confidence map are within confidence limits established for the damascene process.

33 Claims, 44 Drawing Sheets

DYNAMIC METROLOGY SAMPLING FOR A DUAL DAMASCENE PROCESS

CROSS-REFERENCE TO RELATED APPLICATIONS

This application is related to U.S. patent application Ser. No. 10/705,200, now U.S. Pat. No. 6,951,821, entitled "Processing System And Method For Chemically Treating A Wafer", filed on Nov. 12, 2003; U.S. patent application Ser. No. 10/704,969, now U.S. Pat. No. 7,079,760, entitled "Processing System And Method For Thermally Treating A Wafer", filed on Nov. 12, 2003; U.S. patent application Ser. No. 10/705,397, now U.S. Pat. No. 7,214,274, entitled "Method And Apparatus for Thermally Insulating Adjacent Temperature Controlled Chambers", filed on Nov. 12, 2003; U.S. patent application Ser. No. 10/944,463, now U.S. Pat. No. 7,209,798, entitled "Iso/Nested Cascading Trim Control With Model Feedback Updates"; filed Sep. 20, 2004; U.S. patent application Ser. No. 11/046,903, now U.S. Pat. No. 7,328,418, entitled "Iso/Nested Control For Soft Mask Processing"; filed Feb. 1, 2005; U.S. patent application Ser. No. 11/390,469, entitled "Dynamic Metrology Sampling With Wafer Uniformity Control", filed even date herewith; and U.S. patent application Ser. No. 11/390,415, entitled "Dynamic Metrology Sampling With Wafer Uniformity Control", filed on even date herewith. The contents of each of these applications are herein incorporated by reference in their entireties.

BACKGROUND OF THE INVENTION

1. Field of the Invention

The present invention relates to a system and method for processing a wafer, and more particularly to a system and method for using run-to-run control and dynamic sampling to improve within wafer uniformity and process throughput.

2. Description of the Related Art

The use of feed forward controllers has long been established in the fabrication of semiconductor integrated circuits by semiconductor manufacturing facilities (fabs). Until recently, wafers were treated as a batch or a lot, with the same processing performed on each of the wafers in the lot. The size of the lot varies depending on the manufacturing practices of the fab but is typically limited to a maximum of 25 wafers. Measurements were routinely made on a few wafers in the lot and adjustments made to the processing based on these sample measurements. This method of control based on sample measurements on the lot and process recipe adjustments for the following lots is called lot-to-lot (L2L) control. The process models and information necessary to modify the process recipes for L2L control were kept and the computations were performed at the fab level. Recently, manufacturers of semiconductor processing equipment (SPE) have included the ability to measure each wafer immediately before and after the processing is performed. The capability to measure each wafer on the processing tool is called integrated metrology (IM). IM enabled the ability to measure and adjust the process recipe at the wafer-to-wafer (W2W) level and the within wafer (WIW) level.

The structures on the semiconductor wafers have not only decreased in size but also have increased in density causing additional processing control problems. Areas on semiconductor wafers have been identified as being isolated areas or nested areas based on the density of structures within the particular area and problems have developed in the semiconductor processing due to these different densities.

The need for trim etch has become common, and many methods have been developed for trimming the Critical Dimension (CD) for gate length control. Isolated/nested control has become part of the mask design process, including the modeling of the process through the etcher. The isolated/nested model designed into the mask making process however is optimized for a single CD target related to an isolated or nested structure. Mask bias control is by use of the optical and process correction (OPC), sometimes called optical proximity correction, in which the apertures of the reticle are adjusted to add or subtract the necessary light to increase pattern fidelity. Another approach is phase-shift masks (PSM), in which topographic structures are created on the reticle to introduce contrast-enhancing interference fringes in the image.

SUMMARY OF THE INVENTION

The principles of the present invention are directed to a method of monitoring a dual damascene procedure that includes receiving a wafer and/or wafer data, wherein the wafer comprises a plurality of dies and a number of measurement sites, each die having a patterned damascene layer on top of at least one other layer, and at least one measurement site having a periodic structure therein. A pre-processing confidence map is calculated for a damascene process, the pre-processing confidence map including confidence data for a set of dies on the wafers. An expanded pre-processing measurement recipe is established for the damascene process when one or more values in the pre-processing confidence map are not within confidence limits established for the damascene process, wherein the number of measurement sites is increased for the damascene process by establishing a new prioritized pre-processing measurement site for the damascene process. A reduced pre-processing measurement recipe for the damascene process is established when one or more values in the pre-processing confidence map are within confidence limits established for the damascene process, wherein the number of measurement sites is decreased for the damascene process by eliminating at least one de-prioritized pre-processing measurement site for the damascene process.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF SEVERAL EMBODIMENTS

In material processing methodologies, pattern etching comprises the application of a thin layer of light-sensitive material, such as photoresist, to a wafer that is subsequently patterned in order to provide a mask for transferring this pattern to the underlying material during etching. The patterning of the light-sensitive material generally involves exposure by a radiation source of the light-sensitive material using, for example, a micro-lithography system, followed by the removal of the irradiated regions of the light-sensitive material (as in the case of positive photoresist), or non-irradiated regions (as in the case of negative resist) using a developing solvent.

Additionally, single and/or multi-layer masks can be implemented. Soft mask and/or hard mask layers can be used. For example, when etching features using a soft mask top layer, the mask pattern in the soft mask layer is transferred to the hard mask layer using a separate etch step (hard mask open) preceding the other etch steps. The soft mask can be selected from several materials for silicon processing including, but not limited to, ArF resist materials or photoresist materials compatible with smaller feature sizes. The hard mask can, for example, be selected from several materials for silicon processing including, but not limited to, silicon dioxide ($SiO_2$), silicon nitride ($Si_3N_4$), and carbon.

Figure 1:
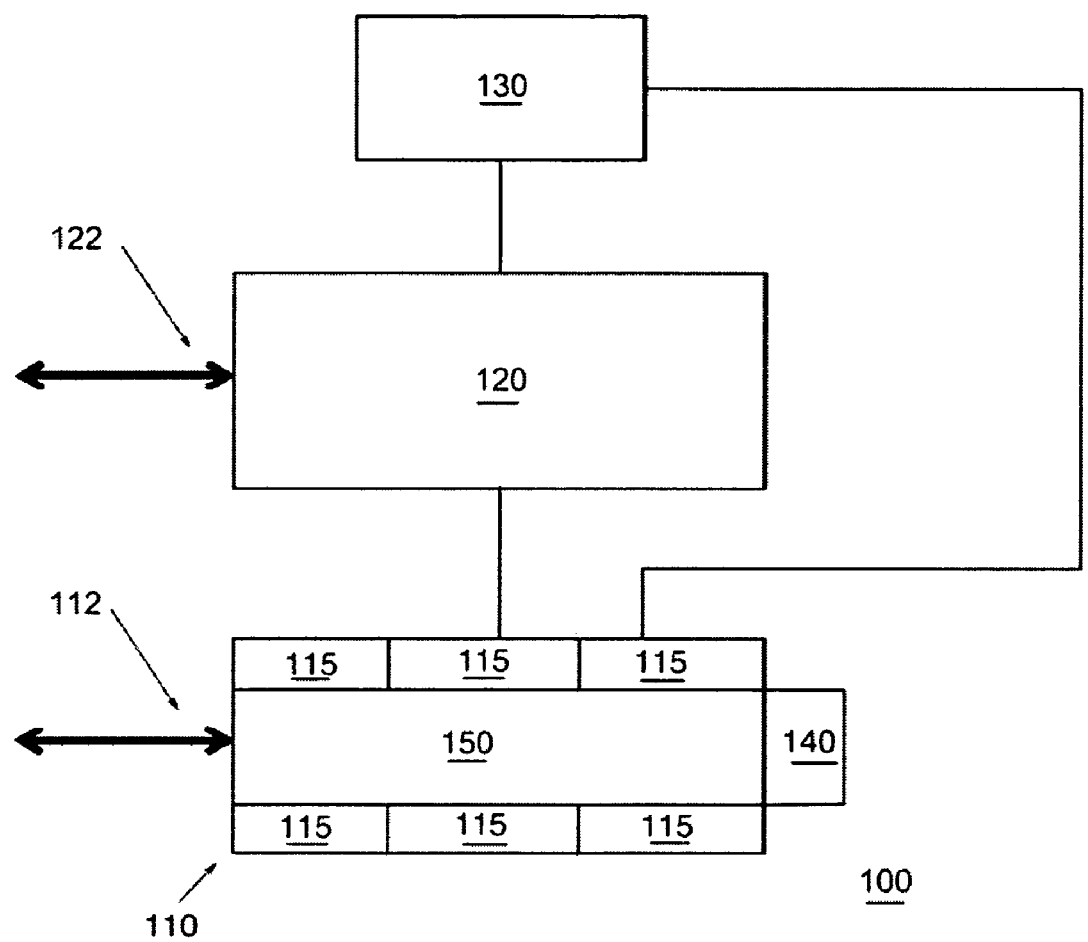
FIG. 1 shows an exemplary block diagram of a processing system in accordance with an embodiment of the present-invention.

FIG. 1 shows an exemplary block diagram of a processing system in accordance with an embodiment of the present invention. In the illustrated embodiment, processing system 100 comprises a processing tool 110, a controller 120 coupled to the processing tool 110, and a manufacturing equipment system (MES) 130 coupled to the processing tool 110 and the controller 120. The processing tool 110 can include a number of processing modules 115 that can be coupled to a transfer system 150

In addition, an integrated metrology module (IMM) 140 can be coupled to the processing tool 110. For example, the IMM 140 can be coupled to the transfer system 150. Alternatively, the IMM 140 may be coupled to the processing tool 110 in a different manner. At least one of the processing tool 110, the controller 120, the MES 130, and the IMM 140 can comprise a control component, a Graphical User Interface (GUI) component and/or a database component (not shown). In alternate embodiments, one or more of these components may not be required.

Some setup and/or configuration information can be obtained by the processing tool 110 and/or the controller 120 from the factory system 130. Factory level business rules can be used to establish a control hierarchy. Business rules can be used to specify the action taken for normal processing and the actions taken on error conditions. For example, the processing tool 110 and/or the controller 120 can operate independently, or can be controlled to some degree by the factory system 130. Also, factory level business rules can be used to determine when a process is paused and/or stopped, and what is done when a process is paused and/or stopped. In addition, factory level business rules can be used to determine when to change a process and how to change the process.

Business rules can be defined at a control strategy level, a control plan level or a control model level. Business rules can be assigned to execute whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in the database. Documentation and help screens can be provided on how to define, assign, and maintain the business rules.

The MES 130 can be configured to monitor some system processes using data reported from the databases associated with the processing tool 110 and/or the controller 120. Factory level business rules can be used to determine which processes are monitored and which data is used. For example, the processing tool 110 and/or the controller 120 can independently collect data, or the data collection process can be controlled to some degree by the factory system 130. Also, factory level business rules can be used to determine how to manage the data when a process is changed, paused and/or stopped.

In addition, the MES 130 can provide run-time configuration information to the processing tool 110 and/or the controller 120. Data can be exchanged using GEM SECS communications protocol. For example, APC settings, targets, limits, rules, and algorithms can be downloaded from the factory to the processing tool 110 and/or the controller 120 as an "APC recipe", an "APC system rule", and "APC recipe parameters". Measurement system recipes and settings can be downloaded from the factory to the processing tool 110 and/or the controller 120 as an "IMM recipe", an "IMM system rule", and "IMM recipe parameters".

In general, rules allow system and/or tool operation to change based on the dynamic state of the processing system 100. Some setup and/or configuration information can be determined by the processing tool 110 and/or the controller 120 when they are initially configured by the processing system 100. In addition, tool level rules can be used to establish a control hierarchy at the tool level. For example, the processing tool 110 and/or the IMM 140 can operate independently, or the IMM 140 can be controlled to some degree by the processing tool 110. Also, tool level rules can be used to determine when a process is paused and/or stopped, and what is done when a process is paused and/or stopped. In addition, tool rules can be used to determine when to change a process, how to change the process, and how to manage the data.

In FIG. 1, one processing tool 110, and one controller 120 are shown, but this is not required for the invention. The semiconductor processing system can comprise any number of processing tools having any number of controllers associated with them in addition to independent process tools and modules.

The processing tool 110 and/or the controller 120 can be used to configure any number of processing tools having any number of processing tools associated with them in addition to any number of independent process tools and modules. Among other functions, the processing tool 110 and/or the controller 120 can collect, provide, process, store, and display data from processes involving processing tools, processing subsystems, process modules, and sensors.

The processing tool 110 and/or the controller 120 can comprise a number of applications including at least one tool-related application, at least one module-related application, at least one sensor-related application, at least one interface-related application, at least one database-related application, at least one GUI-related application, and at least one configuration application, among others.

For example, the system 100 can comprise an APC system from Tokyo Electron Limited that can interface with a Unity® Tool, a Telius® Tool and/or a Trias® Tool and their associated processing subsystems and process modules. In addition, the system can comprise a run-to-run (R2R) controller, such as the Ingenio® TL ES server from Tokyo Electron Limited, and an integrated metrology module (IMM) from Tokyo Electron Limited. Alternately, the controller 120 can support other process tools and other process modules.

A GUI component (not shown) can provide easy to use interfaces that enable users to: view tool status and process module status; create and edit x-y charts of summary and raw (trace) parametric data for selected wafers; view tool alarm logs; configure data collection plans that specify conditions for writing data to the database or to output files; input files to Statistical Process Control (SPC) charting, modeling and spreadsheet programs; examine wafer processing information for specific wafers, and review data that is currently being saved to the database; create and edit SPC charts of process parameters, and set SPC alarms which generate e-mail warnings; run multivariate Principal Component Analysis (PCA) and/or Partial Least Squares (PLS) models; and view diagnostics screens in order to troubleshoot and report problems with the TL controller 120. As should be apparent to those skilled in the art, the GUI component need not provide interfaces for all functions. Instead the GUI may provide interfaces for any subset of these functions or others not listed here.

Controller 120 can include a memory (not shown) that can include one or more databases. Data from the tool can be stored as files in a database. In addition, IM data and host metrology data can be stored in the database. The amount of data depends on the data collection plans that are configured, as well as the frequency with which processes are performed and processing tools are run. The data obtained from the processing tools, the processing chambers, the sensors, and the operating system can be stored in the database.

In an alternate embodiment, the system 100 can comprise a client workstation (not shown). The system 100 can support a plurality of client workstations. A client workstation can allow a user to perform configuration procedures; to view status including tool, controller, process, and factory status; to view current and historical data; to perform modeling and charting functions; and to input data to the controller. For example, a user may be provided with administrative rights that allow him to control one or more processes performed by a system component.

Processing tool 110 and the controller 120 can be coupled to MES 130 and can be part of a Fault Detection and Classification (FDC) System. The processing tool 110 and/or the controller 120 can exchange information with a factory system. In addition, the MES 130 can send command and/or override information to the processing tool 110 and/or the controller 120. For example, the MES 130 can feed-forward to the processing tool 110 and/or the controller 120 downloadable recipes for any number of process modules, tools, and measuring devices, with variable parameters for each recipe. Variable parameters can include final CD targets, limits, offsets, and variables in the tool level system that needs to be adjustable by lot. In addition, metrology data can be feed-forwarded to controller 120 from a factory system or a lithography tool, such as a Lithius® tool from Tokyo Electron Limited.

Furthermore, the MES 130 can be used to provide measurement data, such as Critical Dimension Scanning Electron Microscope (CD SEM) information, to the controller 120. Alternately, the CD SEM information can be provided manually. Adjustment factors are used to adjust for any offset between the IM and CD SEM measurements. The measurement and/or historical data can include wafer identification information and a timestamp, such as a date, for proper insertion in to the database.

A single processing tool 110 is also shown in FIG. 1, but this is not required for the invention. Alternately, additional processing tools can be used. In one embodiment, a processing tool 110 can comprise one or more processing modules. Processing tool 110 can comprise an etch module, a deposition module, a measurement module, a polishing module, a coating module, a developing module, or a thermal treatment module, or any combination of two or more thereof.

Processing tool 110 can comprise link 112 for coupling to at least one other processing tool and/or controller. For example, other processing tools and/or controllers can be associated with a process that has been performed before this process, and/or other controllers can be associated with a process that is performed after this process. Link 112 can be used to feed forward and/or feed back information. For example, feed forward information can comprise data associated with an in-coming wafer. This data can include lot data, batch data, run data, composition data, and wafer history data.

The IMM 140 can include an Optical Digital Profiling (ODP) system. The processing tool 110 can also include module related measurement devices, tool-related measurement devices, and external measurement devices. For example, data can be obtained from sensors coupled to one or more process modules and sensors coupled to the processing tool. Sensors can include an Optical Emission Spectroscopy (OES) sensor or an optical end point detection sensor. For example, the wavelength ranges for these sensors can extend from 200 nm to 900 nm. In addition, data can be obtained from an external device such as a Scanning Electron Microscopy (SEM) tool, a Transmission Electron Microscopy (TEM) tool, and an Optical Digital Profiling (ODP) tool.

An ODP tool is available for Timbre Technologies Inc. (a TEL company) that provides a patented technique for measuring the profile of a structure in a semiconductor device. For example, ODP techniques can be used to obtain critical dimension (CD) information, structure profile information, or via profile information.

Controller 120 is coupled to processing tool 110 and MES 130, and information such as pre-processing data and post-processing data can be exchanged between them. For example, when an internal error event is generated by the tool, the controller 120 can send a message, containing information about the event, to the MES 130. This can allow the factory system and/or factory personnel to make the necessary changes to minimize the number of wafers at risk after a major change occurs such as those that occur during corrective or preventative maintenance.

A single controller 120 is also shown in FIG. 1, but this is not required for the invention. Alternately, additional controllers can be used. For example, the controller 120 can comprise at least one of a run-to-run (R2R) controller, a feedforward (FF) controller, a process model controller, a feedback (FB) controller, and a process controller (all not shown in FIG. 1).

Controller 120 can comprise link 122 for coupling to at least one other controller. For example, other controllers can be associated with a process that has been performed before this process, and/or other controllers can be associated with a process that is performed after this process. Link 122 can be used to feed forward and/or feedback information.

In one case, the controller 120 knows the input state and a model equation for the desired state for the wafer, and the controller determines a set of recipes that can be performed on the wafer to change the wafer from the input state to a processed state. In another case, the controller 120 determines the input state and desired state for the wafer, and the controller 120 determines a set of recipes that can be performed on the wafer to change the wafer from the input state to the desired state. For example, the set of recipes can describe a multi-step process involving a set of process modules.

One time constant for the controller 120 can be based on the time between measurements. When measured data is available after a lot is completed, the controller's time constant can be based on the time between lots. When measured data is available after a wafer is completed, the controller's time constant can be based on the time between wafers. When measurement data is provided real-time during processing, the controller's time constant can be based on processing steps, within a wafer. When measured data is available while a wafer is being processed or after a wafer is completed or after the lot is completed, the controller 120 can have multiple time constants that can be based on the time between process steps, between wafers, and/or between lots.

One or more controllers 120 can be operating at any point in time. For example, one controller can be in an operating mode while a second controller can be in a monitoring mode. In addition, another controller can be operating in a simulation mode. A controller can comprise a single loop or multiple loops, and the loops can have different time constants. For example, loops can be dependent on wafer timing, lot timing, batch timing, chamber timing, tool timing, and/or factory timing.

The controller 120 can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. In addition, models can include SPC charts, PLS models, PCA models, FDC models, and Multivariate Analysis (MVA) models.

The controller 120 can receive and utilize externally provided data for process parameter limits in a process module. For example, the controller GUI component provides a means for the manual input of the process parameter limits. In addition, a factory level controller can provide limits for process parameters for each process module.

The controller 120 can receive and execute models created by commercially available modeling software. For example, the controller can receive and execute models that were created by external applications and sent to the controller.

In one embodiment, controller 120 can be used to run FDC applications and can send and/or receive information concerning an alarm/fault condition. For example, the controller can send and receive FDC information to and from a factory level controller or a tool level controller. In addition, FDC information can be sent via the e-Diagnostics network, e-mail, or pager after,the identification of an error condition. In an alternate embodiment, FDC applications can be run on different controllers.

The controller 120 can take various actions in response to an alarm/fault, depending on the nature of the alarm/fault. The actions taken on the alarm/fault can be based on the business rules established for the context specified by the system recipe, process recipe, module type, module identification number, load port number, cassette number, lot number, control job ID, process job ID, slot number and/or the type of map. In one embodiment, the controller determines the actions to take. Alternately, the controller can be instructed to take some specific actions by the FDC system.

The controller 120 can comprise a database component for archiving input and output data. For example, the controller can archive, among other things, received inputs, sent outputs, and actions taken by the controller in a searchable database. In addition, the controller 120 can comprise hardware and/or software for data backup and restoration. Also, the searchable database can include model information, configuration information, and historical information and the controller 120 can use the database component to backup and restore model information and model configuration information both historical and current. Furthermore, the searchable database can include map information, such as wafer maps and/or process maps, configuration information, and historical information and the controller can use the database component to backup and restore the map information and map configuration information both historical and current.

The controller 120 can comprise a web-based user interface. For example, the controller 120 can comprise a web enabled GUI component for viewing the data in the database. The controller can comprise a security component that can provide for multiple levels of access depending on the permissions granted by a security administrator. The controller 120 also can comprise a set of default models that are provided at installation time and have the ability to reset to default conditions.

The controller has the capability of managing multiple process models that are executed at the same time and are subject to different sets of process recipe constraints. The controller can run in three different modes: simulation mode, test mode, and standard mode. A controller can operate in simulation mode in parallel with the actual process mode. In addition, FDC applications can be run in parallel and produce real-time results.

When the semiconductor processing system includes a host system and one or more processing systems, the host system can operate as the master system and can control and/or monitor a major portion of the processing operations. The host system can create a process sequence, and can send the process sequence to the processing system. In one embodiment, the process sequence can comprise a sequence of measurement module visits and processing module visits. A process job (PJ) can be created for each measurement module visit and each processing module visit.

In addition, virtual measurements and/or maps can be made when a processing system controller executes in a simulation mode. The results from simulation mode executions can be stored and used to predict process drift and/or potential fault conditions.

A single processing tool 110 is also shown in FIG. 1, but an arrangement including only one processing tool 110 is not required for the invention. Alternately, additional processing tools can be used. In one embodiment, the processing tool 110 can comprise means for performing a trimming procedure as described. Alternatively, the processing tool 110 may comprise an etch module, a deposition module, a polishing module, a coating module, a developing module, an ashing module, an oxidation module, or a thermal treatment module, among others, or any combination of two or more thereof.

Figure 2:
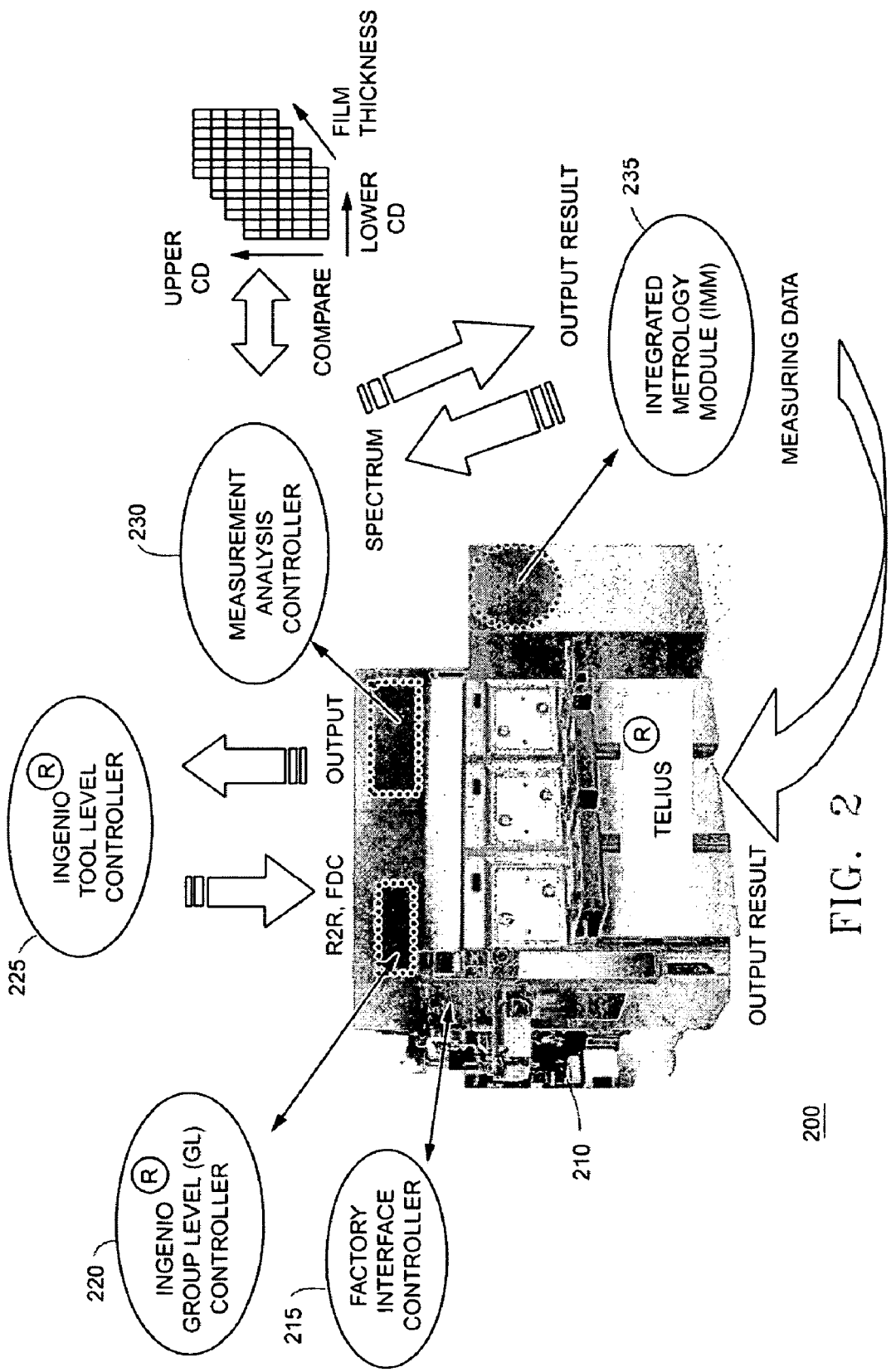
FIG. 2 shows a simplified block diagram of another processing system in accordance with an embodiment of the invention.

FIG. 2 shows a simplified block diagram of an integrated processing system 200 in accordance with an embodiment of the invention. In the illustrated embodiment, integrated processing system 200 can include a processing system 210, a factory interface controller 215, a group level (GL) controller 220, a tool level controller 225, a measurement analysis controller 230, and a measurement module 235. For example, the processing system 210 can be a TELIUS® from Tokyo Electron Limited, the group level controller 220 can be an INGENIO® GL controller from Tokyo Electron Limited, the tool level controller 225 can be an INGENIO® controller from Tokyo Electron Limited, the measurement analysis controller 230 can be a Profiler™ Application Server (PAS) from Timbre Technologies, Inc, and the integrated metrology module (IMM) 235 can be an iODP® system from Timbre Technologies, Inc. Timbre Technologies, Inc is a California corporation and wholly owned subsidiary of TEL.

As would be appreciated by those skilled in the art, the components of the integrated processing system 200 are intended merely to be exemplary of the system of the present invention. As would be appreciated by those skilled in the art, and as will be made apparent from the discussion that follows, the permutations of combinations of components for the present invention is significant. Each such variation, while not discussed herein, is intended to fall within the scope of the present invention.

The system 200, such as shown in FIG. 2, can provide IMM wafer sampling and the wafer slot selection can be determined using a (PJ Create) function. The R2R control configuration can include, among other variables, feed forward control plan variables, feedback control plan variables, metrology calibration parameters, control limits, and SEMI Standard variable parameters. Metrology data reports can include wafer, site, structure, and composition data, among others, and the tool can report actual settings for the wafer The IMM 235 can use polarizing reflectometry, spectroscopic ellipsometry, reflectometry, or other optical instruments to measure true device profiles, accurate critical dimensions (CD), and multiple layer film thickness of a wafer. The process is executed in-line, which eliminates the need to break the wafer for performing the analyses. ODP can be used with the existing thin film metrology tools for in-line profile and CD measurement, and can be integrated with TEL processing tools to provide real-time process monitoring and control. An ODP Profiler can be used both as a high precision metrology tool to provide actual profile, CD, and film thickness results, and a yield enhancement tool to detect in-line process excursion or process faults.

An ODP® solution has three key components: ODP® Profiler™ Library comprises an application specific database of optical spectra and its corresponding semiconductor profiles, CDs, and film thicknesses. Profiler™ Application Server (PAS) comprises a computer server that connects with optical hardware and computer network. It handles the data communication, ODP library operation, measurement process, results generation, results analysis, and results output. The ODP™ Profiler™ Software includes the software installed on PAS to manage measurement recipe, ODP® Profiler™ library, ODP® Profiler™ data, ODP® Profiler™ results search/match, ODP® Profiler™ results calculation/analysis, data communication, and PAS interface to various metrology tools and computer network.

An exemplary optical metrology system is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

ODP techniques can be used to measure the presence and/or thickness of coatings and/or residues within features of a patterned wafer. These techniques are taught in co-pending U.S. patent application Ser. No. 10/357,705, entitled "Model Optimization for Structures with Additional Materials" by Niu, et al., filed on Feb. 3, 2003, and ODP techniques covering the measurement of additional materials are taught in U.S. Pat. No. 6,608,690, entitled "Optical Profilometry of Additional-material Deviations in a Periodic Grating", filed on Dec. 4, 2001, and in U.S. Pat. No. 6,839,145, entitled "Optical Profilometry of Additional-material Deviations in a Periodic Grating", filed on May 5, 2003, and all are incorporated by reference herein.

ODP techniques for creating a metrology model are taught in co-pending U.S. patent application Ser. No.10/206,491, entitled "Model and Parameter Selection in Optical Metrology" by Voung, et al., filed on Jul. 25, 2002 and ODP techniques covering integrated metrology applications are taught in U.S. Pat. No. 6,785,638, entitled METHOD AND SYSTEM OF DYNAMIC LEARNING THROUGH A REGRESSION-BASED LIBRARY GENERATION PROCESS, filed on Aug. 6, 2001, and both are incorporated by reference herein.

A control system, such as the INGENIO® system from Tokyo Electron Limited, can comprise management applications, such as a recipe management application. For example, the recipe management application can be used to view and/or control a recipe stored in the Ingenio system database that is synchronized with equipment via a network environment from the INGENIO® system. An INGENIO® client can be placed separately at a distance from the factory, and can provide comprehensive management functions to multiple equipment units.

Recipes can be organized in a tree structure that can comprise recipe sets, classes, and recipes that can be displayed as objects. Recipes can include process recipe data, system recipe data, and IMM recipe data. Data can be stored and organized using a recipe set. The IMM recipes that are on the processing tool 110 can be used to determine wafer sampling and a relationship between slots and IM recipes. IM recipes can exist on IMM 140, can be selected in Telius IMM recipes, can contain pattern recognition information, can be used to identify the chips to sample on each wafer, and can be used to determine which PAS recipe to use. PAS recipes can be used to determine which ODP library to use, and to define the measurement metrics to report, such as top CD, bottom CD, side wall angle (SWA), layer thicknesses, trench width, and goodness of fit (GOF).

A control system, such as the INGENIO® system, can include APC applications that can operate as control strategies, and a control strategy can be associated with a control plan that can include an etching tool recipe. Wafer level context matching at runtime allows for custom configuration by wafer (slot, waferID, lotID, etc.). A control strategy can include one or more control plans, and a process module and/or measurement module that is being controlled has at least one control plan defined for a visit to the process module and/or measurement module. Control plans can contain maps, models, control limits, targets, and can include static recipes, formula models, and feedback plans.

In the control system, feed forward and/or feedback control can be implemented by configuring Control Strategies, Control Plans, and Control Models. A Control Strategy can be written for each system process where feed forward and/or feedback control is implemented. When a strategy is protected, all of its child objects (plans and models) cannot be edited. When a system recipe executes, one or more of the Control Plans within the Control Strategy can be executed. Each control plan can be used to modify the recipe based on feed-forward and/or feed-back information.

A control strategy can be used to establish a processing recipe and processing tool; to determine control plans; to determine wafer maps, to establish an action in response to a failure; to establish context; to establish a control type (standard, simulated or test); to establish a control action (enabled/disabled); and to establish a control state (protected/unprotected).

Control strategies can comprise standard control strategies and simulation control strategies. The standard control strategies can be configured to control the process tool 110. A simulation control strategy can be associated with simulation control plan(s). Based on the model selected, the control plan will tune the recipe variables. The recipe variables can be logged by the controller but not sent to process tool. Multiple simulation control strategies can be executed simultaneously, but only one standard type of control plan will be executed for a given wafer.

Furthermore, a control strategy can include other fields that may be manipulated. For example, the LotID(s) field can be used to enter/edit the lot identifiers; the CJID(s) field can be used to enter/edit the control job identifiers. The PJID(s) field can be used to enter/edit the process job identifiers. The Cassette ID(s) field can be used to enter/edit the cassette identifiers. The Carrier ID(s) field can be used to enter/edit the carrier identifiers. The Slot(s) field can be used to enter/edit the slot numbers. The Wafer Type(s) field can be used to enter/edit the wafer types. The Scribed Wafer ID(s) field can be used to enter/edit the scribed wafer identifiers. The Wafer ID(s) field can be used to enter/edit the wafer identifiers. The Start Time earlier than field can be used to enter/edit the start time. In addition, the Start Time later than field can be used to enter/edit the end time.

Control plans can cover multiple process steps within a module, and can be controlled by the factory. Parameter ranges can be defined for each process and/or measurement module, and variable parameter "Limit Ranges" are provided for each control parameter.

The control system can include APC applications that can be used to analyze the collected data, and establish error conditions. An analysis application can be executed when a context is matched. During the execution of an analysis application, one or more analysis plans can be executed. For example, univariate SPC models/plans may be executed, and may trigger SPC alarms; PCA and/or PLS models/plans may be executed, and may trigger SPC alarms; multivariate SPC models/plans may be executed, and may trigger SPC alarms; and other file output plans may be executed, and may trigger software alarms.

A plan can create an error when a data failure occurs, an execution problem occurs, or a control problem occurs. When an error occurs, the plan can generate an alarm message; the parent strategy status can be changed to a failed status; the plan status can be changed to a failed status; and one or more messages can be sent to the alarm log and the FDC system. When a feed forward plan or a feedback plan fails, one or more of the plans in the parent strategy may be terminated, and their status can be changed to a failed status. In one case, when a bad incoming wafer is detected, a control plan can detect and/or identify this as a faulty incoming wafer. In addition, when a feedback plan is enabled, the feedback plan can skip a wafer that has been identified to be defective and/or faulty by another plan. A data collection plan can reject the data at all the measurement sites for this wafer or reject the data because a map created using the data fails to meet uniformity limits.

In one embodiment, feedback plan failure may not terminate the strategy or other plans, and a map generation failure may also not terminate the strategy or other plans. Successful plans, strategies and/or map generations do not create any error/alarm messages.

A control system, such as the INGENIO® system, can include an FDC system that includes applications for managing error/alarm/fault conditions. When an error, alarm, and/or fault condition is detected, an FDC application in the FDC system can send a message to one or more processing modules and/or tools. For example, a message can be sent to pause the current process or to stop the current process. In one case, a tool pause/stop can be done by changing the value of the maintenance counter.

Pre-specified failure actions for strategy and/or plan errors can be stored in a database, and can be retrieved from the database when an error occurs. Failure actions can include using the nominal process recipe for this wafer and module; using a null process recipe for this wafer and module; pausing the process module and waiting for intervention; or pausing the whole tool and wait for intervention. For example, a processing tool may take action only when the wafer with the error reaches the target process module where the R2R failure occurred, and the processing tool may be able to continue processing other lots, recipes, or wafers in other modules. A null recipe can be a control recipe that is used by a processing tool and/or processing system to allow a wafer to pass through a processing chamber without processing. For example, a null recipe can be used when a processing tool is paused or when a wafer does not require processing.

The FDC system can detect faults, predict tool performance, predict preventative maintenance schedules, decrease maintenance downtime, and extend the service life of consumable parts in the processing tool. The FDC system collects data from the tool and additional sensors, calculates summary parameters, performs MVAs, and compares the results with normal operation using SPC. For example, the SPC component can perform a series of Western Electric run-rule evaluations, and generates an SPC alarm if a run-rule is violated.

The operations of the APC system and the FDC system can be configured by the customer and can be based on the context of the wafers being processed. Context information includes recipe, lot, slot, control job, and process job. The user interfaces for APC system and the FDC system are web-enabled, and provide a near real time tool status and a real time alarm status display.

Figure 3:
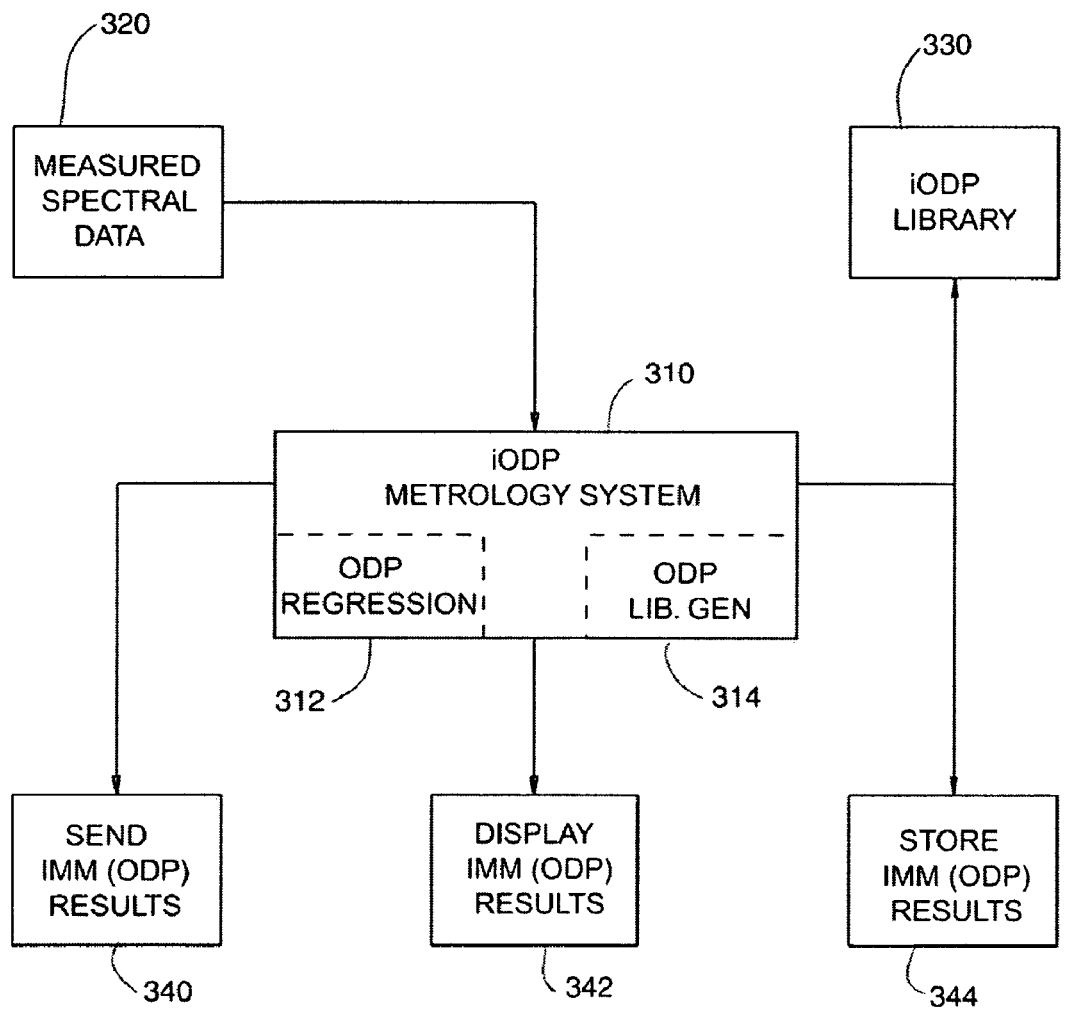
FIG. 3 shows an exemplary view of an optical metrology system in accordance with an embodiment of the invention.

FIG. 3 shows an exemplary view of an optical metrology system in accordance with an embodiment of the invention. In the illustrated embodiment, an optical metrology system 300 is shown that can be configured to examine periodic structures, such as gratings and/or patterned arrays, to obtain measured spectral data 320. For example, zero-order cross polarization measurement data may be obtained, and wafer measurement data may be obtained based on the zero-order cross polarization measurement data.

Device features and/or structures can be obtained using periodic measurement structures formed on a wafer. For example, as the features and/or structures of the devices/circuits are formed on the wafer through one or more fabrication processes described herein, the features of periodic measurement structures are also formed on the wafer.

In addition, one or more periodic measurement structures can be formed in test areas on the wafer that are proximate to or within devices/circuits formed on the wafer. For example, periodic measurement structures can be formed adjacent a device/circuit formed on the wafer. Alternatively, periodic measurement structures can be formed in an area of the device/circuit that does not interfere with the operation of the device/circuit or along scribe lines on the wafer. Thus, the optical measurements obtained for periodic measurement structures can be used to determine whether the devices/circuits adjacent periodic measurement structures have been fabricated according to specifications.

In addition, optical metrology system 300 can include a metrology system 310, such as an iODP® system. The metrology system 310 can include a real-time component 312 that can be used to perform pattern analysis using ODP regression techniques, and off-line component 314 that can be used for the generation of iODP libraries 330. For example, regression optimization procedures can be performed on a set of measurements to obtain a set of resultant parameter values that can be associated with a profile of a structure and/or feature. In addition, the metrology system 310 can include an interface component 340 for sending IMM (ODP) results to other system components, a display component 342 for displaying IMM (ODP) results to one or more GUI screens, and a storage component 344 for storing IMM (ODP) results.

Examples of optical metrology devices include spectroscopic ellipsometers, spectroscopic reflectometers, variable angle, single wavelength reflectometers and ellipsometers, and polarization reflectometers and ellipsometers. When optical metrology system 300 includes an ellipsometer, the amplitude ratio tan $\Psi$ and the phase $\Delta$ of a diffraction signal can be received and detected. When optical metrology system 300 includes a reflectometer, the relative intensity of a diffraction signal can be received and detected. Additionally, when optical metrology system 300 includes a polarization reflectometer, the phase information of a diffraction signal can be received and detected.

Optical metrology system 300 can receive a measured diffraction signal and analyze the measured diffraction signal, and the periodic measurement structures can be determined using various linear or non-linear profile extraction techniques, such as a library-based process, a regression-based process, and the like. For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety. For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety. For a more detailed description of a machine learning system, see U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

In addition, optical measurement systems and techniques are taught in U.S. Pat. No. 6,947,141, entitled OVERLAY MEASUREMENTS USING ZERO-ORDER CROSS POLARIZARIZATION MEASUREMENTS, filed on Sep. 8, 2004, U.S. Pat. No. 6,928,395, entitled METHOD AND SYSTEM FOR DYNAMIC LEARNING THROUGH A REGRESSION-BASED LIBRARY GENERATION PROCESS, filed on May 27, 2004, and U.S. Pat. No. 6,839,145, entitled OPTICAL PROFILOMETRY OF ADDITIONAL-MATERIAL DEVIATIONS IN A PERIODIC GRATING, filed on May 5, 2003 and all of which are assigned to Timbre Technologies, Inc a TEL company and all are incorporated by reference herein.

The controller 120 can use equation-based techniques, formula-based techniques, and table-based techniques in different processing regimes. When the controller 120 uses these techniques, the feed-forward and/or feedback control variables can be configurable.

The controller 120 can operate as a single input single output (SISO) device, as a single input multiple output (SIMO) device, as a multiple input single output (MISO) device, and/or as a multiple input multiple output (MIMO) device, among other variants. In addition, inputs and outputs can be within one controller 120 and/or between one or more controllers 120. In a multi-process case including multiple modules, map information can be fed-forward or fed-back from one controller to another controller.

When a processing tool and/or process module sends data to the database, this data can be accessed by the controller 120. For example, this data can comprise tool trace data, maintenance data, and End Point Detection (EPD) data. The tool-related data can be used to create and/or update process maps and/or process results maps, and the tool-related data and associated maps can be updated and stored during processing or after the processing of a wafer is completed.

The controller 120 can receive and utilize externally provided data for process parameter limits in a process module. For example, the controller GUI component provides a means for the manual input of the process parameter limits. In addition, a factory level controller can provide limits for process parameters for each process module.

The controller 120 can receive and execute models created by commercially available modeling software. For example, the controller 120 can receive and execute models (PLA, PCA, etc.) that were created by external applications and sent to the controller 120.

Map and/or model updates can be performed by running monitor wafers, varying the process settings and observing the results, then updating the map and/or model. For example an update can take place every N processing hours by measuring the before and after characteristics of a monitor wafer. By changing the settings over time to check different operating regions one could validate the complete operating space over time, or run several monitor wafers at once with different recipe settings. The update procedure can take place within the controller 120 at the tool or at the factory, allowing the factory control to manage the monitor wafers and model updates.

The controller 120 can compute an updated recipe and/or updated map for the next wafer. In one case, the controller 120 can use the feed-forward information, modeling information, and the feedback information to determine whether or not to change the current recipe before running the current wafer, before running the next wafer, or before running the next lot.

When a metrology data source is being used to provide process result data, a route sequence can be specified which causes a wafer to be routed to the IMM 140 at the correct point in the process. For example, a wafer can be routed to the IMM 140 before entering a processing module 115 and/or after the wafer has been processed in a processing module 115. In addition, an IM recipe can be specified which causes a set of predetermined measurements to be made and a predetermined set of output data to be provided. For example, the data can be filtered before the data is averaged and used by the controller 120.

The controller 120 can comprise one or more filters (not shown) to filter the metrology data in order to remove the random noise. A noise filter can be used to remove random noise and stabilize the control loop, an Exponentially Weighed Moving Average (EWMA) or Kalman filter can be applied. In addition, an outlier filter can be used to remove outliers that are statically not valid and should not be considered in the calculation of the mean of a wafer measurement. Furthermore, the control can include the ability to filter sites based on an alarm from the measurement analysis calculations and/or mapping applications. For example, measurement sites can be filtered based on an alarm from the metrology system, and this may occur when the site measurement calculations have an error, or when a site is outside the library space, or when a site is at the edge of the library space.

The controller 120 can receive and utilize feedback data. For example, the controller 120 can receive map information for wafers that have already been processed and adjust the process model based on this data.

The controller 120 can send and receive notification of an error condition. For example, the controller 120 can send and receive notifications to and from a factory level controller, a R2R controller, and/or a tool level controller, among other devices. In addition, a notification can be sent via the e-Diagnostics network, e-mail, or pager after the identification of an error condition.

The controller 120 can calculate and/or run process maps and/or models in a simulated mode. For example, the controller 120 can operate in simulation mode in parallel with the actual process mode. In this case, the simulated actions can be recorded in the historical database, and immediate action is not taken.

The controller 120 can select process maps and/or models based on incoming material context. For example, the controller 120 can select process maps and/or models based on the incoming material state and process recipe. The controller can comprise means to verify that the system 100 can calculate a valid R2R setting.

The controller 120 inputs can include time constants for feed-forward/feed-back loops, a reset event for accumulation, an IMM step, and ODP offset, among others. Instructions can include, inter alia, targets, tolerances, computational commands, data collection plans, algorithms, models, coefficients, and recipes. The Wafer State can include information, for example, from the wafer being processed (site, wafer, lot, batch state), profiles, and characteristics measured physically or electrically. The Module Physical State can include the current or last known recorded state of the module and components that will be used to process the wafer—RF hours, number of wafers, consumable states. The Process State can include the current or last known measured state from sensors of the processing environment, including trace data, and summary statistics. The Controller Parameters can include the last settings for the recipe/controller set points and process targets that created the wafer state, module physical state, and process state.

The controller 120 can comprise at least one computer and software that supports operational software, such as the Ingenio® software. In one case, the operational software can include a configuration module, a data management module, a GUI module, a fault management module, or a troubleshooting module, or any combination of two or more thereof. Also, configuration GUI screens can be used to configure the interface between the computer and the processing element, to determine the device type for the processing element (i.e., tool, module, sensor, etc.). Data management GUI screens can be used to determine the amount and type of data to collect and to determine how to and where to store the collected data. Furthermore, fault management GUI screens can be used to inform a user about fault conditions.

In general, feed-forward control is the updating of a process module recipe using pre-process data measured on the wafer prior to its arrival in the process module. In one case, metrology data and process target data are received by the controller 120. These values can be compared, and the result is the desired process result (for example, the desired trim amount). Then, this desired process result can be sent to the controller for model selection and calculation of the appropriate process recipe parameters. This new recipe is sent to the process module and the wafer is processed (trimmed) using the new recipe.

In the system 100, feed-forward control can be implemented, in the controller 120, by configuring Control Strategies, Control Plans, and Control Models. A Control Strategy can be written for each system recipe where feed-forward control is implemented. When this system recipe executes in the processing tool 110, the Control Plans within the Control Strategy can be executed. Each control plan can be used to modify the recipe based on feed-forward information.

A control plan can include input data sources. A different number of input data sources can be used, and each input data source can have a different symbol value. For example, one data source can be an ODP tool, and it can be part of the processing tool, such as a Telius®. In addition, another data source can be a SEM, and the Parameter/Value can be actual measured data such as a CD-SEM data.

Using inputs from these data sources, a user can specify a calculation for the target calculation. The result of this calculation is then used to choose which control model to execute. The system starts with the Nominal Recipe (the recipe as it exists on the tool). Then, the updates from each executed Control Plan are added. Once all the Control Plans are executed (within the matching Control Strategy), the final recipe is sent to the tool.

The controller 120 can operate as a recipe parameter solver that produces recipe parameters according to appropriate process model, process model constraints, process targets, and process parameter constraints. The controller 120 has the capability of managing multiple process models that are executed at the same time and are subject to a single set of process recipe constraints. If control failure occurs, the controller 120 can be configured to use the tool process recipe (nominal recipe), use the null recipe, or to stop Run-to-Run control (according to tool parameter settings). To pause the tool 110, the controller 120 can be configured to pause the process module, or to pause the entire system 100.

Figure 4:
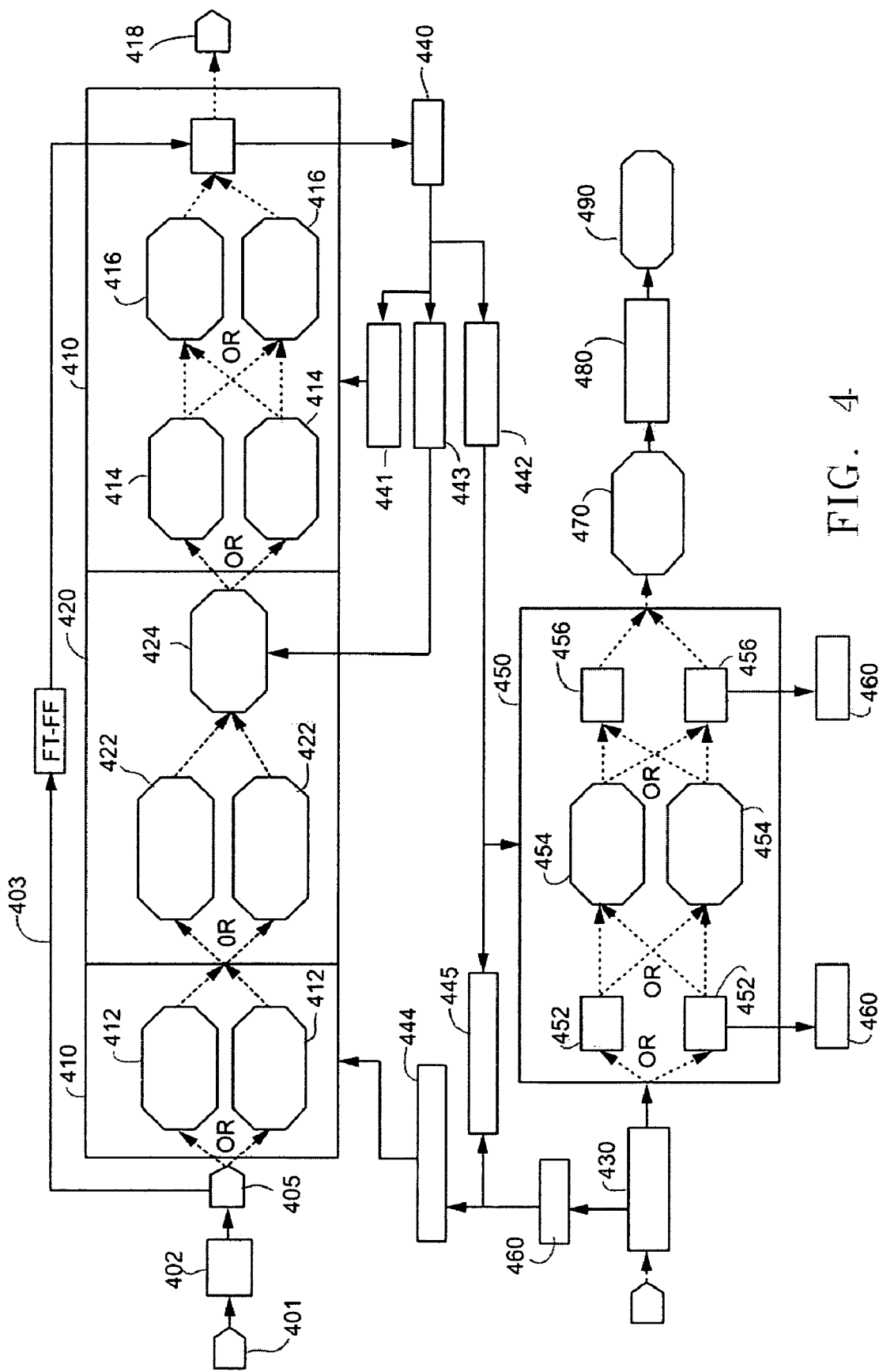
FIG. 4 illustrates a simplified schematic view of a wafer processing diagram in accordance with embodiments of the invention.

FIG. 4 illustrates a simplified schematic view of a wafer-processing diagram in accordance with embodiments, of the invention. In the illustrated embodiment, an input element 401 is shown that can be a FOUP containing a number of wafers. A wafer state element 402 is shown, and wafer state information can be fed forward 403 to a measurement element 418. A decision element 405 is shown coupled to two processing elements 412 in a lithography element 410. For example, the lithography element can be a Lithius® System from Tokyo Electron Limited, and the processing elements (412A and 412B) may be coating units.

A scanner element 420 can be coupled to lithography element 410. The scanner element may include two alignment elements 422 coupled to an exposure unit 424. The lithography element 410 can also include two baking units 414 that can be coupled to two developing units 416. The developing units 416 can be coupled to a metrology module 418, when the lithography system includes a metrology unit 418. The metrology unit 418 can be coupled to a controller 440 and exchange information with the controller 440. The controller can use metrology data from the metrology unit 418 during one or more dual damascene procedures. In the illustrated embodiment, a number of decision ("OR") elements are shown to indicate different paths a wafer may take during processing. Alternatively, a different number of processing elements may be used. The controller 440 can feed back data 441 to the lithography unit 410, can feedback data 443 to the scanner unit 420, and/or feed forward data 442 to an etch system 450.

In FIG. 4, the lithography system 410 is shown coupled to a second wafer state element 430, and some of the wafer state information can be provided to a controller 460 that can fed forward 445 information to the etching system 450, and/or feed back 444 information to the lithography system 410. This wafer state information may include additional measurement data. For example, during wafer processing some wafers may be sent to an external metrology unit, which may be an external optical metrology tool, or a CD SEM tool.

The second wafer state element 430 can be coupled to the etch system 450. The etch system 450 can include a number of pre-processing metrology elements 452, a number of etch processing elements 454, and a number of post-processing metrology elements 456. The metrology elements 452 and 456 can be coupled to a controller 460 and exchange information with the controller 460. The controller 460 can use metrology data from the metrology elements 452 and 456 during one or more dual damascene procedures. In the illustrated embodiment, a number of decision ("OR") elements are shown to indicate different paths a wafer may take during processing. Alternatively, a different number of metrology elements and/or processing elements may be used. The controller 460 can feed back data 441 to the lithography unit 410, can feedback data 443 to the scanner unit 420, and/or feed forward data 442 to an etch system 450.

The etch system 450 can be coupled to a cleaning system 470. The cleaning system 470 can include wet and/or dry processes. The cleaning system 470 can be coupled to a measurement element 480. The measurement element can include an ODP system, a CD SEM system, a TEM system, and/or a Focused Ion Beam (FIB) system (all not shown).

A repeat element 490 is also shown. The illustrated process may be performed a number of times when a number of wafers require processing. In addition, a different set of steps may be used. For example, fewer measurement steps may be used.

The processing system 100 can be used to process wafers having isolated and nested damascene features and control strategies can be used to define the process sequence. During an isolated/nested measurement sequence, the processing tool selects one IM recipe to use, and separate IMM recipes can be used for isolated and nested structures. Each wafer can be measured separately for each pitch and structure.

For example, a wafer can be loaded into an integrated metrology (IM) module; an IM recipe can be loaded into the IM module; and a Profiler Application Server (PAS) recipe can be loaded into the IM controller. Next, the wafer can be measured and an ODP recipe can be loaded into the IM controller. The library can then be searched using the measured spectrum, and one or more isolated structures can be identified. When isolated structures are being measured, IM, PAS, and ODP recipes for isolated structures can be used.

Subsequently, another IM recipe can be loaded into an integrated metrology (IM) module, and another PAS recipe can be loaded into the IM controller. The wafer can be measured or previous measurement data can be used, and another ODP recipe can be loaded into the IM controller. Next, the library can be searched using the measured spectrum, and one or more nested structures can be identified. When Nested structures are being measured, IM, PAS, and ODP recipes for nested structures can be used. The measurement sequence can be performed for one or more different locations on a wafer, and the wafer can be unloaded.

In one embodiment, a measurement grating having a first pitch is provided that is consistent with the isolated structures/features for a particular product and technology and another measurement grating having a second pitch is provided that is consistent with the nested structures/features for this product and technology. For example, a 595 nm grating can be used for isolated structures and a 245 nm grating can be used for nested structures. In alternate embodiments, additional measurement gratings may be provided and different pitches may be provided.

Figure 5A:
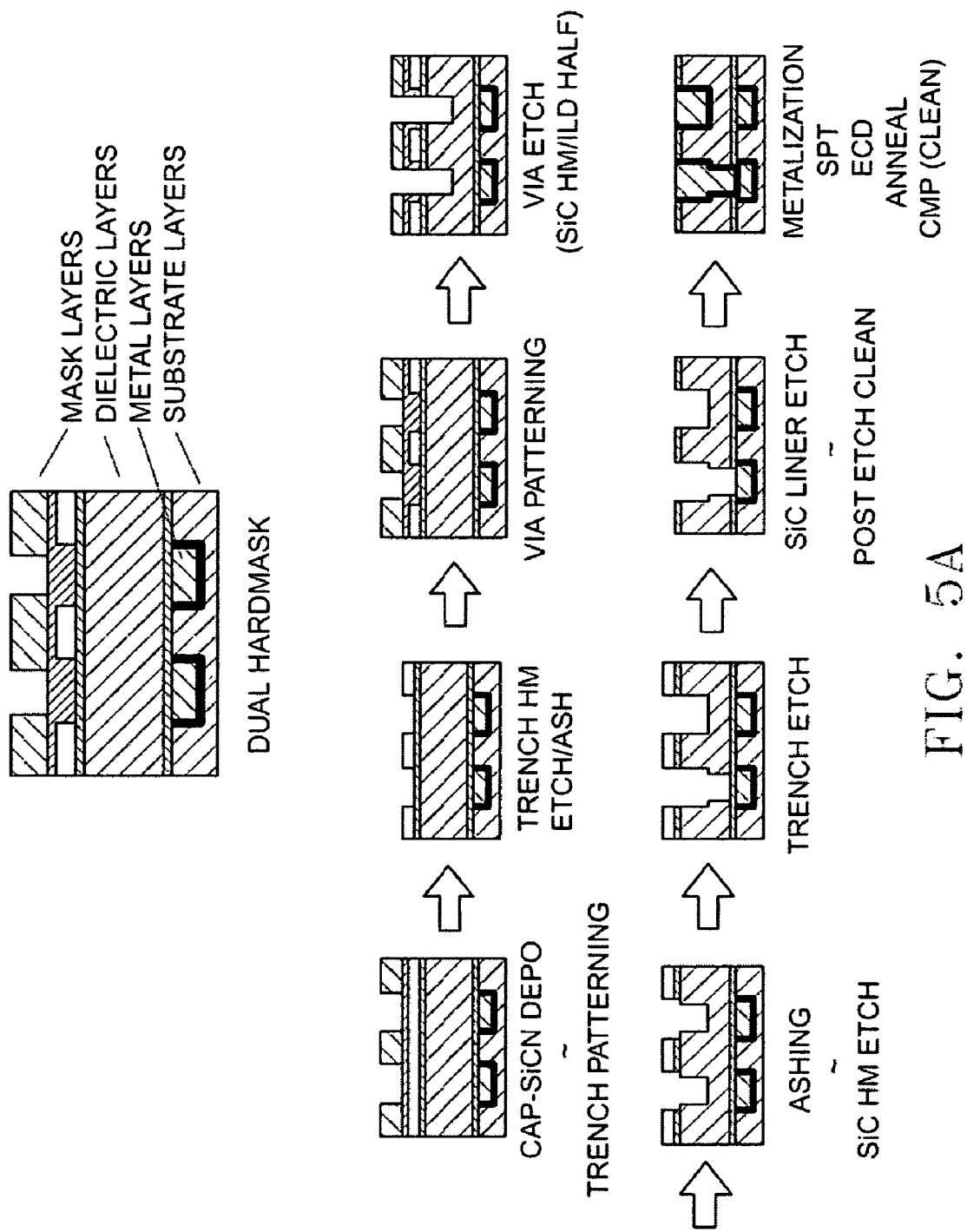
FIGS. 5A-5G illustrate simplified flow diagrams for dual damascene procedures in accordance with embodiments of the invention.
Figure 5B:
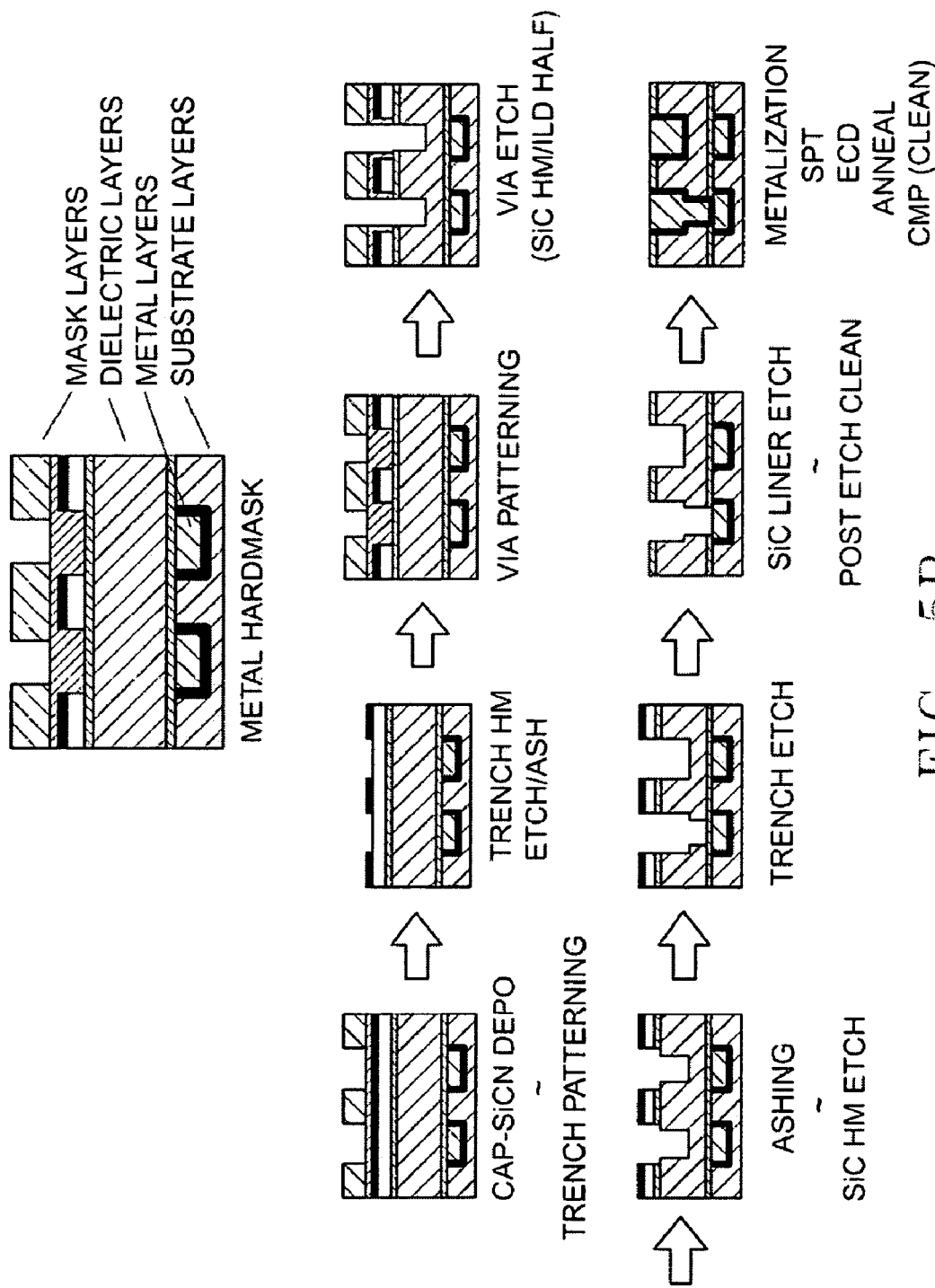
Figure 5C:
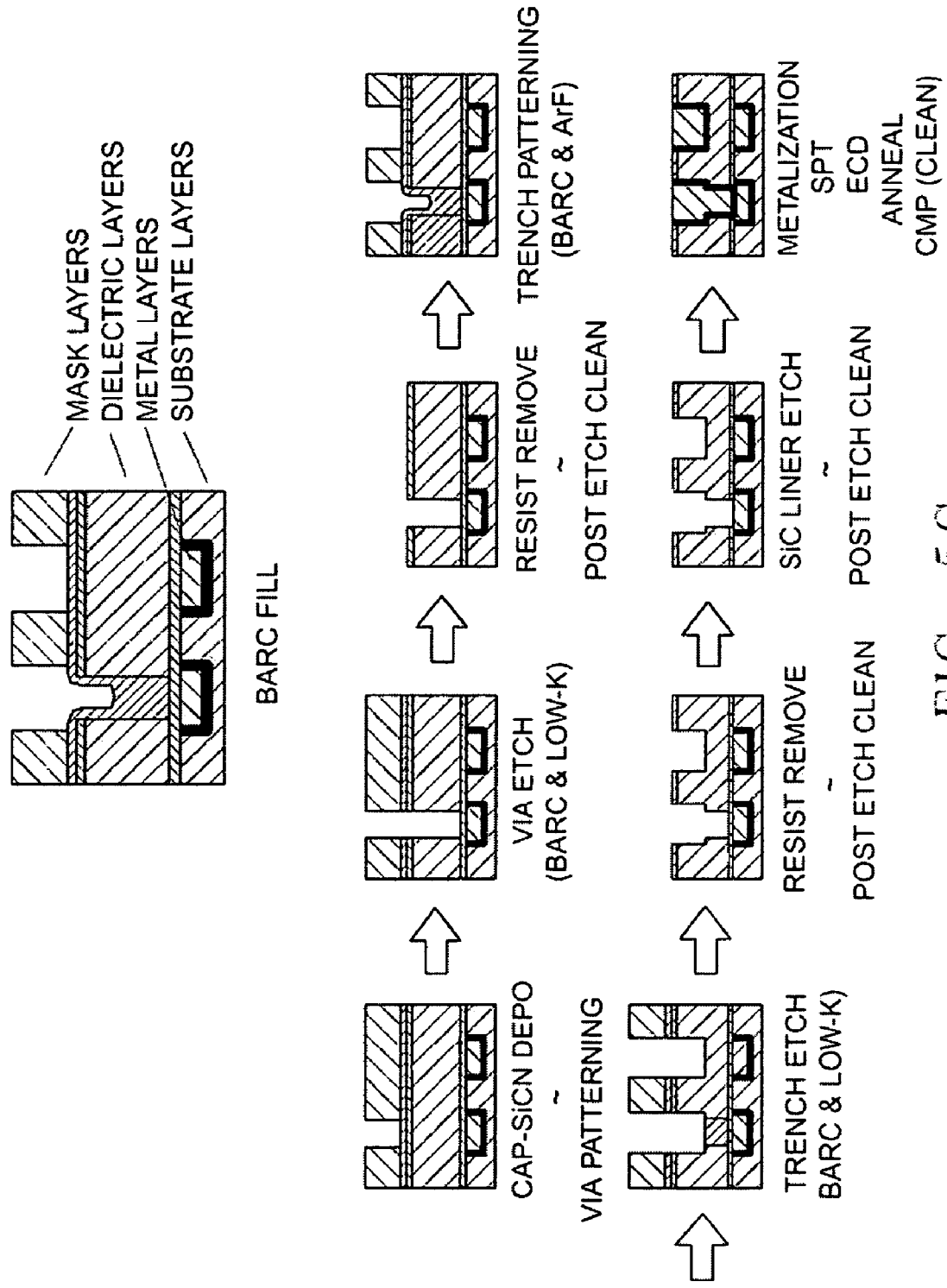
Figure 5D:
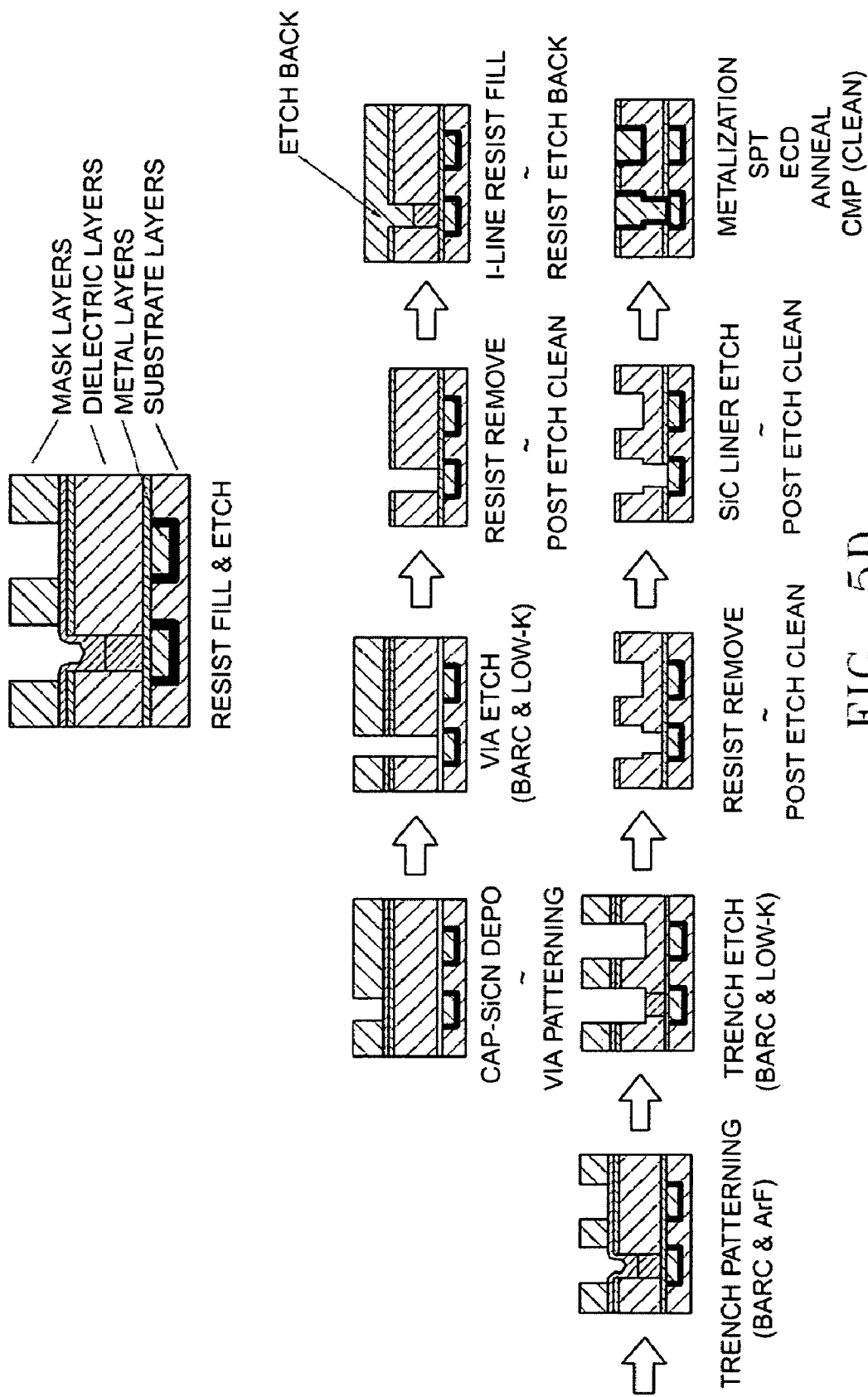
Figure 5E:
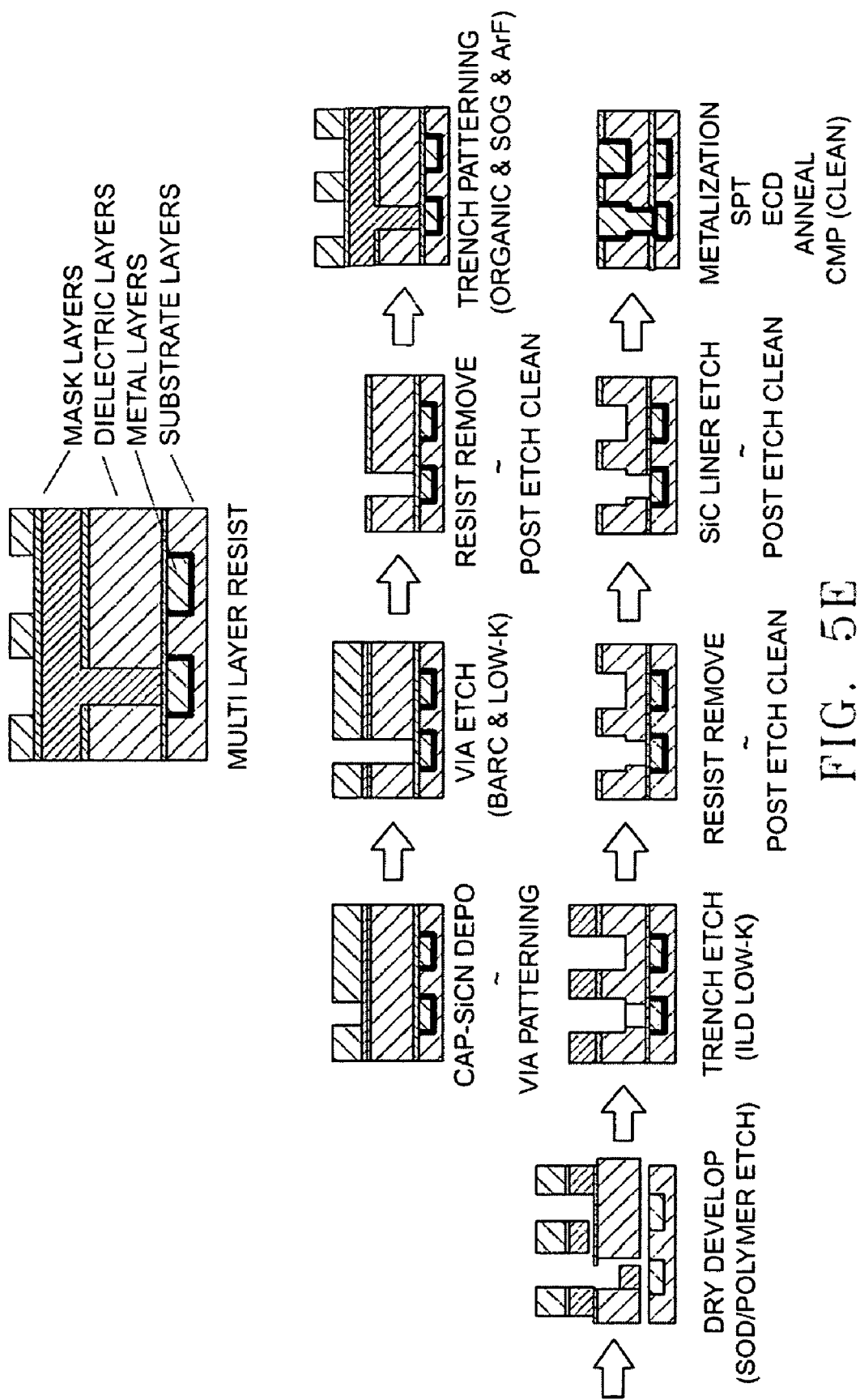
Figure 5F:
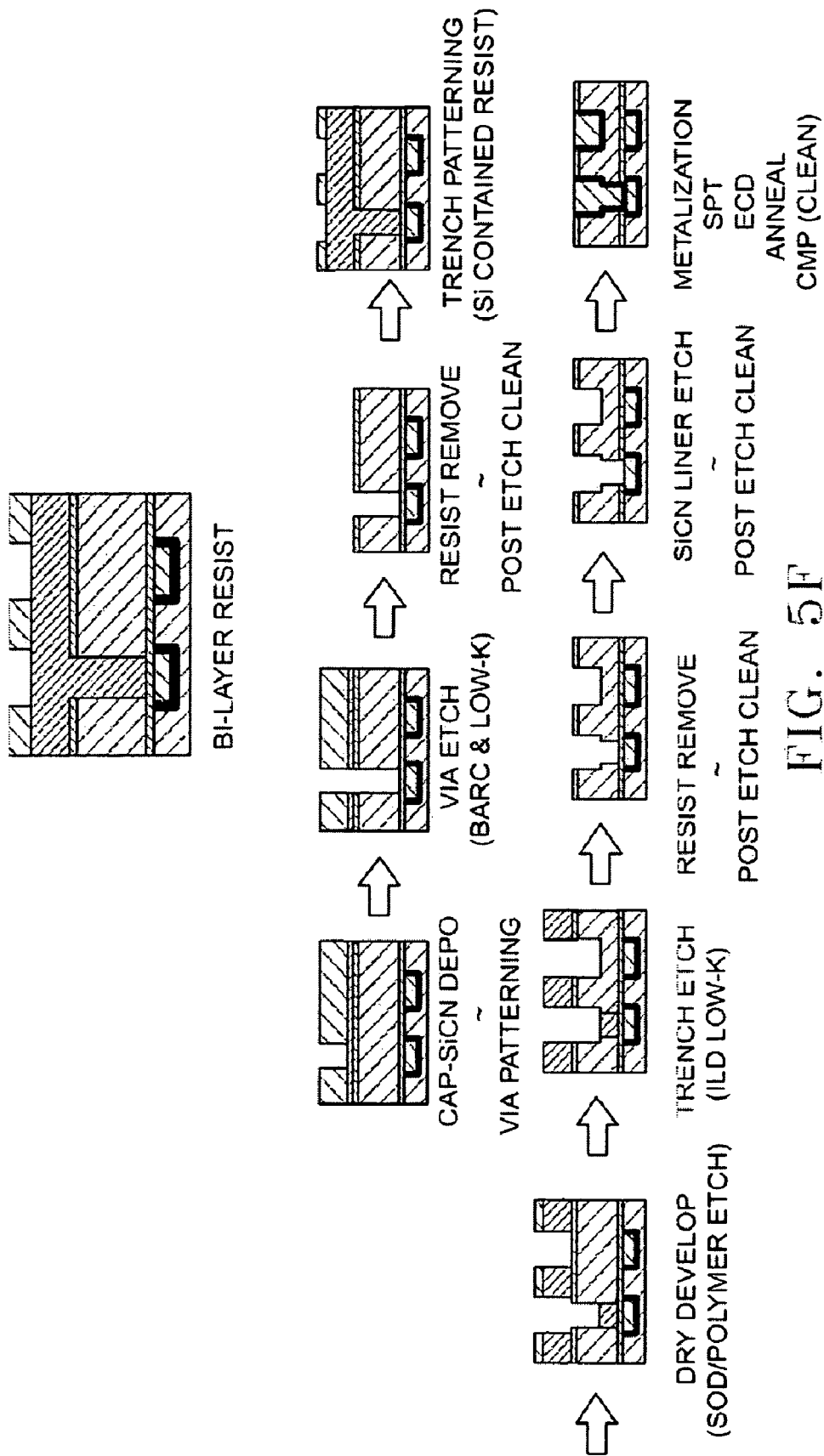
Figure 5G:
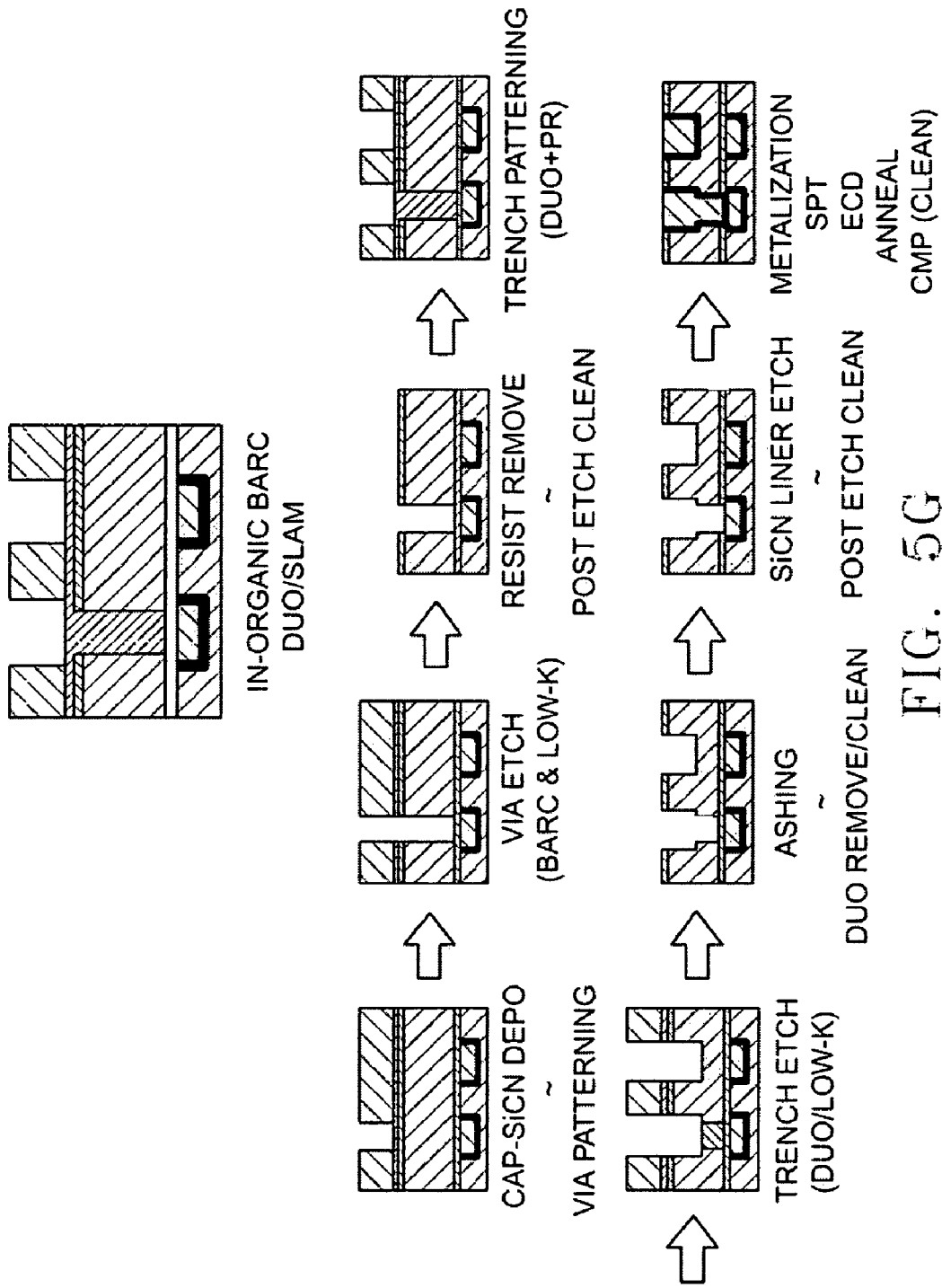

FIGS. 5A-5G illustrate simplified flow diagrams for dual damascene procedures in accordance with embodiments of the invention. An exemplary dual hardmask procedure is shown in FIG. 5A. An exemplary metal hardmask procedure is shown in FIG. 5B. An exemplary Bottom Anti-Reflective Coating (BARC) fill procedure is shown in FIG. 5C. An exemplary resist fill and etch procedure is shown in FIG. 5D. An exemplary multi-layer resist procedure is shown in FIG. 5E. An exemplary bi-layer resist procedure is shown in FIG. 5F. An exemplary Inorganic BARC (DUO/SLAM) procedure is shown in FIG. 5G.

In alternate embodiments, a Tunable Etch Resistance ARC (TERA) material may be used as a BARC material and/or an ARC material and/or a hard mask material, and the gate material may include GaAs, SiGe, and strained silicon.

An exemplary dual damascene procedure for a first metal M1 layer is shown in Table 1.

TABLE 1

| FULL VIA 1ST PROCESS (no Middle Etch Stop Layer) | DESCRIPTION/COMMENTS |
|---|---|
| M1 | |
| M1 Low-k Dep | CVD (or SOD) SiCO(H) |
| M1 Low-k Cure ("Surface Treatment") | Use Furnace, EB, SPA, etc. |
| M1 Hardmask Dep | Single or Multiple Layers (Dielectric only or Dielectric + Metal) |
| Backside Clean | optional |
| M1 Lithography | Resist Coat/Expose/Develop |
| Post-exposure Bake | |
| CD Measure | M1 Post-Exposure CD Meas. |
| M1 Low-k Etch/Ash | |
| Ash | (Remove if Insitu Etch/Ash) |
| Post-etch Clean | (optional) Wet Clean/Dry |
| Backside Clean | optional |
| CD measure | M1 Post-Etch CD Meas. |
| Defect measure | optional |
| Optical defect review | optional |
| Cu Barrier/Seed Dep. | typically Ta/TaN barrier + Cu Seed |
| Cu Electroplate | |
| Backside Clean | Cu Residue Removal |
| M1 Cu Anneal | (or moved to post-CMP) |
| CMP | Cu/partial HM Polish |
| Defect measure | optional |
| Optical defect review | optional |
| Barrier Dep | CVD dielectric or selective electroless metal |

During dual damascene procedures data collection (DC) plans and mapping applications associated with the control strategies can be executed. Data collection plans and/or mapping applications can run before, during, and/or after control plans are executed. Data collection plans can obtain data from processing elements such as a tool, a module, a chamber, and a sensor; measuring elements such as a OES system, ODP system, a SEM system, a TEM system, and a MES system.

In addition, the data collection plan selection and initiation can also be context-based. DC plans can be used to provide data for mapping application that are associated with a control strategy. The DC plan determines which data is collected, how the data is collected, and where the data is stored. The controller can auto-generate data collection plans and/or maps for physical modules. Typically, one data collection plan can be active at a time for a specific module, and the controller can select and use a data collection plan that matches the wafer context. Data can include trace data, process log information, recipe data, maintenance counter data, ODP data, OES data, VIP data, or analog data, or a combination of two or more thereof. Measurement devices and/or sensors can be started and stopped by a DC plan. A DC plan can also provide information for trimming data, clipping data, and dealing with spike data and outliers.

In addition, before, during, and/or after data collection, data can be analyzed, and alarm/fault conditions can be identified. The analysis plans associated with an analysis strategy can also be executed. In addition, judgment and/or intervention plans can be executed. For example, after the data has been collected, the data can be sent to a judgment and/or intervention plan for run-rule evaluation. Fault limits can be calculated automatically based on historical data or entered manually based on the customer's experience or process knowledge, or obtained from a host computer. The data can be compared with the warning and control limits, and when a run-rule is violated, an alarm can be generated, indicating the process has exceeded statistical limits.

Furthermore, when an analysis strategy is executed, wafer data maps, process data maps, and/or module data maps can be analyzed, and alarm/fault conditions can be identified. In addition, when judgment and/or intervention plans are associated with mapping applications, they can be executed. For example, after a map has been created, the map can be analyzed using run-rule evaluation techniques. Fault limits can be calculated automatically based on historical maps or entered manually based on the customer's experience or process knowledge, or obtained from a host computer. The maps can be compared with the warning and control limits, and when a run-rule is violated, an alarm can be generated, indicating the process has exceeded statistical limits.

When an alarm is generated, the controller can perform either notification or intervention. Notification can be via e-mail or by an e-mail activated pager. In addition, the controller can perform an intervention: either pausing the process at the end of the current lot, or pausing the process at the end of the current wafer. The controller can identify the processing module that caused the alarm to be generated.

A strategy can include a data failure field that can be used to enter/edit the data failure action. For example, a data failure may occur when a mapping application fails or a map could not be completed. When a data failure occurs the system response can be selected from among the following options: (a) Use Tool Process Recipe (Nominal Recipe)—the software sends the indication to the process tool and the process tool uses the tool process recipe; (b) Do Not Use Process Recipe (Null Recipe)—the software sends the null recipe information associated with the wafer to the process tool and the wafer goes in and out of the chamber without being processed; (c) PM Pause—pauses the process module or (d) System Pause—pauses the system including transfer system. Other options should be apparent to those skilled in the art. Results from analysis plans, judgment plans, and intervention plans can feed forward and/or feedback data to other plans, and the other plans can use this data to calculate their outputs.

Figure 6:
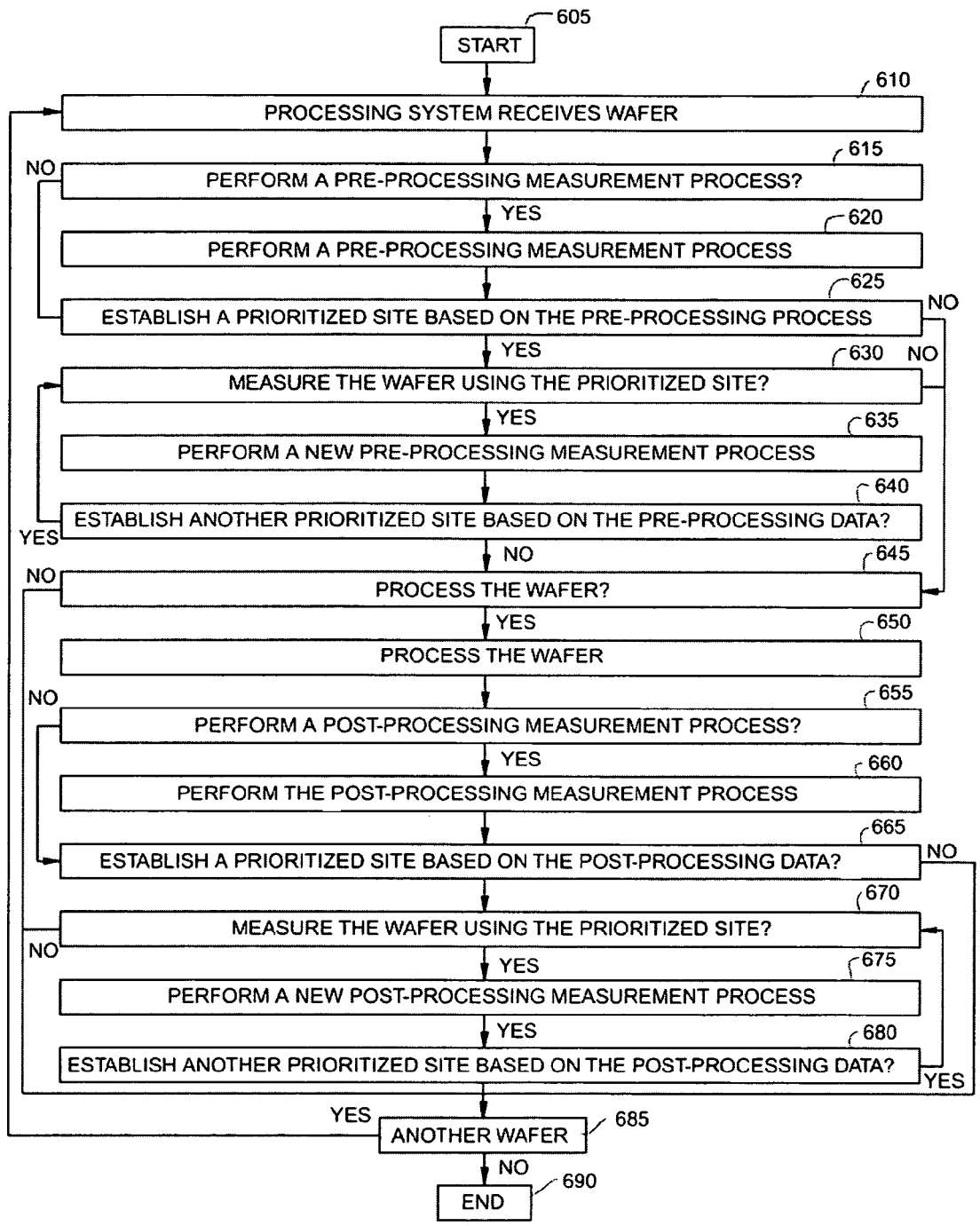
FIG. 6 illustrates an exemplary flow diagram of a method for operating a processing system in accordance with embodiments of the invention.

FIG. 6 illustrates an exemplary flow diagram of a method for operating a processing system in accordance with embodiments of the invention. Procedure 600 starts at task 605. In one embodiment, a host system can download recipes and/or variable parameters to a processing tool, such as processing tool 110 (FIG. 1). In addition, a host system can determine wafer sequencing. The downloaded data can include process recipes, metrology recipes, and wafer sequencing. When all of the system recipes that are referenced by the control plans in the matching control strategy have been verified, the controller 120 sends a message to the processing tool 110 indicating that the system recipe verification was successful. If the system recipe is verified, the lot can start with R2R control. If it is not verified, the lot cannot start with R2R control.

In task 610, when a wafer is received by a processing system 100 (FIG. 1), the pre-process data associated with the wafer and/or lot can be received. Pre-process data can include reference map(s), measurement map(s), prediction map(s), and/or confidence map(s) for an in-coming wafer and/or in-coming lot. Pre-process data can include measurement data from a measurement module associated with a lithography system such as a Lithius® System from Tokyo Electron Limited and/or measurement data from an etching system such as a Telius® System from Tokyo Electron Limited.

In task 615, a query can be performed to determine when to perform a pre-processing measurement process. In one embodiment, when the pre-process data includes the correct metrology data, a pre-processing measurement process is not required. When the process is mature, the process results should be constant and the pre-processing measurement process should not be required for all wafers. However, some wafers may be identified as process verification wafers and a pre-processing measurement process can be performed on these wafers. When the process is immature and the process results are varying, the pre-processing measurement process can be performed on a larger number of wafers. When pre-processing measurement process is required, procedure 600 can branch to task 620, and when a pre-processing measurement process is not required, procedure 600 can branch to task 625.

During a dual damascene procedure, a first damascene process can be performed followed by a second damascene process. In some embodiments, a Via First Trench Last (VFTL) procedure can be performed. In other embodiments, a Trench First Via Last (TFVL) procedure can be performed. A pre-processing measurement process can be performed before a first damascene process, a second damascene process, or both damascene processes. Alternatively, a pre-processing measurement process may not be required.

In task 620, a pre-processing measurement process can be performed. In one embodiment, a control strategy can be executed and used to establish a pre-processing measurement process recipe. When the wafer is positioned in a metrology tool, the measurements can be made in real-time. When the wafer is not currently positioned in a metrology tool, the wafer can be transferred into the metrology module, and then the measurements can be made in real-time. For example, the wafer can be located in or sent to a metrology tool, such as IMM 140 (FIG. 1).

In some embodiments, mask features on a first patterned damascene layer can be measured before a "via first" etching procedure is performed. Alternatively, the mask features of a different patterned damascene layer on the wafer may be measured before a "trench first" etching procedure is performed. One or more data collection (DC) plans and/or mapping applications can be used. Alternatively, a different metrology system can be used.

Figure 7A:
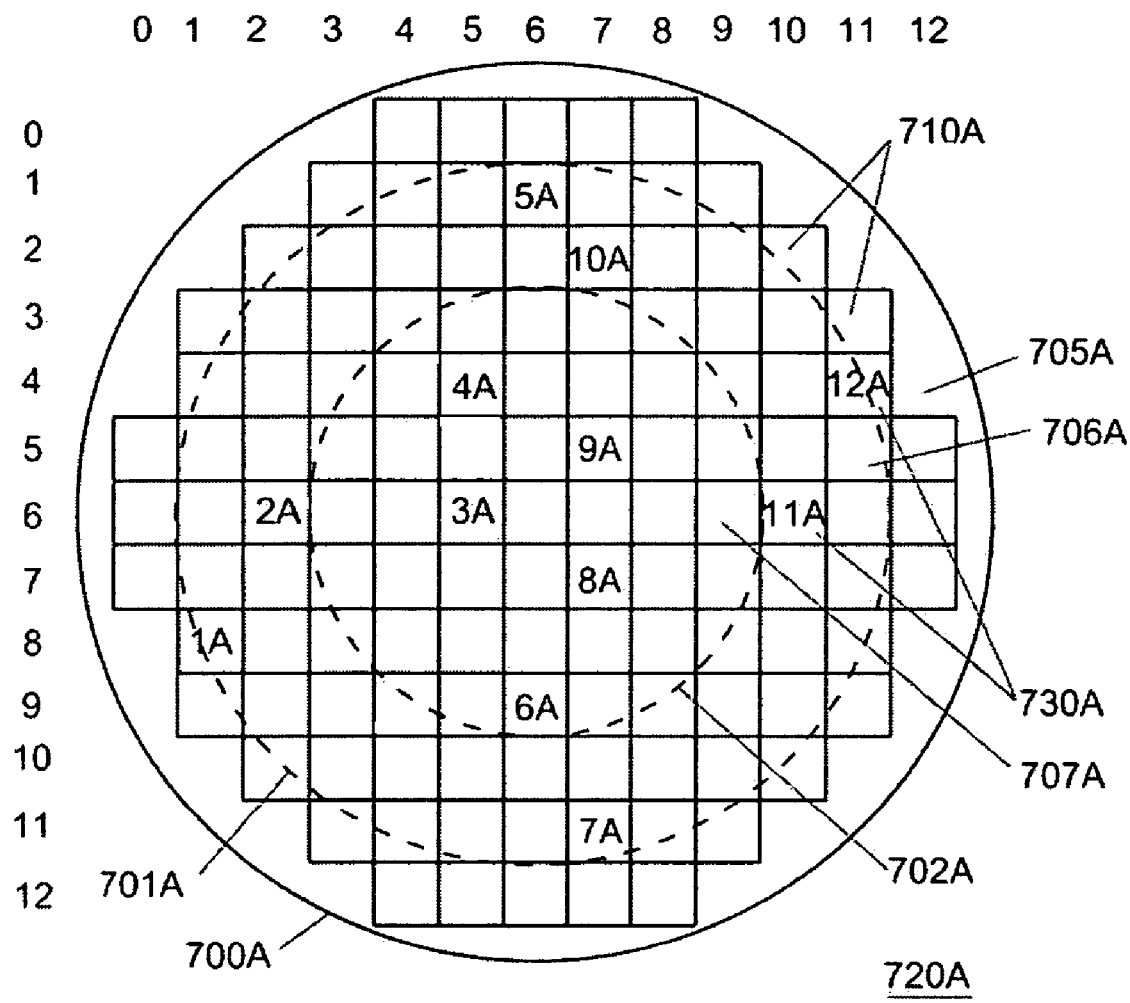
FIGS. 7A-7C show exemplary views of pre-processing measurement maps in accordance with embodiments of the invention.
Figure 7B:
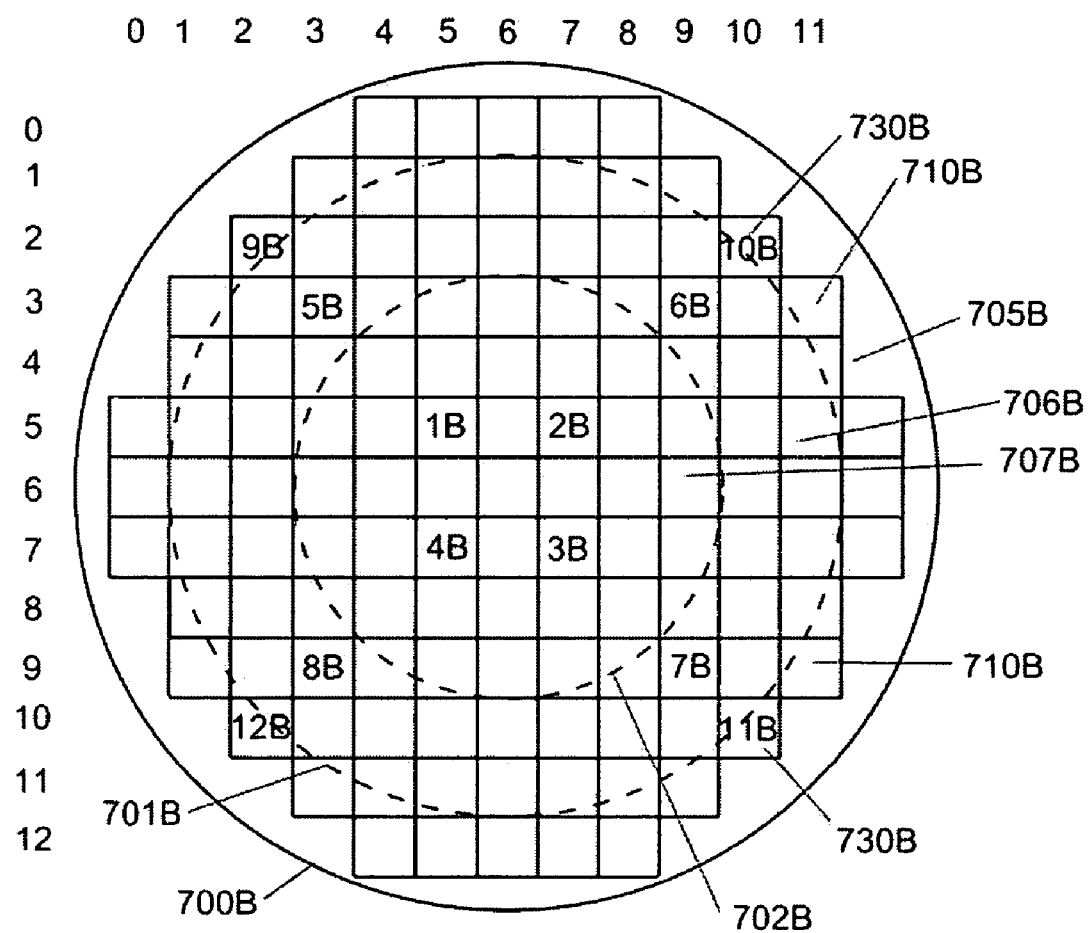
Figure 7C:
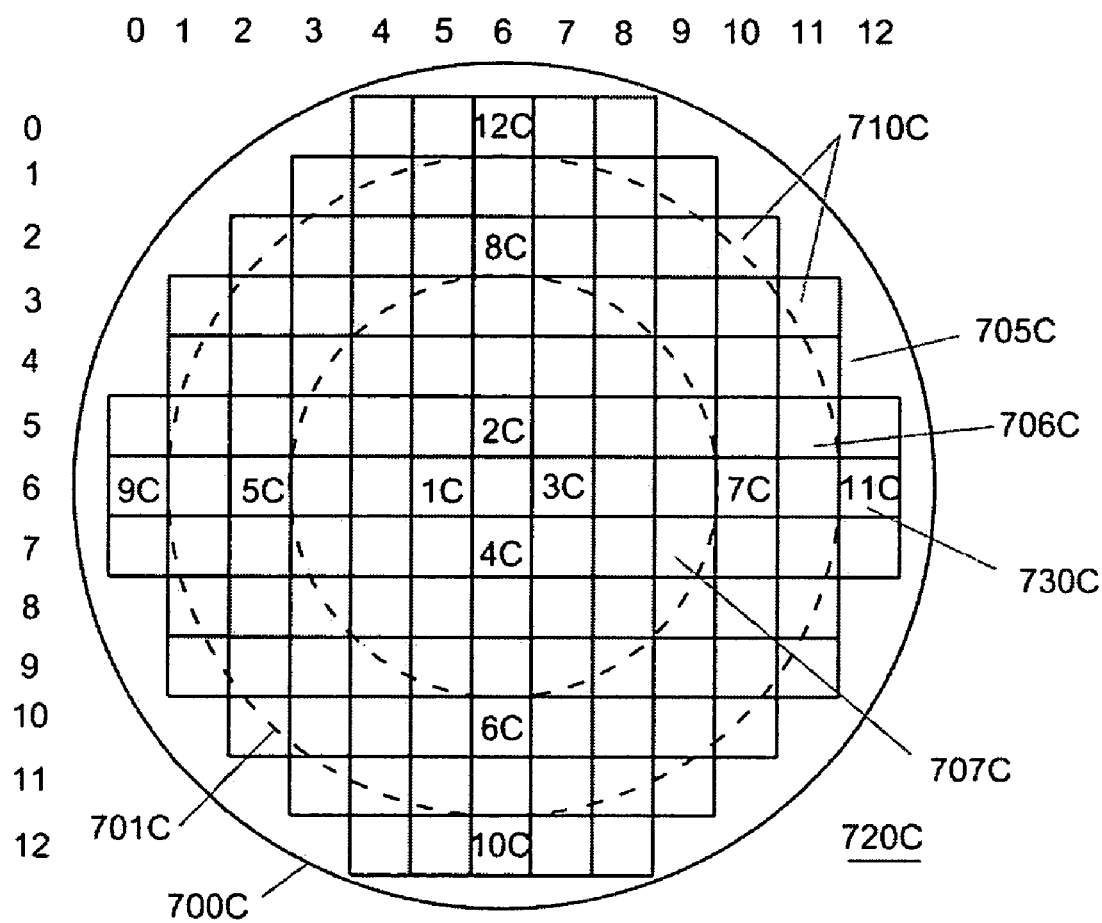

FIGS. 7A-7C show simplified views of pre-processing measurement maps in accordance with embodiments of the invention. In the illustrated embodiments, one-hundred twenty-five chip/dies are shown, but this is not required for the invention. Alternatively, a different number of chip/dies may be shown. In addition, the circular shapes shown are for illustration purposes and are not required for the invention. For example, the circular wafer may be replaced by a non-circular substrate, and the chip/dies may have non-circular shapes.

FIG. 7A shows a simplified view of a first pre-processing measurement map 720A on a wafer 700A that includes a plurality of chip/dies 710A. Rows and columns are shown that are numbered from zero to twelve for illustration. In addition, twelve chip/dies 730A are labeled (1A-12A), and these chip/dies can be used to define the location of the measurement sites for the illustrated pre-processing measurement plan 720A. In addition, two circular lines (701A and 702A) are shown, and these lines can be used to establish three regions (705A, 706A, and 707A) on the wafer 700A. Alternatively, a different number of regions having different shapes may be established on the pre-processing measurement map 720A, and a different number of measurement sites may be established at different locations on the wafer. When a measurement plan is created for a wafer, one or more measurement sites can be established in one or more wafer areas. For example, when the measurement plan is created, measurement do not have to be made at all of the measurement sites 730A shown in FIG. 7A.

FIG. 7B shows a simplified view of a second pre-processing measurement map 720B on a wafer 700B that includes a plurality of chip/dies 710B. Rows and columns are shown that are numbered from zero to twelve for illustration. In addition, twelve chip/dies 730B are labeled (1B-12B), and these chip/dies can be used to define the location of the measurement sites for the illustrated pre-processing measurement plan 720B. In addition, two circular lines (701B and 702B) are shown, and these lines can be used to establish three regions (705B, 706B, and 707B) on the wafer 700B. Alternatively, a different number of regions having different shapes may be established on the pre-processing measurement map 720B, and a different number of measurement sites may be established at different locations on the wafer. When a measurement plan is created for a wafer, one or more measurement sites can be established in one or more wafer areas. For example, when the measurement plan is created, measurement do not have to be made at all of the measurement sites 730B shown in FIG. 7B.

FIG. 7C shows a simplified view of a third pre-processing measurement map 720C on a wafer 700C that includes a plurality of chip/dies 710C. Rows and columns are shown that are numbered from zero to twelve for illustration. In addition, twelve chip/dies 730C are labeled (1C-12C), and these chip/dies can be used to define the location of the measurement sites for the illustrated pre-processing measurement plan 720C. In addition, two circular lines (701C and 702C) are shown, and these lines can be used to establish three regions (705C, 706C, and 707C) on the wafer 700C. Alternatively, a different number of regions having different shapes may be established on the pre-processing measurement map 720C, and a different number of measurement sites may be established at different locations on the wafer. When a measurement plan is created for a wafer, one or more measurement sites can be established in one or more wafer areas. For example, when the measurement plan is created, measurement do not have to be made at all of the measurement sites 730C shown in FIG. 7C.

The number of measurement sites used in a measurement plan can be reduced as the manufacturer becomes more confident that the process is and will continue to produce high quality devices. Alternatively, other pre-processing measurement plans and/or other measurement sites may be used.

A pre-processing measurement plan can be specified by a semiconductor manufacturer based on data stored in a historical database. For example, a semiconductor manufacturer may have historically chosen a number of positions on the wafer when making SEM measurements and would like to correlate the measured data from a integrated metrology tool to the data measured using a SEM tool. Other manufacturers can use TEM and/or FIB data.

When new and/or additional metrology data is required, optical metrology measurements can be made at one or more sites on the wafer. In one embodiment, measurement features, such as periodic gratings, periodic arrays, and/or other periodic structures, on a pre-processed wafer can be measured at one or more of the measurement sites shown in FIGS. 7A-7C. For example, the features on a wafer may be in a mask layer for a dual damascene process as shown in FIGS. 5A-5G.

The pre-processing measurement process can be time consuming and can affect the throughput of a processing system. During process runs, a manufacturer may wish to minimize the amount of time used to measure a wafer. The pre-processing measurement plan can be context driven and different strategies and/or plans may be selected based on the context of the wafer. For example, one or more wafers may not be measured and/or the pre-processing measurement process may be performed using a subset of measurement sites included in the pre-processing measurement plan.

In one embodiment, during a development portion of the semiconductor process, one or more reference maps can be created and stored for later use. A reference measurement map can include measured data at measurement sites that are different from those shown in FIGS. 7A-7C. Alternatively, a reference measurement map can use the same set of measurement sites or a reference measurement map may not be required.

A reference prediction map can include predicted measured data at measurement sites that are different from those shown in FIGS. 7A-7C. Alternatively, a reference prediction map can use the same set of measurement sites or a reference prediction map may not be required.

A reference confidence map can include confidence data at measurement sites that are different from those shown in FIGS. 7A-7C. Alternatively, a reference confidence map can use the same set of measurement sites or a reference confidence map may not be required.

The measurement, prediction, and/or confidence maps can include one or more Goodness Of Fit (GOF) maps, one or more grating thickness maps, one or more via-related maps, one or more Critical Dimension (CD) maps, one or more CD profile maps, one or more material related maps, one or more trench-related maps, one or more sidewall angle maps, one or more differential width maps, or a combination thereof. The pre-process data can also include site result data, site number data, CD measurement flag data, number of measurement sites data, coordinate X data, and coordinate Y data, among others.

Figure 8A:
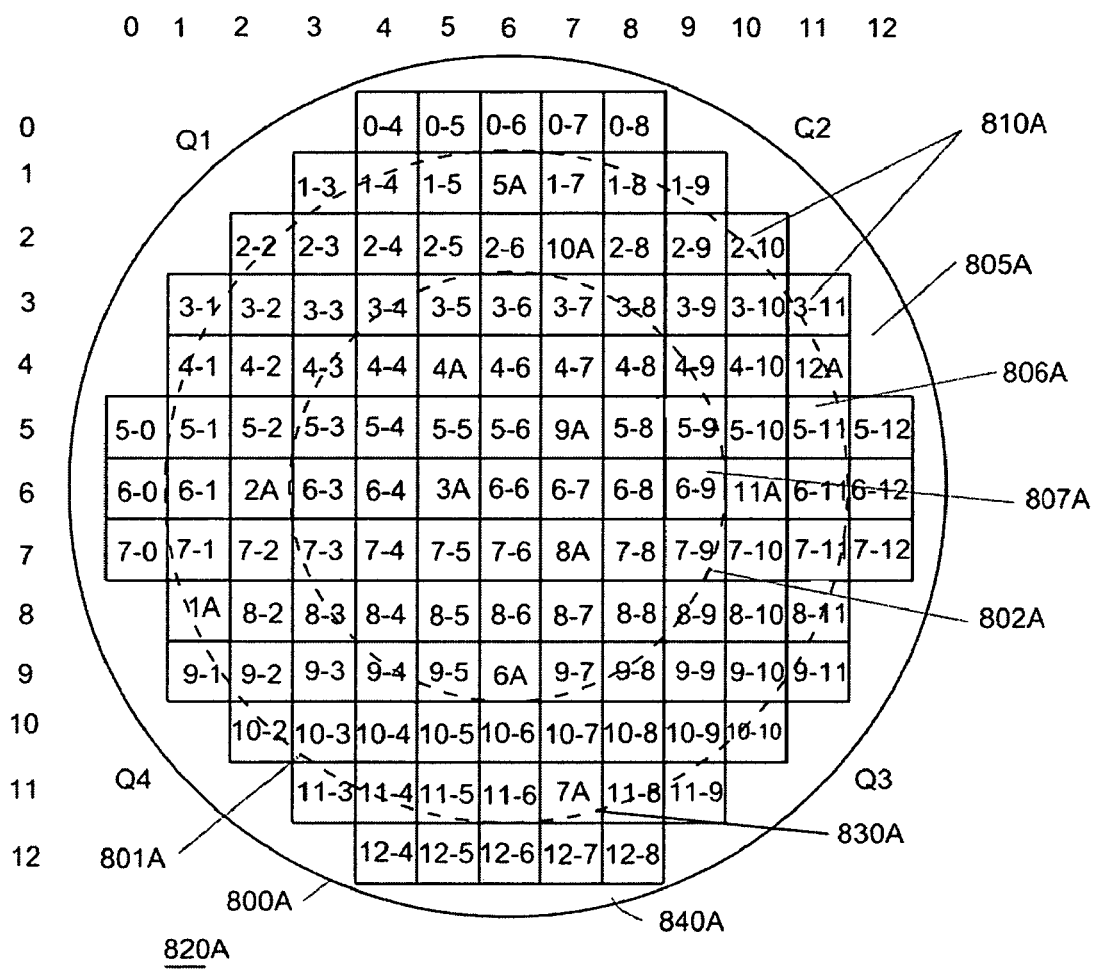
FIGS. 8A-8C illustrate exemplary views of pre-processing prediction maps in accordance with embodiments of the invention.
Figure 8B:
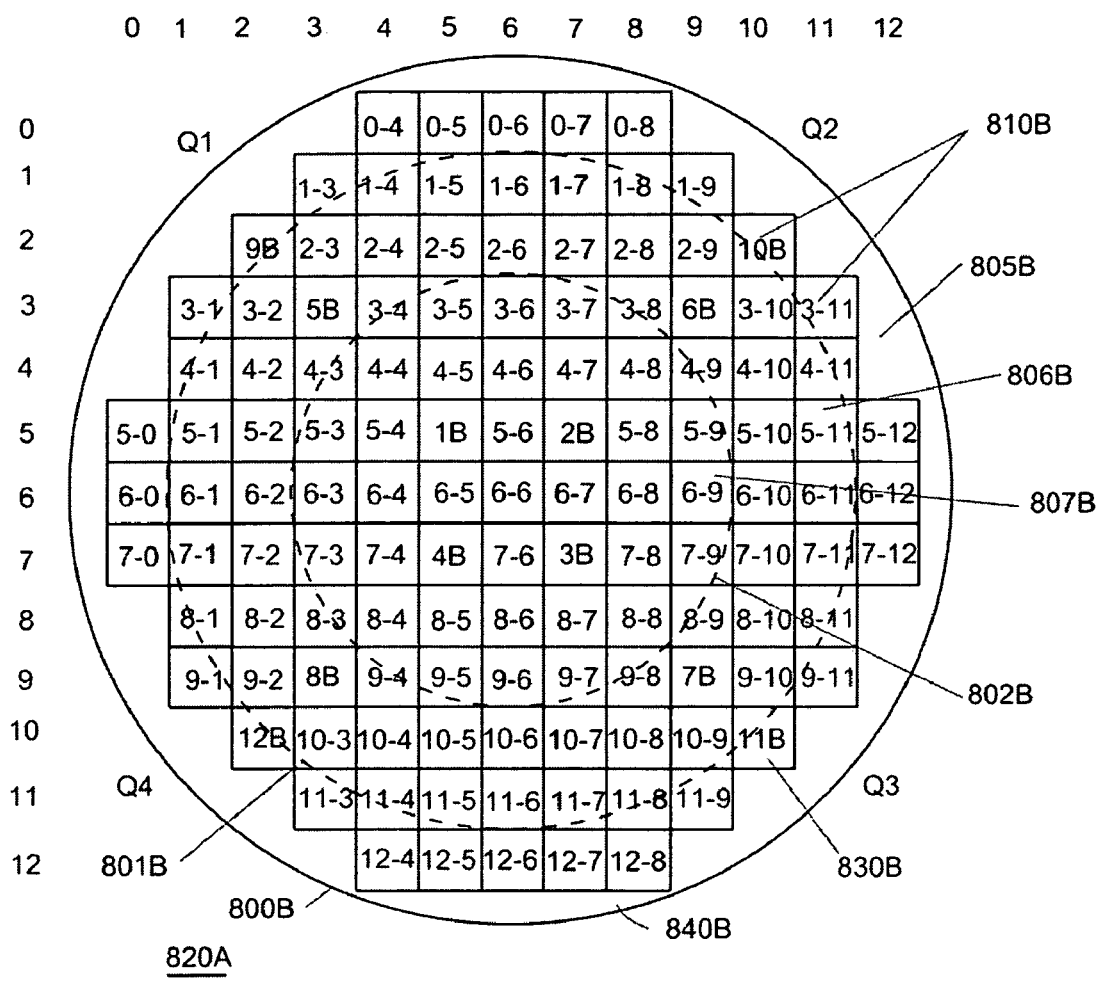
Figure 8C:
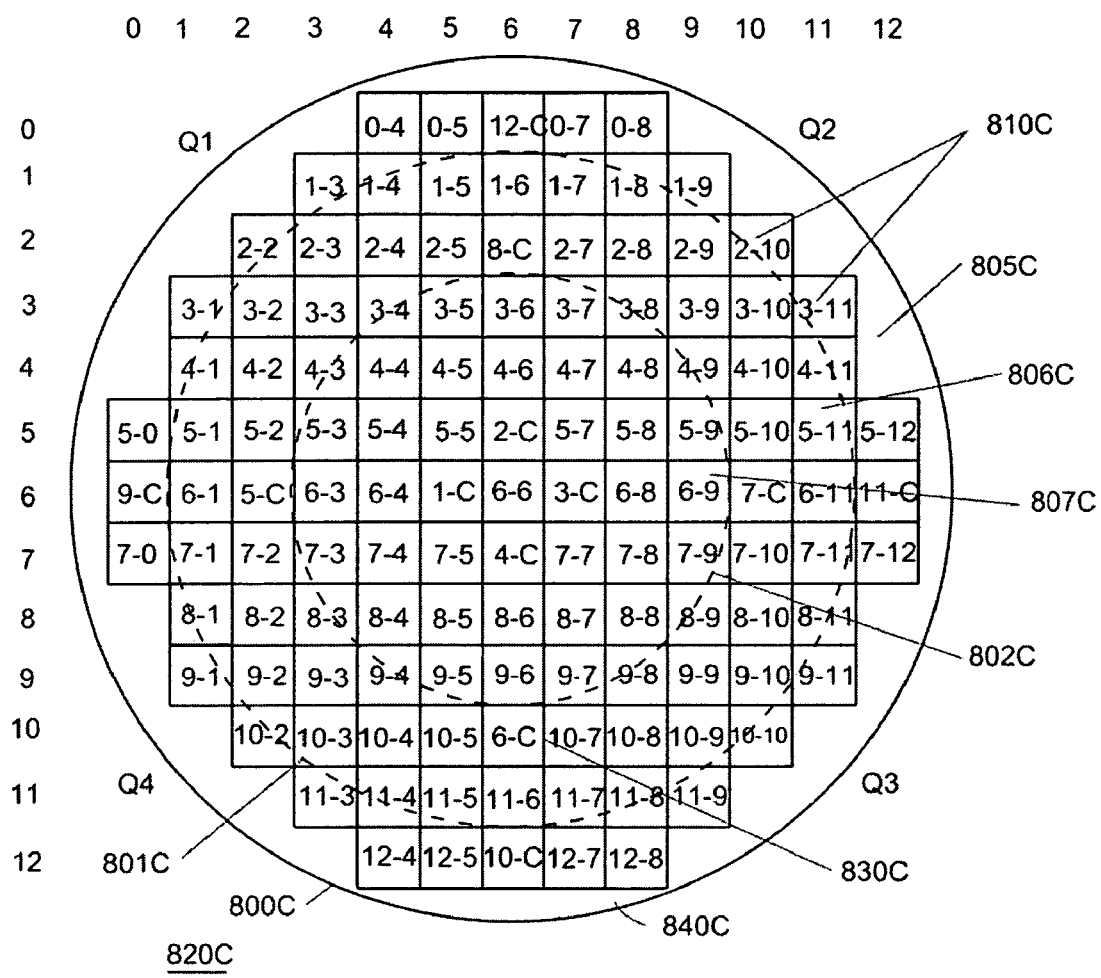

During a pre-processing measurement process, one or more pre-processing prediction maps can be calculated. FIGS. 8A-8C show simplified views of pre-processing prediction maps.

In FIG. 8A, the rows and columns are numbered from zero to twelve for illustration. In addition, twelve chip/dies 830A are labeled (1A-12A), and these chip/dies can be used to define the location of the measurement sites for the illustrated pre-processing prediction map 820A. In addition, two circular lines (801A and 802A) are shown, and these lines can be used to establish three regions (805A, 806A, and 807A) on the wafer 800A. Furthermore, a reference side 840A is shown that can indicate a notch location. Alternatively, a different number of regions having different shapes may be established on the pre-processing prediction map 820A, and a different number of measurement sites may be established at different locations on the wafer.

In FIG. 8B, the rows and columns are numbered from zero to twelve for illustration. In addition, twelve chip/dies 830B are labeled (1B-12B), and these chip/dies can be used to define the location of the measurement sites for the illustrated pre-processing prediction map 820B. In addition, two circular lines (801B and 802B) are shown, and these lines can be used to establish three regions (805B, 806B, and 807B) on the wafer 800B. Furthermore, a reference side 840B is shown that can indicate a notch location. Alternatively, a different number of regions having different shapes may be established on the pre-processing prediction map 820B, and a different number of measurement sites may be established at different locations on the wafer.

In FIG. 8C, the rows and columns are numbered from zero to twelve for illustration. In addition, twelve chip/dies 830C are labeled (1C-12C), and these chip/dies can be used to define the location of the measurement sites for the illustrated pre-processing prediction map 820C. In addition, two circular lines (801C and 802C) are shown, and these lines can be used to establish three regions (805C, 806C, and 807C) on the wafer 800C. Furthermore, a reference side 840C is shown that can indicate a notch location. Alternatively, a different number of regions having different shapes may be established on the pre-processing prediction map 820C, and a different number of measurement sites may be established at different locations on the wafer.

In some embodiments, curve-fitting procedures can be performed to calculate data for the sites on the wafer that are not measured. Alternatively, the prediction maps may be determined using surface estimating, surface fitting techniques, or other mathematical techniques. When prediction maps are created for a wafer, one or more measurement sites can be established in one or more wafer areas, and these measurement sites can be used to provide areas where the predicted data can be more accurate. For example, when the prediction maps are created, measurements do not have to be made at all of the measurement sites.

One or more pre-processing equations can be determined using the measured data from one or more of the measurement sites. For example, a pre-processing equation can be determined using the measured data from a set of the measurement sites shown in FIGS. 8A-8C, and this pre-processing equation can be used and/or modified to calculate the predicted values (expected measured data) for one or more of the chip/dies on the wafer. Alternatively, other measurement sites may be used to determine a pre-processing equation.

In some cases, an entire pre-processing prediction map can be calculated using one or more pre-processing equations and/or modified versions. Alternatively, a pre-processing equation and/or a modified version may be used to calculate/predict values for a portion of the wafer. For example, the portion may include one or more radial areas and/or quadrants.

A pre-processing equation can be modified as necessary to fit the measured data in one or more other measurement sites. An error condition can be declared when a pre-processing equation cannot be determined and/or modified properly. In addition, an error condition can be declared when one or more of the measured values and/or calculated/predicted values are outside a uniformity limit established for the wafer.

Some errors that are generated by mapping applications can be sent to the FDC system, and the FDC system can decide how the processing system should respond to the error. Other errors can be resolved by the mapping applications.

In other cases, one or more additional pre-processing equations can be determined using the measured data from other sets of measurement sites. One or more of the additional pre-processing equations and/or modified versions can be used to create additional pre-processing measured maps that include calculated/predicted values for one or more of the chip/dies on the wafer. An error condition can be declared when an additional pre-processing equation cannot be determined and/or modified properly. In addition, an error condition can be declared when one or more of the measured values and/or calculated/predicted values are outside a uniformity limit established for the wafer. Alternatively, the one or more additional pre-processing equations and/or modified versions may be used to calculate/predict values for a portion of a wafer map. For example, the portion may include one or more radial areas and/or quadrants. In addition, a pre-processing prediction map can be compared to limits established for the wafer using another map or historical data.

Figure 9A:
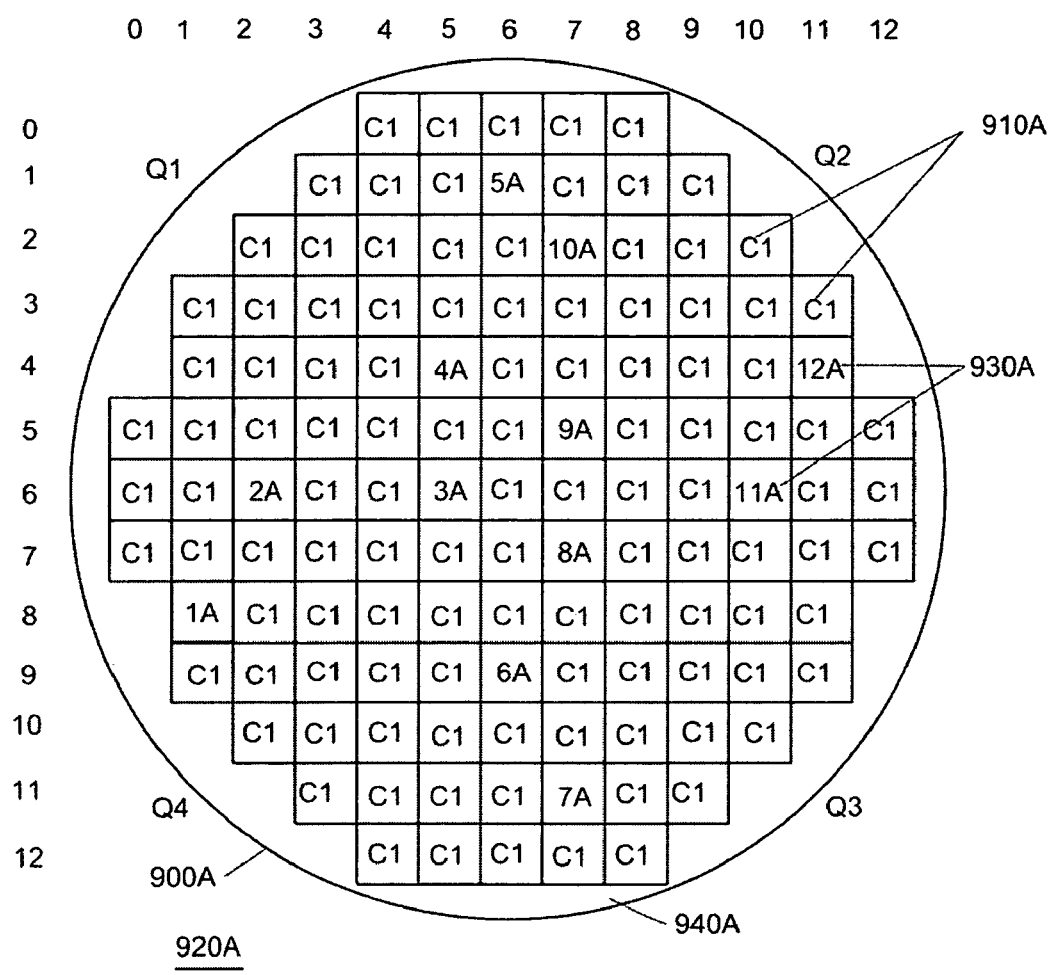
FIGS. 9A-9C illustrate exemplary views of pre-processing confidence maps in accordance with embodiments of the invention.
Figure 9B:
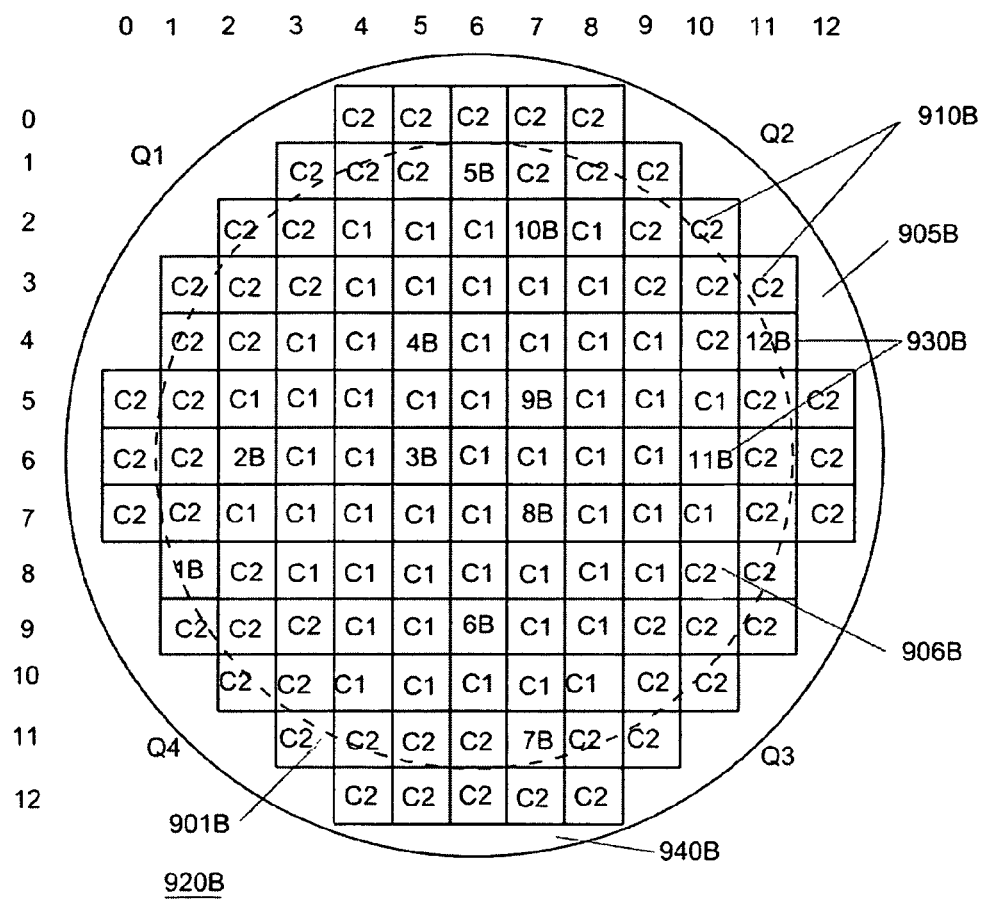
Figure 9C:
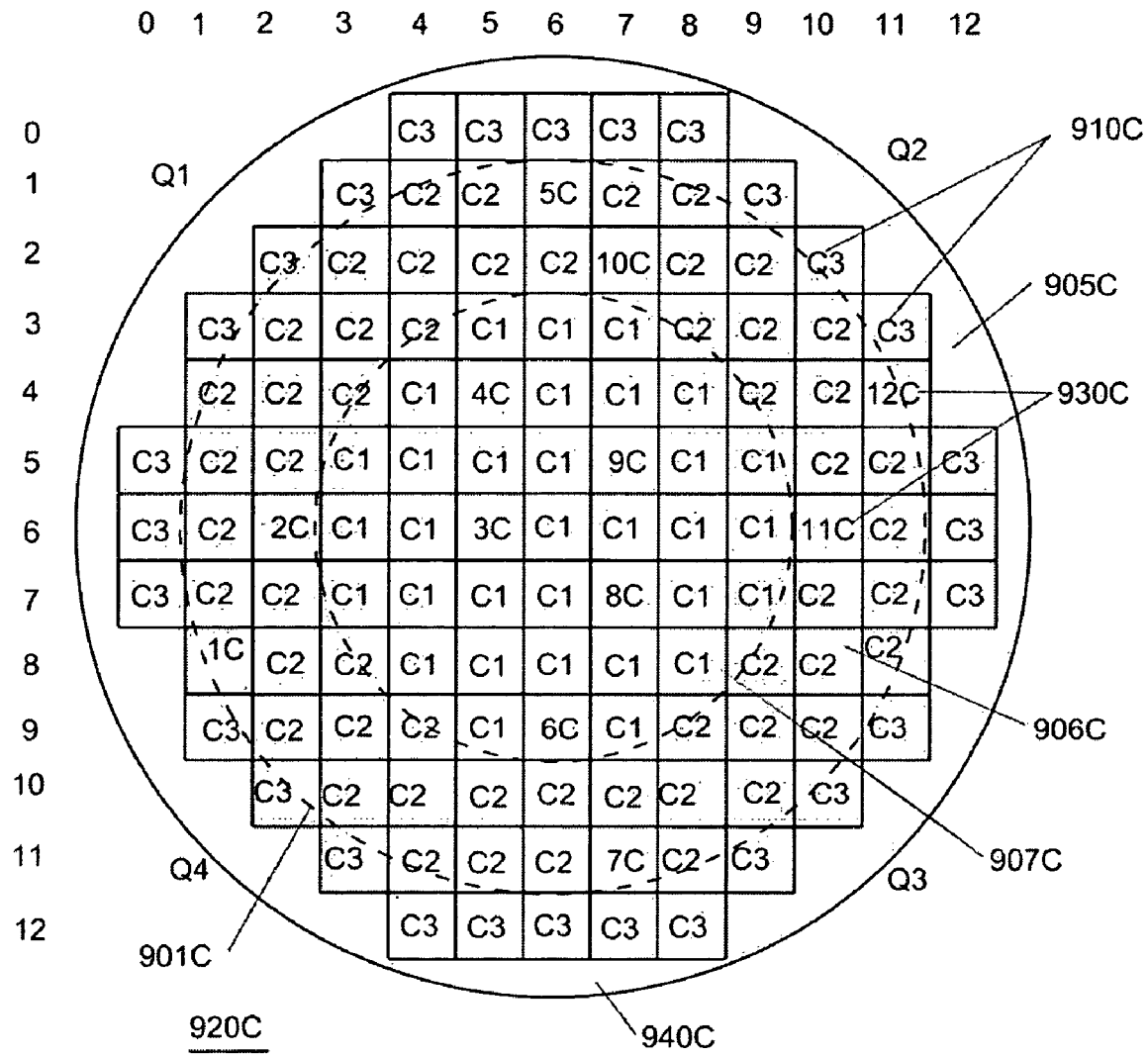

During a pre-processing measurement process, one or more pre-processing confidence maps can be calculated. FIGS. 9A-9C illustrate exemplary views of pre-processing confidence maps in accordance with embodiments of the invention.

FIG. 9A shows a simplified view of a pre-processing confidence map 920A on a wafer 900A including a plurality of chip/dies 910A, twelve measurement sites 930A labeled as (1A-12A), and a reference side 940A that can indicate a notch location on a wafer. As shown in FIG. 9A, a confidence map can have a uniform value "C1" across the entire wafer. For example, the value "C1" may indicate a high confidence level in the predicted values for the measured data across the entire wafer. The value "C1" may indicate the data is within the limits established for the wafer.

FIG. 9B shows a simplified view of another pre-processing confidence map 920B on a wafer 900B including a plurality of chip/dies 910B, twelve measurement sites 930B labeled as (1B-12B), and a reference side 940B that can indicate a notch location on a wafer. In addition, a circular line 901B is shown, and this line can be used to establish two regions (905B and 906B) on the wafer 900B. The confidence map can be divided into two different areas as shown using the values "C1" and "C2" and different values and/or rules can be established for the different areas. For example, two areas can be used to account for differences between a center region and an edge region. Alternatively, a different number of regions having different shapes may be established on the new pre-processing confidence map, and a different number of confidence values may be established at different locations on the wafer.

FIG. 9C shows a simplified view of another pre-processing confidence map 920C on a wafer 900C including a plurality of chip/dies 910C, twelve measurement sites 930C labeled as (1C-12C), and a reference side 940C that can indicate a notch location on a wafer. In addition, two circular lines 901C and 902C are shown, and these lines can be used to establish three regions (905C, 906C, and 907C) on the wafer 900C. The confidence map can be divided into three different areas as shown using the values "C1", "C2", and "C3" and different values and/or rules can be established for the different areas. For example, three areas can be used to account for differences between an inner region, a mid region, and an outer region. Alternatively, a different number of regions having different shapes may be established on the new pre-processing confidence map, and a different number of confidence values may be established at different locations on the wafer.

Alternatively, confidence values may not be calculated and/or required for the entire wafer, and a pre-processing confidence map may include confidence data for one or more chip/dies. In other embodiments, a different number of areas and/or differently shaped areas may be used. For example, a processing chamber may have unique characteristics that may affect the confidence levels in certain areas of the wafer.

In one embodiment, a pre-processing confidence map can be calculated using the differences between a pre-processing prediction map and a reference and/or historical prediction map. In other embodiments, a pre-processing confidence map can be calculated using the differences between two pre-processing prediction maps or differences between one or more pre-processing prediction maps and uniformity limits established for a product line. For example, a manufacturer may allow wider limits for chips/dies in one or more regions of the wafer to maximize yield. A mapping application and/or the FDC system can use business rules to determine uniformity limits.

When a value in a prediction map is close to a uniformity limit, the confidence value may be lower than when the value in a prediction map is not close to uniformity limit.

In addition, the confidence values can be weighted for different chips/dies and/or different areas of the wafer. For example, a high confidence weight can be assigned to the calculations and/or data associated with one or more of the previously discussed measurement sites.

In addition, process results maps and/or confidence maps associated with one or more processes may be used to calculate a confidence map for a wafer. For example, values from a process results map and/or a confidence map may be used as weighting factors.

In task 625, a query can be performed to determine when to establish a prioritized site based on the pre-processing data. When a prioritized site is required, procedure 600 can branch to task 630, and when a prioritized site is not required, procedure 600 can branch to task 645.

When the values in all areas of the confidence map are high, it is not necessary to establish a new prioritized site. In other embodiments, when the differences between the prediction maps are small and/or when the differences between the pre-processing prediction map and a reference measurement map are small, it is not necessary to establish a new prioritized site.

In addition, when the values on a confidence map are consistently high for a particular process, a new measurement plan may be establish that uses a smaller number of measurement sites and that decreases the throughput time for each wafer.

When one or more values in one or more areas of the confidence map are low, one or more new prioritized sites can be established in those areas. In other embodiments, when the differences between the prediction maps are large and/or when the differences between the pre-processing prediction map and a reference measurement map are large, one or more new prioritized sites can be established. When a process is being developed and/or modified, new prioritized sites can be established for the entire wafer or for a particular area such as a particular radial area or a particular quadrant (Q1, Q2, Q3, or Q4).

Figure 10A:
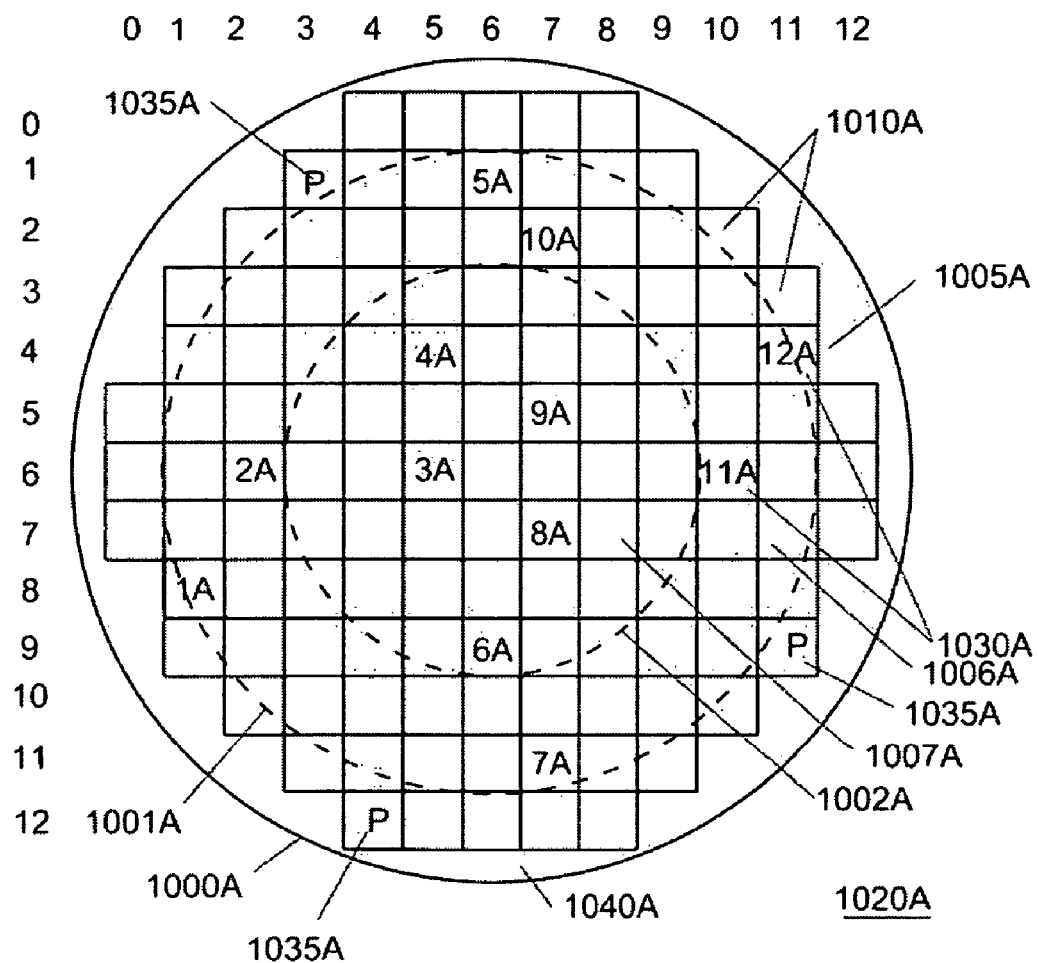
FIGS. 10A-10C show exemplary views of new pre-processing measurement maps in accordance with embodiments of the invention.

When a prioritized site is required, one or more new prioritized sites can be established. FIG. 10A shows a simplified view of a new pre-processing measurement map 1020A on a wafer 1000A including a plurality of chip/dies 1010A, three new pre-processing measurement site 1035A, twelve measurement sites 1030A labeled as (1A-12A), and a reference side 1040A that can indicate a notch location on a wafer.

In addition, two circular lines (1001A and 1002A) are shown, and these lines can be used to establish three regions (1005A, 1006A, and 1007A) on the wafer 1000A. Alternatively, a different number of regions having different shapes may be established on the new pre-processing measurement map, and a different number of new prioritized sites may be established at different locations on the wafer. When confidence values are low and/or an error has occurred in one area of the wafer, one or more prioritized sites can be established in that area as pre-processing measurement sites. For example, when the confidence values are low and/or an error has occurred in the outer region 1005A one or more new prioritized sites 1035A may be established in or near the outer region as shown in FIG. 10A.

Figure 10B:
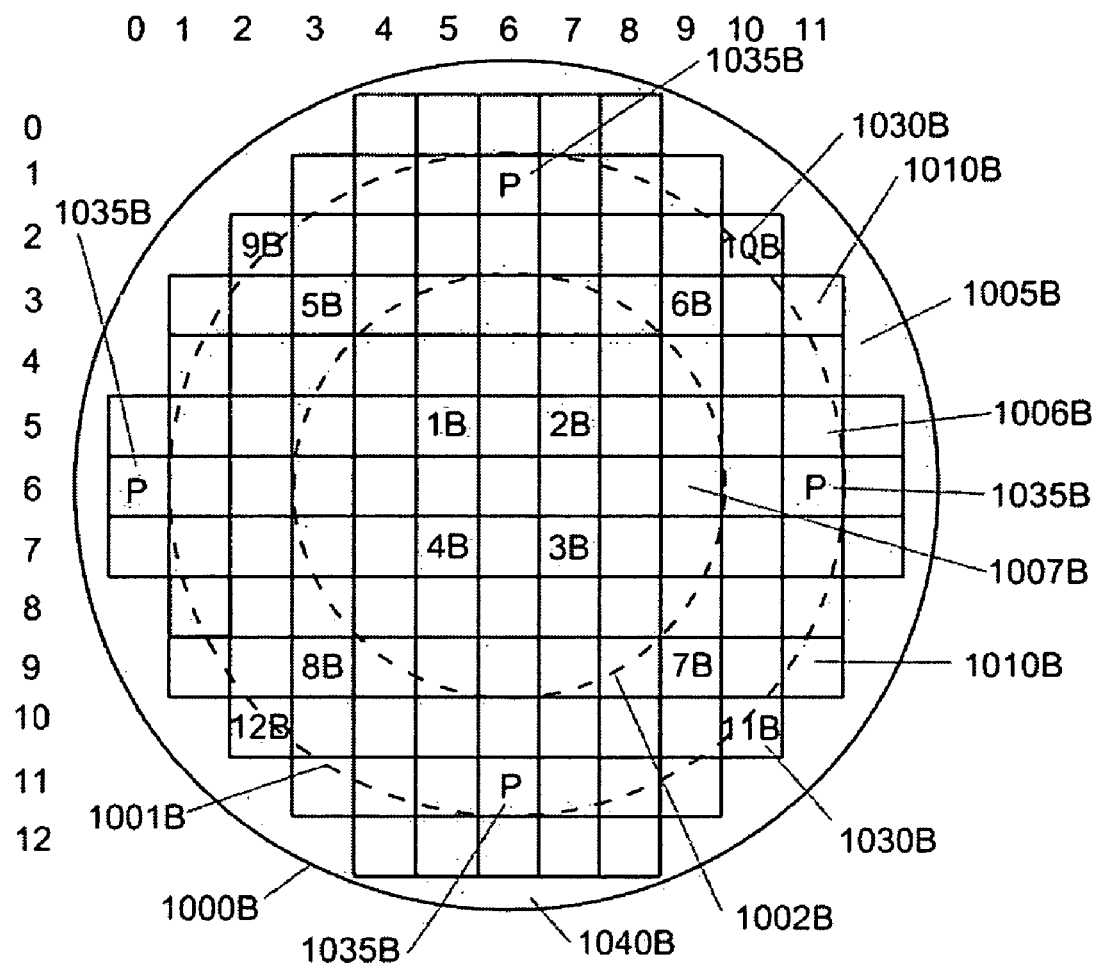

FIG. 10B shows a simplified view of another new pre-processing measurement map 1020B on a wafer 1000B including a plurality of chip/dies 1010B, three new pre-processing measurement site 1035B, the previously discussed twelve measurement sites 1030B labeled as (1B-12B), and a reference side 1040B that can indicate a notch location on a wafer.

In addition, two circular lines (1001B and 1002B) are shown, and these lines can be used to establish three regions (1005B, 1006B, and 1007B) on the wafer 1000B. Alternatively, a different number of regions having different shapes may be established on the new pre-processing measurement map, and a different number of new prioritized sites may be established at different locations on the wafer. When confidence values are low and/or an error has occurred in one area of the wafer, one or more prioritized sites can be established in that area as pre-processing measurement sites. For example, when the confidence values are low and/or an error has occurred in the mid region 1006B one or more new prioritized sites 1035B may be established in or near the mid region as shown in FIG. 10B.

Figure 10C:
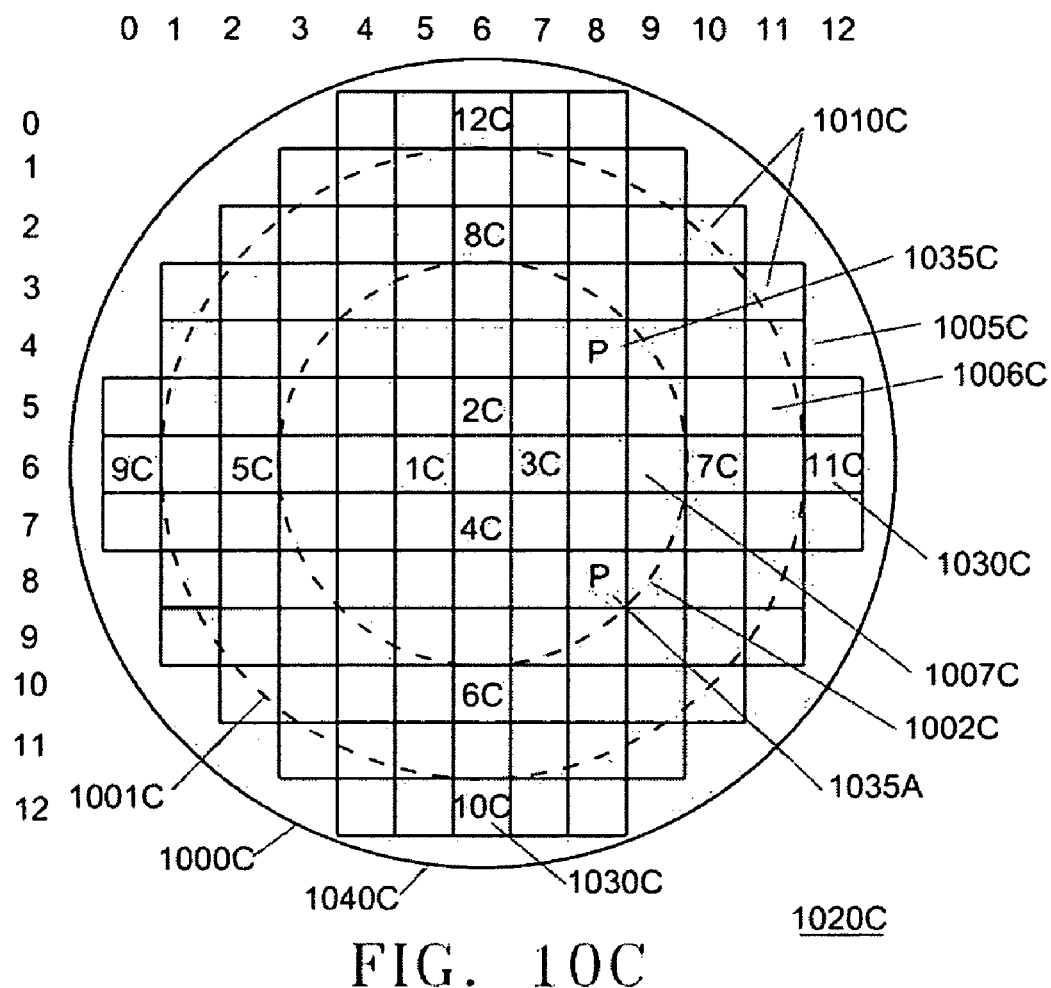

FIG. 10C shows a simplified view of another new pre-processing measurement map 1020C on a wafer 1000C including a plurality of chip/dies 1010C, two new pre-processing measurement site 1035C, twelve measurement sites 1030C labeled as (1C-12C), and a reference side 1040C that can indicate a notch location on a wafer.

In addition, two circular lines (1001C and 1002C) are shown, and these lines can be used to establish three regions (1005C, 1006C, and 1007C) on the wafer 1000C. Alternatively, a different number of regions having different shapes may be established on the new pre-processing measurement map, and a different number of new prioritized sites may be established at different locations on the wafer. When confidence values are low and/or an error has occurred in one area of the wafer, one or more prioritized sites can be established in that area as pre-processing measurement sites. For example, when the confidence values are low and/or an error has occurred in the inner region 1007C one or more new prioritized sites 1035C may be established in or near the inner region as shown in FIG. 10C.

When a new pre-processing prioritized site is required, a new pre-processing metrology recipe can be created, and the new recipe can be used to instruct the metrology tool to make additional pre-processing measurements at the one or more prioritized sites. When the wafer is not in the metrology module, the new metrology recipe can be stored and can be used later to instruct the metrology module to make measurements at the one or more prioritized sites. Alternatively, when the wafer is located in the measurement module, measurements at the one or more new prioritized sites can be made is real time.

In one embodiment, the new pre-processing prioritized site can be selected from a set of previously defined sites. For example, during process development and/or process verification procedures, measurements may have been made at more than forty sites, and one or more of these sites can be used. Alternatively, the new pre-processing prioritized site may not be selected from a set of previously defined sites.

In task 630, a query can be performed to determine when to measure the wafer using a prioritized site. When measurements are required at a prioritized site, procedure 600 can branch to task 635, and when measurements are not required at a prioritized site, procedure 600 can branch to task 645.

In task 635, measurements can be made at the one or more new prioritized sites. When the pre-processing confidence map is calculated while the wafer is in the metrology tool, the additional measurements at newly established prioritized sites can be performed with the minimum amount of delay. When the confidence map is calculated after the wafer has left the metrology tool, the new recipe can be used later, and the additional measurements at the prioritized sites can be performed after some delay time.

In one embodiment, when the measured data for a prioritized site is created, it can be compared to the data in the pre-processing prediction maps. Alternatively, when the measured data for a prioritized site is created, it can be stored and compared to the data in the pre-processing prediction maps at a later time. An error condition can be declared when the measured data for a prioritized site is outside a limit established by a wafer uniformity specification.

When the measured data for a prioritized site is close to the value in a particular prediction map, that prediction map can be used in the area around the prioritized site. For example, when the one or more prioritized sites are in the first quadrant and the measured value(s) are close to the value(s) in the first pre-processing prediction map, then the first pre-processing prediction map can be used in the first quadrant.

When the measured data for a prioritized site is not close to the value in a particular prediction map, a new prediction map can be created and can be used in the area around the prioritized site. For example, when the one or more prioritized sites are in the first quadrant and the measured value(s) are not close to the value(s) in the pre-processing prediction maps, then a new pre-processing prediction map can be created and used in the first quadrant.

Whenever a prediction map changes, a new confidence map or a new portion of a confidence map can be calculated.

In task 640, a query can be performed to determine when to establish another prioritized site based on the pre-processing data. When another prioritized site is required, procedure 600 can branch to task 630, and when another prioritized site is not required, procedure 600 can branch to task 645.

In task 645, a query can be performed to determine when to process the wafer. When wafer processing is required, procedure 600 can branch to task 650, and when wafer processing is not required, procedure 600 can branch to task 685.

In task 650, the wafer can be processed when at least one confidence map or at least one area of a confidence map is within the required limits. During a dual damascene procedure, a first damascene process can be performed followed by a second damascene process. In some embodiments, a VFTL procedure can be performed. In other embodiments, a TFVL procedure can be performed. A measurement process can be performed before, during, and/or after a first damascene process or before, during, and/or after a second damascene process, or before, during, and/or after both damascene processes. Alternatively, a measurement process may not be required.

Figure 11A:
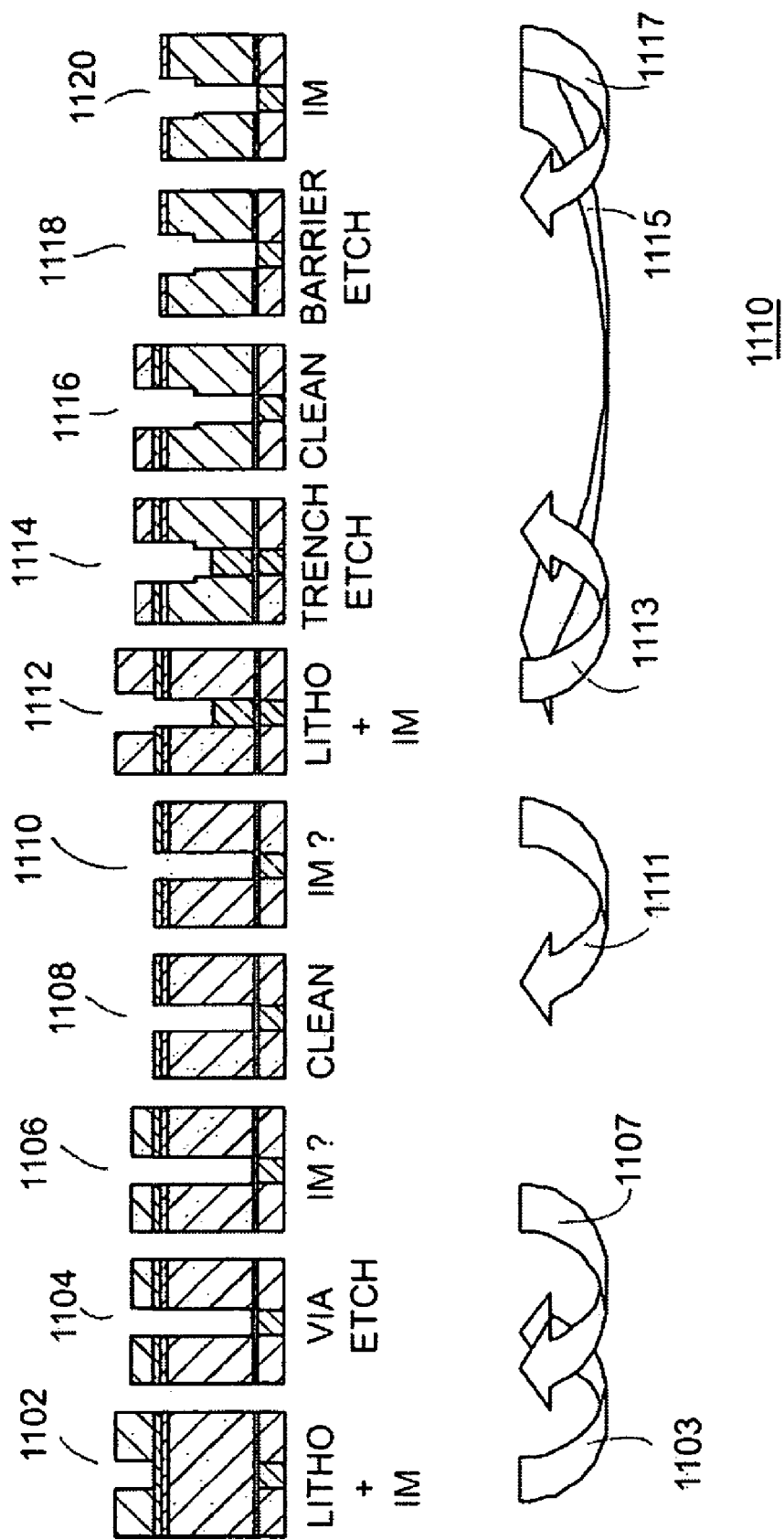
FIG. 11A illustrates a simplified schematic representation of a Via First Trench Last (VFTL) process in accordance with embodiments of the invention.

FIG. 11A illustrates a simplified schematic representation of a VFTL process in accordance with embodiments of the invention. In some cases, the VFTL procedure can include a full via process and a stop layer is not used. Alternatively, a partial via process may be performed and one or more stop layers may be used.

As shown in FIG. 11A, the VFTL procedure 1100 can include a first set of lithography steps 1102, such as deposit, expose, develop, overlay, and measure steps. For example, when the lithography system includes an integrated metrology module measurements can be performed by the IMM, and optionally measurements may be made using a CD SEM.

Information developed and/or obtained during the lithography steps 1102 can be fed forward 1103 to the etching steps 1104.

The VFTL procedure 1100 can also include etching steps 1104 in which a full or partial via can be etched. Measurement steps 1106 can be used as required during and/or after the via etching steps. Next, cleaning steps 1108 such as ashing and/or wet cleaning steps can be performed to remove process residues from the wafer. Measurement steps 1110 can be used as required after and/or during the cleaning steps.

In addition, the VFTL procedure 1100 can include a second set of lithography steps 1112, such as deposit, expose, develop, overlay, and measure steps. For example, when the lithography system includes an integrated metrology module measurements can be performed by the IMM, and optionally measurements may be made using a CD SEM.

Information developed and/or obtained during the second set of lithography steps 1112 can be fed forward 1113 to the trench etching steps 1114.

VFTL procedure 1100 can also include a second set of etching steps 1114 to etch a full or partial trench. Measurement steps (not shown) can be used as required after and/or during the trench etching steps. Next, cleaning steps 1116 such as ashing and/or wet cleaning steps can be performed to remove process residues from the wafer. Measurement steps (not shown) can be used as required after and/or during the cleaning steps.

Furthermore, the VFTL procedure 1100 can include additional etching steps 1118 such as barrier etching steps and IM measurements 1120 can be made after the additional etching steps have been performed.

Information developed and/or obtained during the IM measurements 1120 can be fed back 1115 to the trench etching steps 1114 and fed back 1117 to the additional etching steps 1118.

New prioritized measurement sites can be created and/or used during one or more steps in the VFTL procedure 1100. Measurement maps, prediction maps, reference maps, process maps, confidence maps and/or other maps can be used and/or created during one or more steps in the VFTL procedure 1100. For example, maps may be used to create new prioritized measurement sites, and the new prioritized measurement sites can be used to create and/or update one or more maps.

Figure 11B:
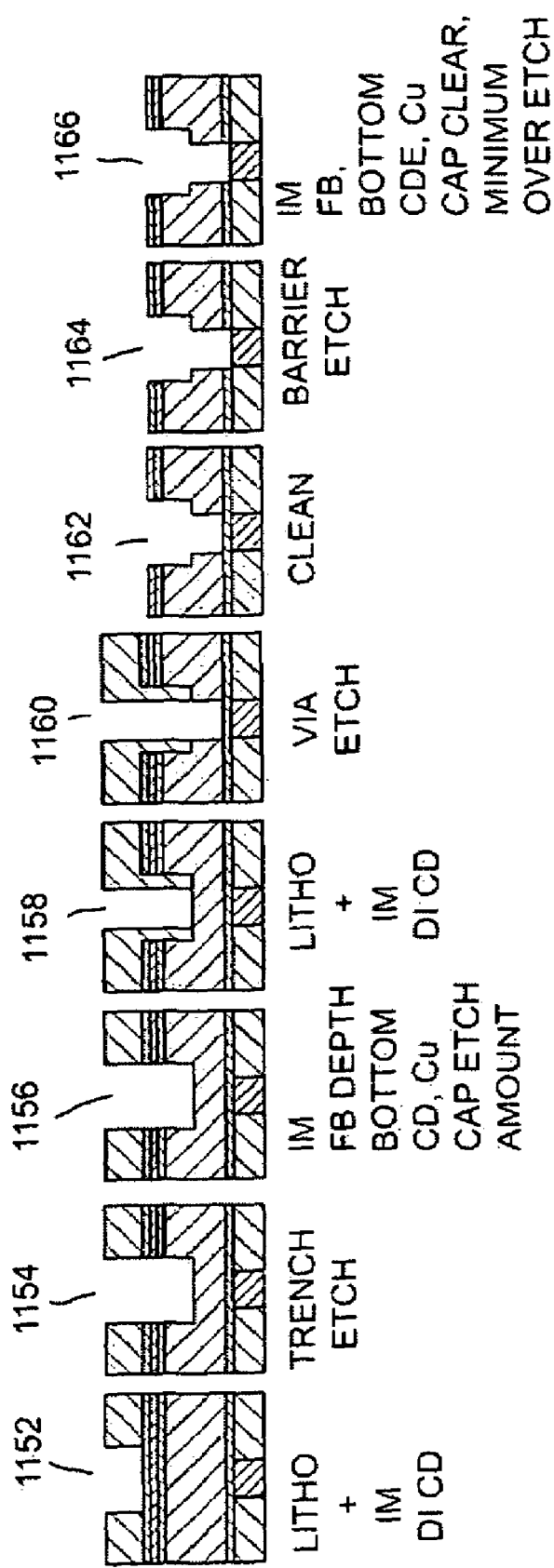
FIG. 11B illustrates a simplified schematic representation of a Trench First Via Last (TFVL) process in accordance with embodiments of the invention.
Figure 11B:
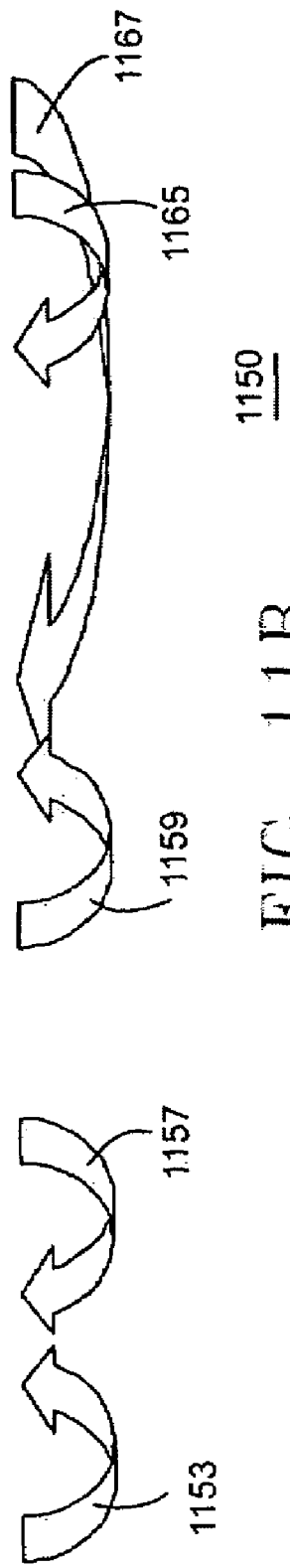

FIG. 11B illustrates a simplified schematic representation of a TFVL process in accordance with embodiments of the invention. In some cases, the TFVL procedure 1150 can include a full trench process and a stop layer is not used. Alternatively, a partial trench process may be performed and one or more stop layers may be used.

The TFVL procedure 1150 can include a first set of lithography steps 1152, such as deposit, expose, develop, overlay, and measure steps. For example, when the lithography system includes an integrated metrology module measurements can be performed by the IMM, and optionally measurements may be made using a CD SEM.

Information developed and/or obtained during the first set of lithography steps 1152 can be fed forward 1153 to the etching steps 1154.

The TFVL procedure 1150 can also include etching steps 1154 to etch a full or partial trench. Measurement steps 1156 can be used as required after and/or during the trench etching steps. Information developed and/or obtained during the etching steps 1154 and/or measurement steps 1156 can be fed back 1157 to the etching steps 1154. Next, cleaning steps (not shown) such as ashing and/or wet cleaning steps can be performed to remove process residues from the wafer. Measurement steps (not shown) can be used as required after and/or during the cleaning steps.

In addition, the TFVL procedure 1150 can include a second set of lithography steps 1158, such as deposit, expose, develop, overlay, and measure steps. For example, when the lithography system includes an integrated metrology module measurements can be performed by the IMM, and optionally measurements may be made using a CD SEM.

Information developed and/or obtained during the second set of lithography steps 1158 can be fed forward 1159 to the via etching steps 1160.

The TFVL procedure 1150 can also include etching steps 1160 to etch a full or partial via after a trench has been etched. Measurement steps (not shown) can be used as required after and/or during the via etching steps. Next, cleaning steps 1162 such as ashing and/or wet cleaning steps can be performed to remove process residues from the wafer. Measurement steps (not shown) can be used as required after and/or during the cleaning steps.

Furthermore, the TFVL procedure 1150 can include additional etching steps 1164 such as barrier etching steps and IM measurements 1166 can be made after the additional etching steps have been performed.

Information developed and/or obtained during the IM measurements 1166 can be fed back 1167 to the via etching steps 1160 and fed back 1165 to the additional etching steps 1164.

New prioritized measurement sites can be created and/or used during one or more steps in the TFVL procedure 1150. Measurement maps, prediction maps, reference maps, process maps, confidence maps and/or other maps can be used and/or created during one or more steps in the TFVL procedure 1150. For example, maps may be used to create new prioritized measurement sites, and the new prioritized measurement sites can be used to create and/or update one or more maps.

Figure 12A:
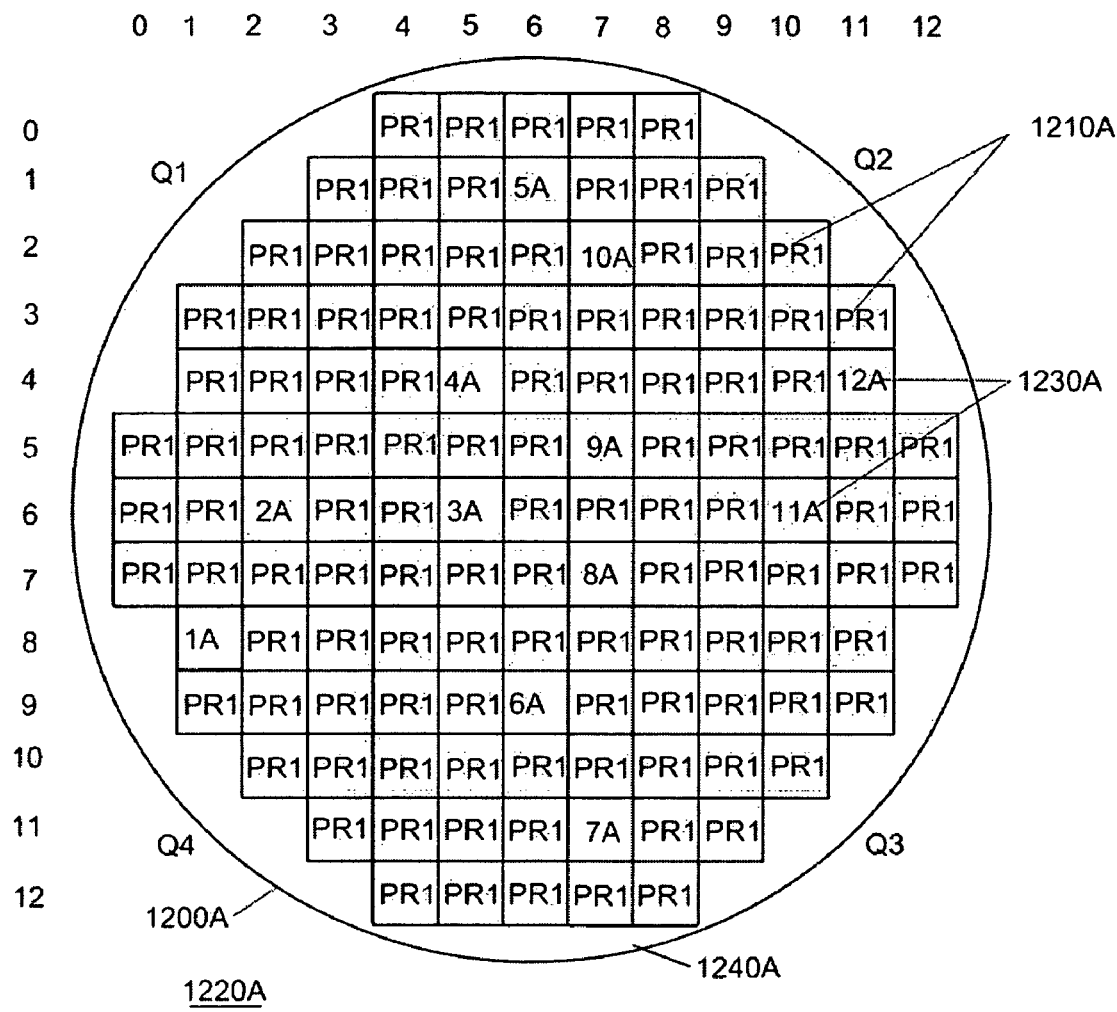
FIGS. 12A-12C show simplified views of a process results maps in accordance with embodiments of the invention.
Figure 12B:
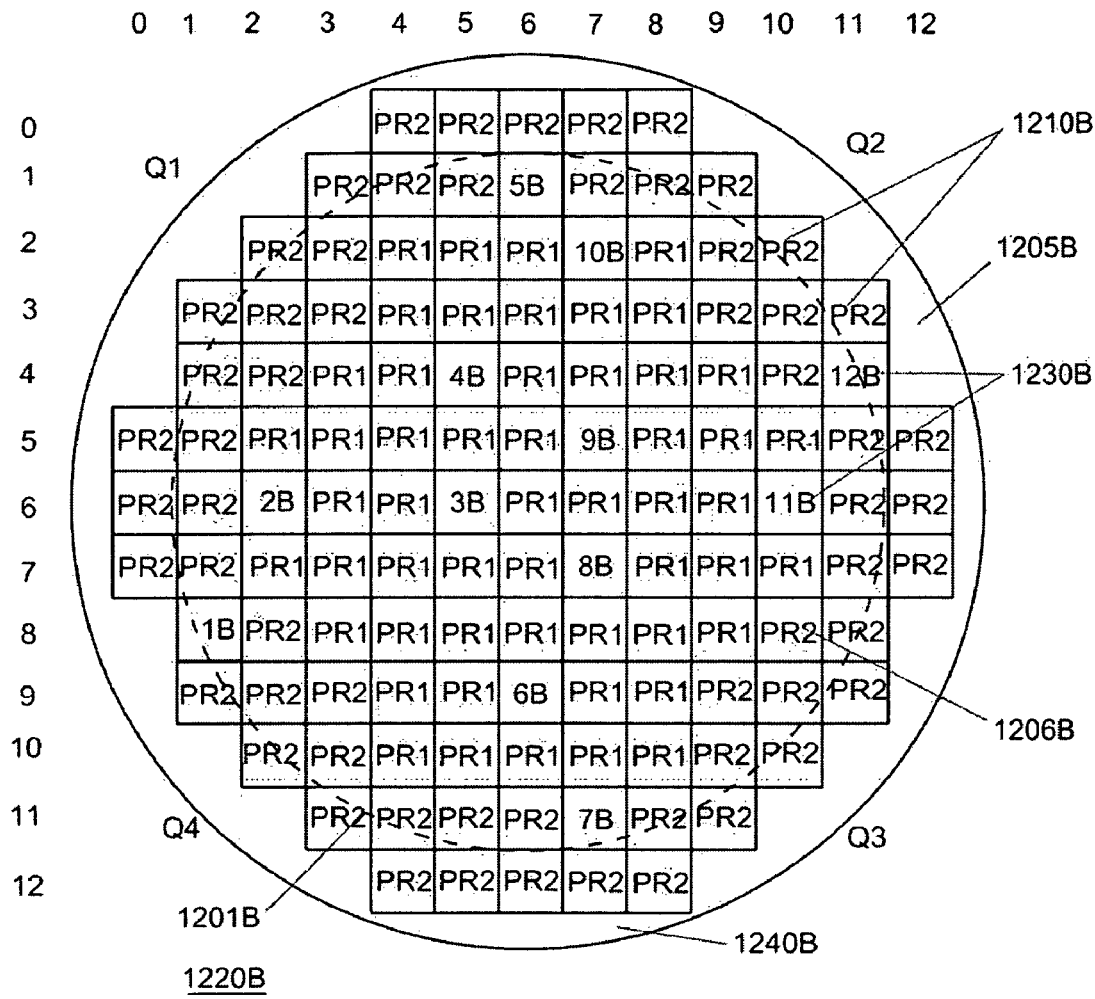
Figure 12C:
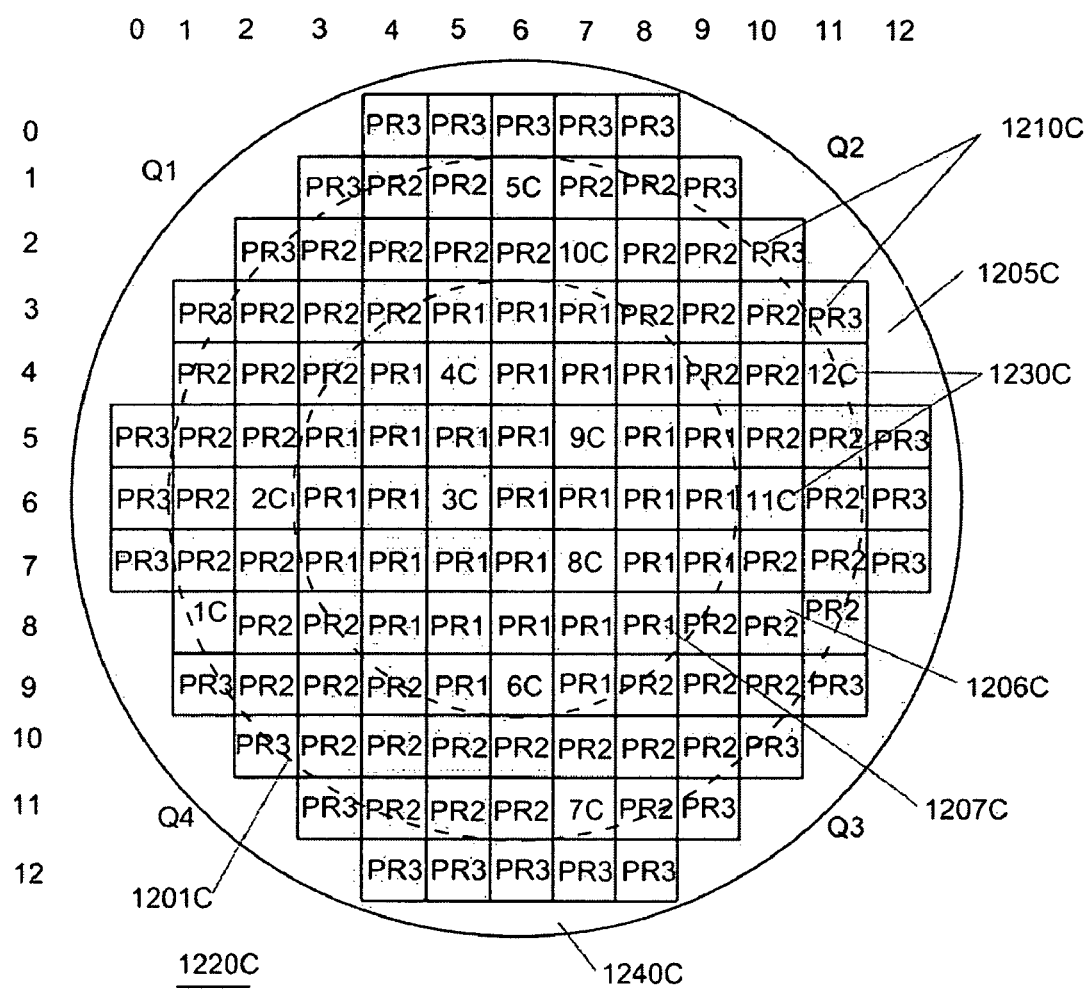

FIGS. 12A-12C show a simplified view of a process results maps in accordance with the invention. Before, during, and/or after a process in a dual damascene procedure is perform, one or more process results maps can be created. In one embodiment, a process results map can be determined using a measurement map and/or a process map. Alternatively, a process results map may be determined using process models.

FIG. 12A shows a simplified view of a process results map 1220A on a wafer 1200A including a plurality of chip/dies 1210A, twelve measurement sites 1230A labeled as (1A-12A), and a reference side 1240A that can indicate a notch location on a wafer. As shown in FIG. 12A, a process results map can have a uniform value "PR1" across the entire wafer. For example, the value "PR1" can indicate uniform process results across the entire wafer. The value "PR1" can indicate a measured or simulated value. Alternatively, process results data does not need to be shown for all of the chip/dies on a wafer.

FIG. 12B shows a simplified view of another process results map 1220B on a wafer 1200B including a plurality of chip/dies 1210B, twelve measurement sites 1230B labeled as (1B-12B), and a reference side 1240B that can indicate a notch location on a wafer. In addition, a circular line 1201B is shown, and this line can be used to establish two regions (1205B and 1206B) on the wafer 1200B. The process results map can be divided into two different areas as shown using the values "PR1" and "PR2" and different values and/or rules can be established for the different areas. For example, two areas can be used to account for processing related differences between a center region and an edge region. Alternatively, a different number of regions having different shapes may be established on the process results map, and a different number of process result values may be established at different locations on the wafer.

FIG. 12C shows a simplified view of another process results map 1220C on a wafer 1200C including a plurality of chip/dies 1210C, twelve measurement sites 1230C labeled as (1C-12C), and a reference side 1240C that can indicate a notch location on a wafer. In addition, two circular lines 1201C and 1202C are shown, and these lines can be used to establish three regions (1205C, 1206C, and 1207C) on the wafer 1200C. The process results map can be divided into three different areas as shown using the values "PR1", "PR2", and "PR3" and different values and/or rules can be established for the different areas. For example, three areas can be used to account for processing related differences between an inner region, a mid region, and an outer region. Alternatively, a different number of regions having different shapes may be established on the process results map, and a different number of process result values may be established at different locations on the wafer.

In other embodiments, a different number of areas and/or differently shaped areas may be used. For example, a processing chamber may have unique characteristics that may affect the confidence levels in certain areas of the wafer.

When a dual damascene procedure is performed, one or more process result maps can be used. A process results map for a via etching process can include X and Y dimensions for a via opening, layer information for one or more layers below the via opening, sidewall angle data for the one or more layers, depth information for the via, alignment data, iso/nested data, and a number of modeling shapes used to characterize the shape of the via.

A process results map for a trench etching process can include CD data for the trench width, CD data for the trench depth, layer information for one or more layers above and/or below the trench opening, sidewall angle data for the one or more layers, alignment data, iso/nested data, and a number of modeling shapes used to characterize the shape of the trench.

Tolerance values and/or limits can be associated with the process results maps can be used to identify allowable variations in one or more process results. In addition, process confidence maps can be used to establish risk factor for one or more processes in a process sequence. For example, process confidence maps may vary with time and may vary in response to chamber cleaning procedures.

When an etching procedure is executed, a control strategy can include one or more maps and/or prediction equations that can be created to model the process space. In one embodiment, prediction equations that vary with radial position (rp) such as (y(rp)=f(x,rp)) can be used. In one case, y(rp) can be equal to a desired process result at a radial position (r) on the wafer. For example, y(rp) can be a desired process result such as "Etch Amount" [EA(rp)], and x(rp) can be equal to a process parameter (Control Variable) that has been related to y(rp). In the process space, one or more prediction and/or modeling equations can be determined by creating a polynomial and finding the coefficients of the polynomial that relates a process gas flow rate to a trim amount in a first part of the process space. For example, an $N^{th}$ order polynomial can be used $$PR(rp) = \sum_{0}^{N} A_n [DV(rp)]^n$$

where DV(rp) is a dynamic variable that can vary with radial position (rp), PR(rp) is a required process result that can vary with radial position (rp), N>=1; and $A_n$ can comprise a constant having at least one of a positive value, a negative value, and a zero value. In one embodiment, the $N^{th}$ order polynomial can be solved to determine a value for DV(rp).

Alternately, an inverse equation can be determined by creating a different polynomial and finding the coefficients of the different polynomial that can relate process variable (gas flow rate) to a process result (etch amount) in different parts of the inverse process space. For example, an $N^{th}$ order polynomial can be used $$DV(rp) = \sum_{0}^{N} C_m [PR(rp)]^m$$

where DV(rp) is a dynamic variable that can vary with radial position (rp), PR(rp) is a required process result, such as etch amount, that can vary with radial position (rp), N>=1, and $C_m$ can comprise a constant having at least one of a positive value, a negative value, and a zero value.

The controller can create a list of terms for these types of equations and/or models, and the controller can manipulate one or more of the terms. The terms can be defined by the controller and can be assigned to at least one step in the process. Alternately, a Recipe Parameter Map can be created in which each term is assigned a parameter's value.

In task 655, a query can be performed to determine when to perform a post-processing measurement process after a dual damascene procedure has been performed. When post-processing measurement process is required, procedure 600 can branch to task 660, and when post-processing measurement process is not required, procedure 600 can branch to task 665.

When a wafer is received by the processing system 100, the processing system can receive wafer data that can be used to determine when a post-processing measurement process is required. For example, wafer state data may be used. When the process is mature, the process results should be constant and the post-processing measurement process should not be required for every wafer. However, some wafers may be identified as process verification wafers and a post-processing measurement process can be performed on these wafers. When the process is immature and the process results are varying, the post-processing measurement process can be performed.

In various embodiments, a control strategy can be executed and used to establish the post-processing measurement process recipe. After a dual damascene procedure has been performed a wafer can have via features within trench features, isolated and/or nested via features, and isolated and/or nested trench features. For example, the wafer can be sent to an IMM 140 (FIG. 1) where the dual damascene features of a patterned wafer can be measured using ODP techniques after a dual damascene procedure has been performed on the wafer. Alternatively, a different metrology system can be used. For example, a TEM and/or SEM measurements may be made.

When the wafer is measured, the post-processing measurement process recipe can be used to determine the number and location of the measurement sites. In addition, one or more data collection plans can be executed, one or more mapping applications can be used, and one or more measurement maps can be created. In addition, stored measurement maps may be used.

Figure 13A:
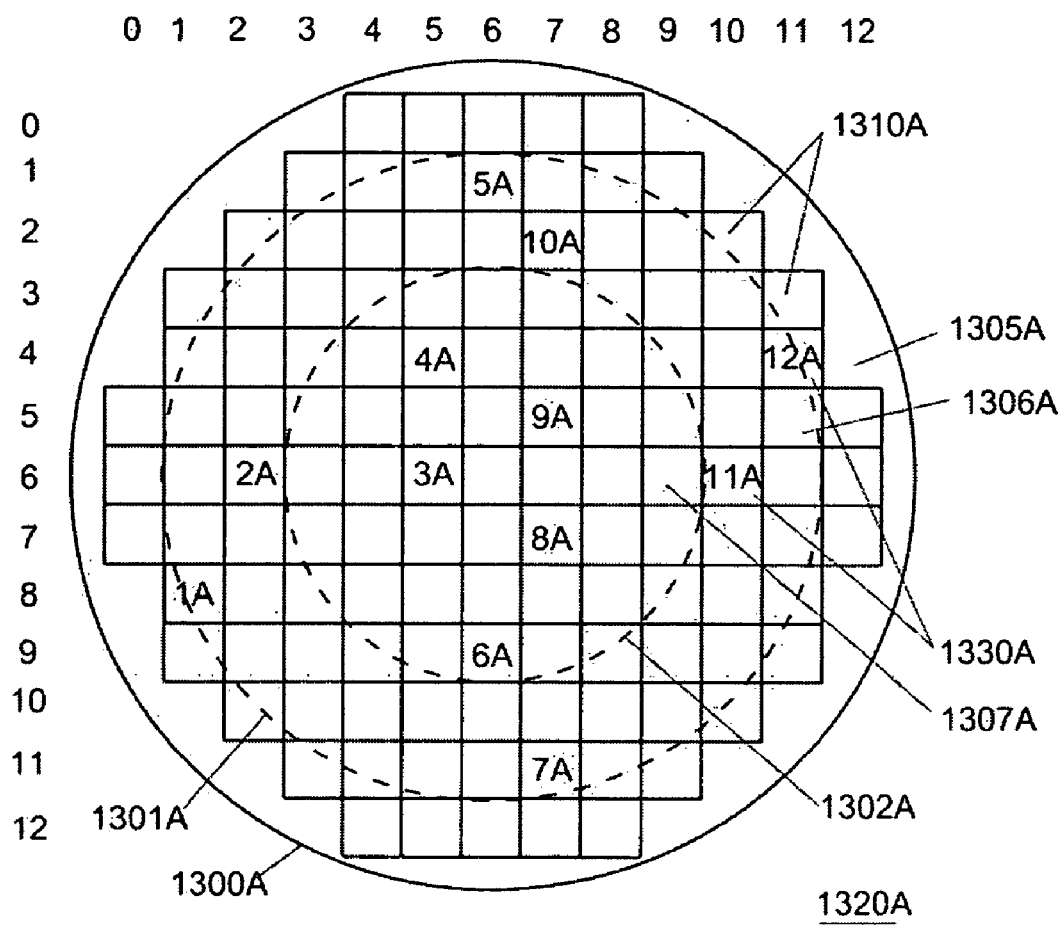
FIGS. 13A-13C show exemplary views of post-processing measurement maps in accordance with embodiments of the invention.
Figure 13B:
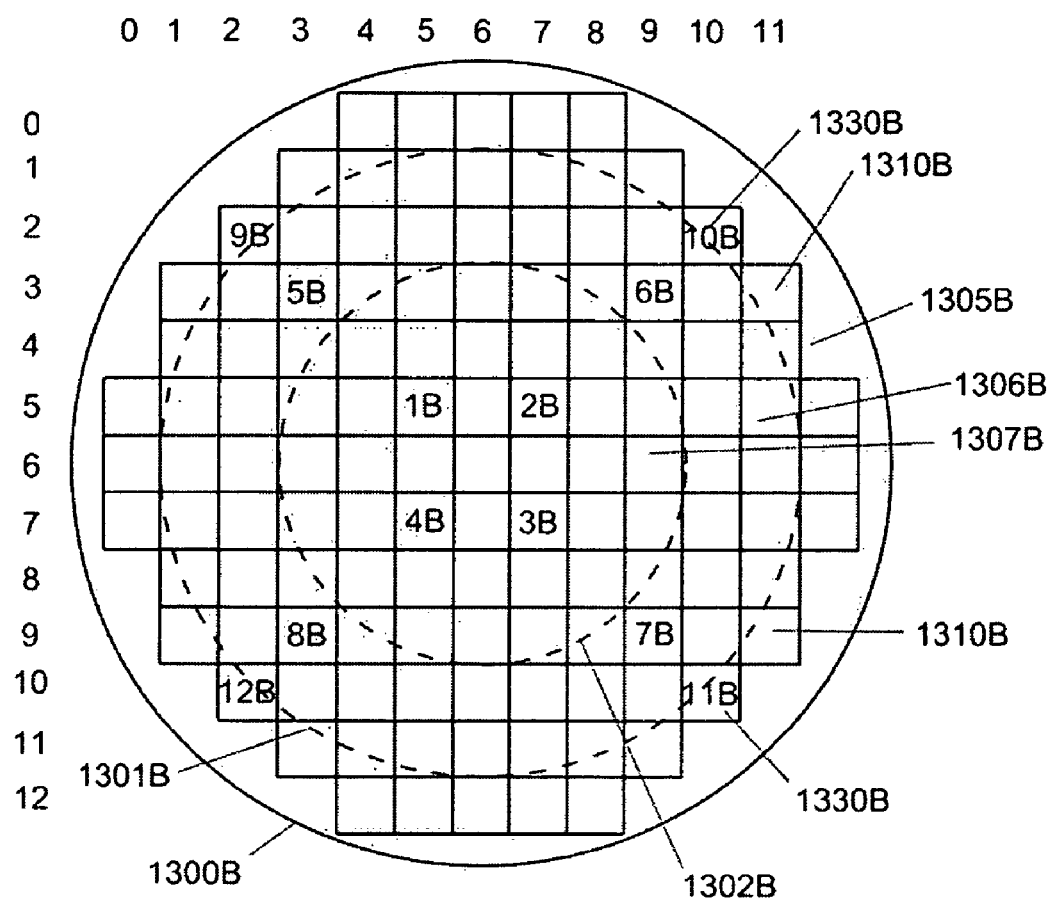
Figure 13C:
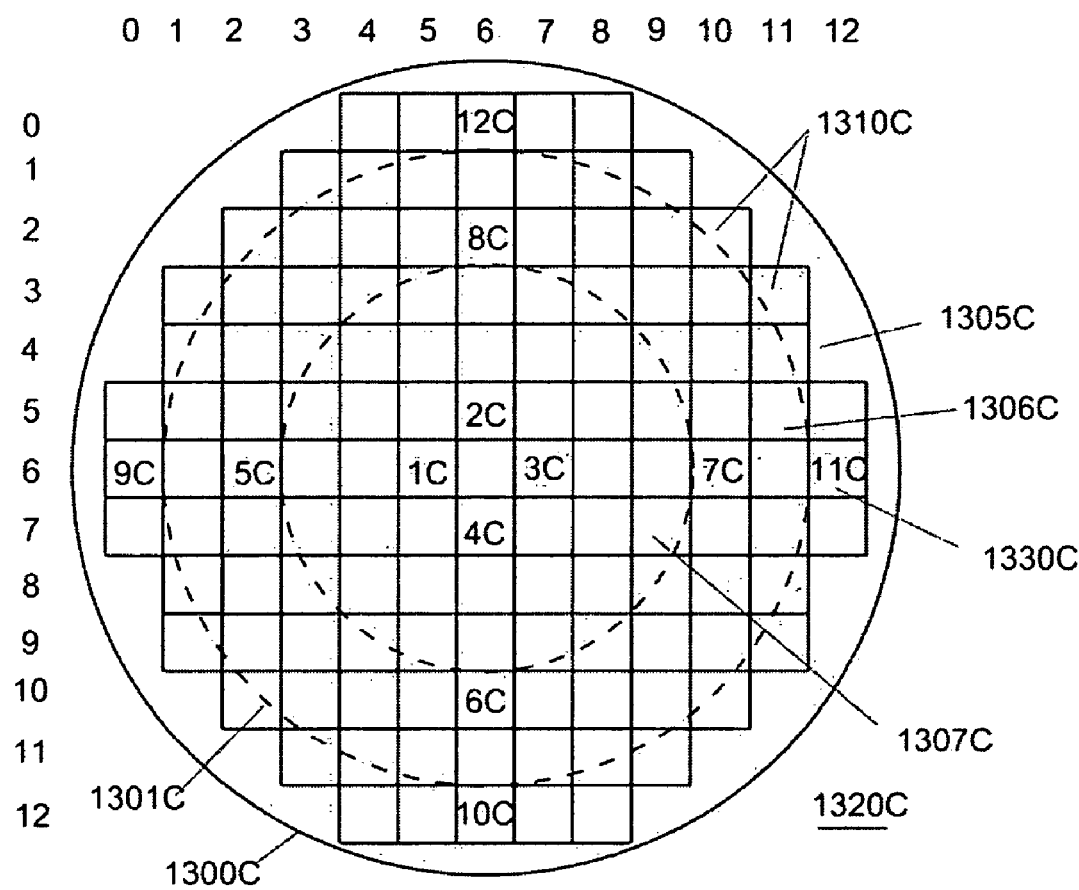

FIGS. 13A-13C show simplified views of post-processing measurement maps in accordance with embodiments of the invention. In the illustrated embodiments, one-hundred twenty-five chip/dies are shown, but this is not required for the invention. Alternatively, a different number of chip/dies may be shown. In addition, the circular shapes shown are for illustration purposes and are not required for the invention.

For example, the circular wafer may be replaced by a non-circular substrate, and the chip/dies may have non-circular shapes.

FIG. 13A shows a simplified view of a first post-processing measurement map 1320A on a wafer 1300A that includes a plurality of chip/dies 1310A. Rows and columns are shown that are numbered from zero to twelve for illustration. In addition, twelve chip/dies 1330A are labeled (1A-12A), and these chip/dies can be used to define the location of the measurement sites for the illustrated post-processing measurement plan 1320A. In addition, two circular lines (1301A and 1302A) are shown, and these lines can be used to establish three regions (1305A, 1306A, and 1307A) on the wafer 1300A. Alternatively, a different number of regions having different shapes may be established on the post-processing measurement map 1320A, and a different number of measurement sites may be established at different locations on the wafer. When a measurement plan is created for a wafer, one or more measurement sites can be established in one or more wafer areas. For example, when the measurement plan is created, measurement do not have to be made at all of the measurement sites 1330A shown in FIG. 13A.

FIG. 13B shows a simplified view of a second post-processing measurement map 1320B on a wafer 1300B that includes a plurality of chip/dies 1310B. Rows and columns are shown that are numbered from zero to twelve for illustration. In addition, twelve chip/dies 1330B are labeled (1B-12B), and these chip/dies can be used to define the location of the measurement sites for the illustrated post-processing measurement plan 1320B. In addition, two circular lines (1301B and 1302B) are shown, and these lines can be used to establish three regions (1305B, 1306B, and 1307B) on the wafer 1300B. Alternatively, a different number of regions having different shapes may be established on the post-processing measurement map 1320B, and a different number of measurement sites may be established at different locations on the wafer. When a measurement plan is created for a wafer, one or more measurement sites can be established in one or more wafer areas. For example, when the measurement plan is created, measurement do not have to be made at all of the measurement sites 1330B shown in FIG. 13B.

FIG. 13C shows a simplified view of a third post-processing measurement map 1320C on a wafer 1300C that includes a plurality of chip/dies 1310C. Rows and columns are shown that are numbered from zero to twelve for illustration. In addition, twelve chip/dies 1330C are labeled (1C-12C), and these chip/dies can be used to define the location of the measurement sites for the illustrated post-processing measurement plan 1320C. In addition, two circular lines (1301C and 1302C) are shown, and these lines can be used to establish three regions (1305C, 1306C, and 1307C) on the wafer 1300C. Alternatively, a different number of regions having different shapes may be established on the post-processing measurement map 1320C, and a different number of measurement sites may be established at different locations on the wafer. When a post-processing measurement plan is created for a wafer, one or more measurement sites can be established in one or more wafer areas. For example, when the measurement plan is created, measurement do not have to be made at all of the measurement sites 1330C shown in FIG. 13C.

The number of measurement sites used in a post-processing measurement plan can be reduced as the manufacturer becomes more confident that the process is and will continue to produce high quality devices. Alternatively, other post-processing measurement plans and/or other measurement sites may be used.

A post-processing measurement plan can be specified by a semiconductor manufacturer based on data stored in a historical database. For example, a semiconductor manufacturer may have historically chosen a number of positions on the wafer when making SEM measurements and would like to correlate the measured data from a integrated metrology tool to the data measured using a SEM tool. Other manufacturers can use TEM and/or FIB data.

When new and/or additional post-processing metrology data is required, optical metrology measurements can be made at one or more sites on the wafer. In one embodiment, measurement features, such as periodic gratings, periodic arrays, and/or other periodic structures, on a post-processed wafer can be measured at one or more of the measurement sites shown in FIGS. 13A-13C. For example, the features on a wafer may be in a mask layer for a dual damascene process as shown in FIGS. 5A-5G.

The post-processing measurement process can be time consuming and can affect the throughput of a processing system. During process runs, a manufacturer may wish to minimize the amount of time used to measure a wafer. The post-processing measurement plan can be context driven and different strategies and/or plans may be selected based on the context of the wafer. For example, one or more wafers may not be measured and/or the post-processing measurement process may be performed using a subset of measurement sites included in the post-processing measurement plan.

In one embodiment, during a development portion of the semiconductor process, one or more post-processing reference maps can be created and stored for later use. A reference measurement map can include measured data at measurement sites that are different from those shown in FIGS. 13A-13C. Alternatively, a reference measurement map can use the same set of measurement sites or a reference measurement map may not be required.

A post-processing reference prediction map can include predicted measured data at measurement sites that are different from those shown in FIGS. 13A-13C. Alternatively, a reference prediction map can use the same set of measurement sites or a reference prediction map may not be required.

A post-processing reference confidence map can include confidence data at measurement sites that are different from those shown in FIGS. 13A-13C. Alternatively, a reference confidence map can use the same set of measurement sites or a reference confidence map may not be required.

The measurement, prediction, and/or confidence maps can include one or more Goodness Of Fit (GOF) maps, one or more grating thickness maps, one or more via-related maps, one or more Critical Dimension (CD) maps, one or more CD profile maps, one or more material related maps, one or more trench-related maps, one or more sidewall angle maps, one or more differential width maps, or a combination thereof. The pre-process data can also include site result data, site number data, CD measurement flag data, number of measurement sites data, coordinate X data, and coordinate Y data, among others.

Figure 14A:
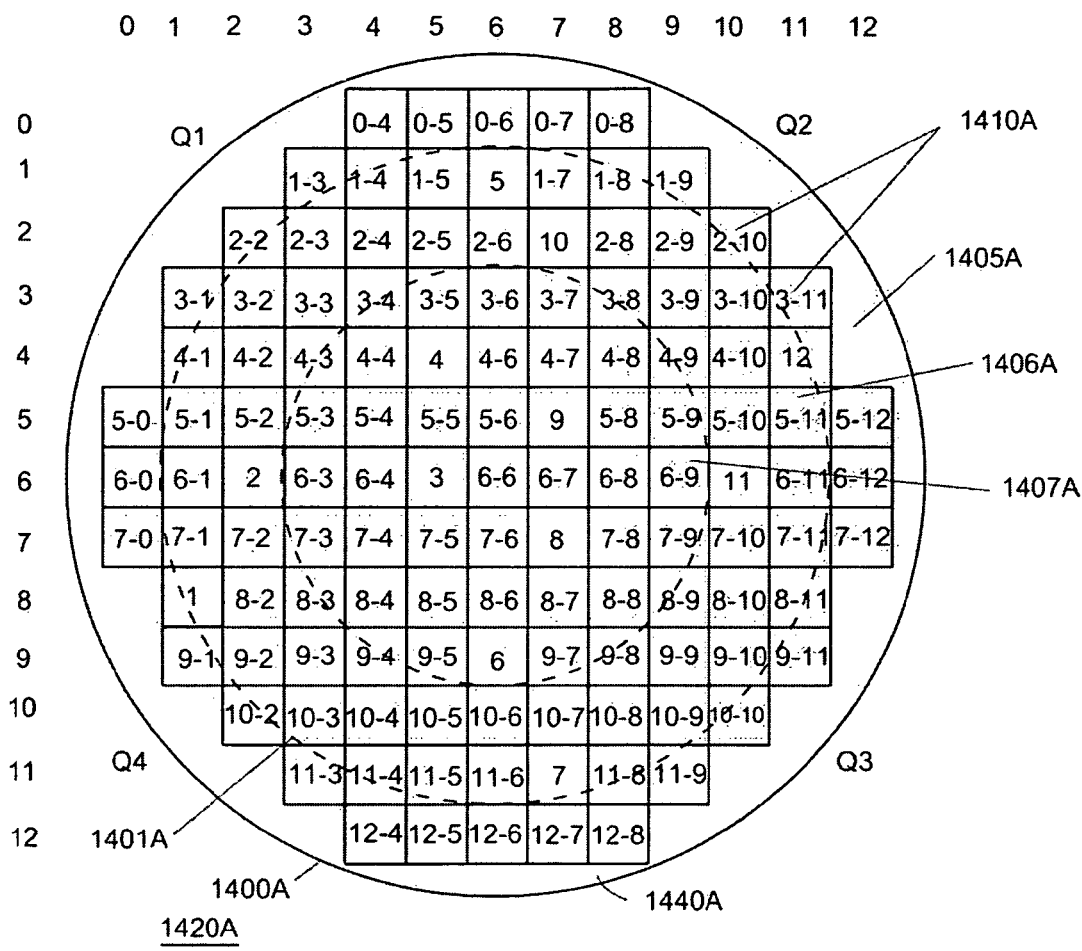
FIGS. 14A-14C illustrate exemplary views of post-processing prediction maps in accordance with embodiments of the invention.
Figure 14:
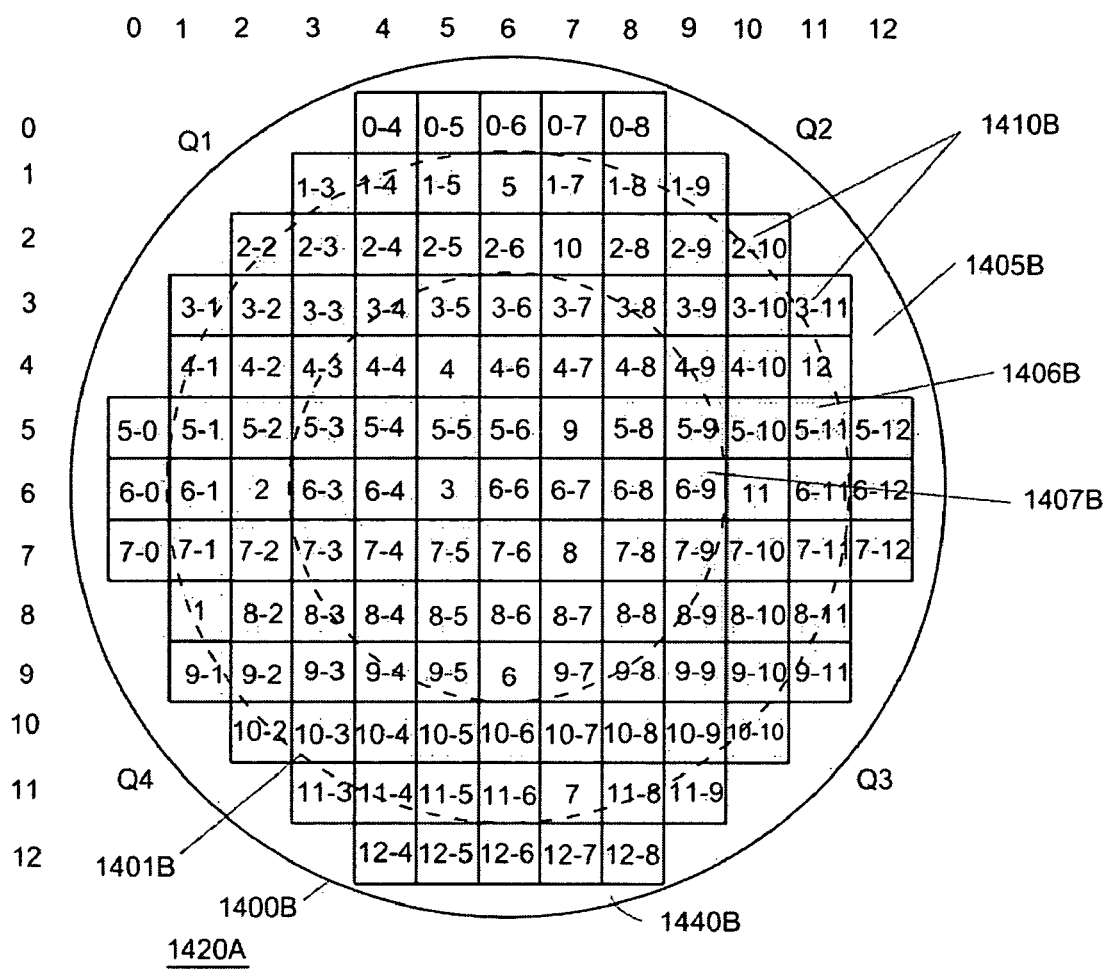
Figure 14C:
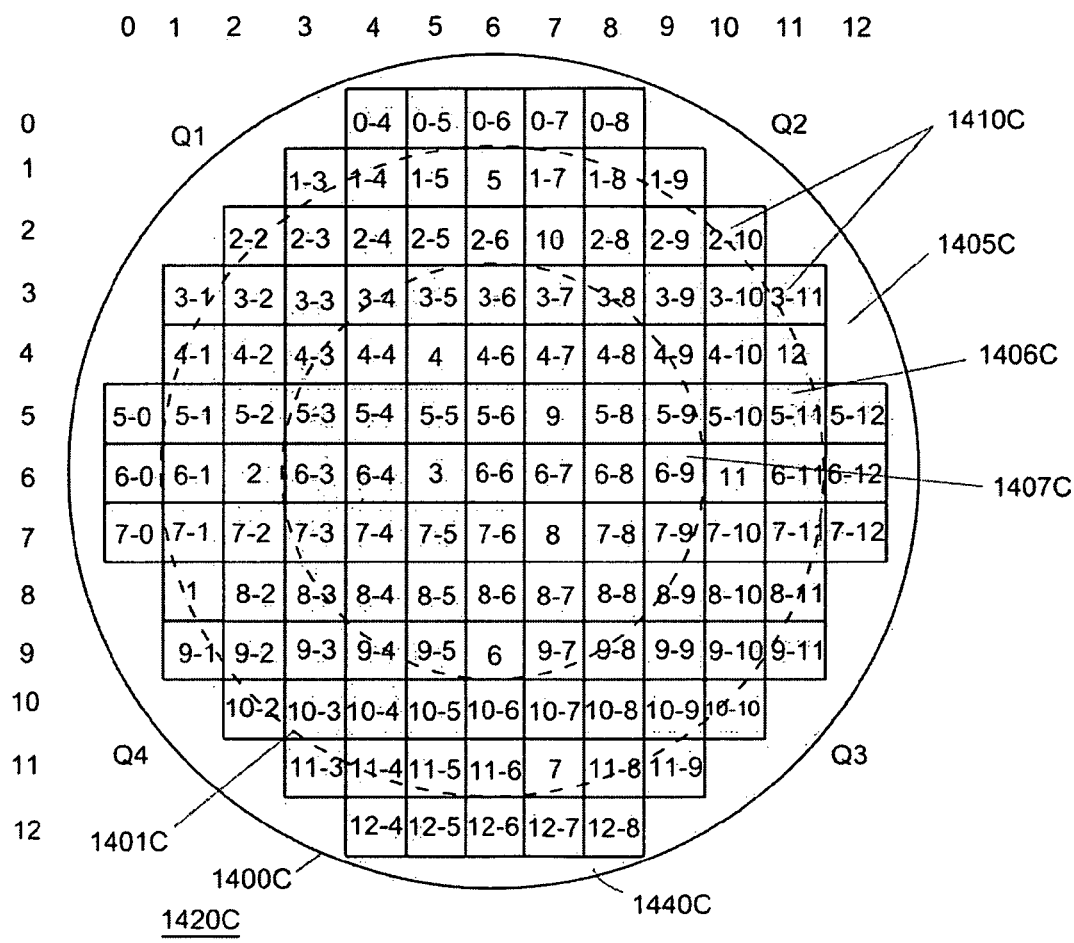

During a post-processing measurement process, one or more post-processing prediction maps can be calculated. FIGS. 14A-14C show simplified views of post-processing prediction maps.

FIG. 14A shows a simplified view of a first post-processing prediction map 1420A on a wafer 1400A that includes a plurality of chip/dies 1410A. Rows and columns are numbered from zero to twelve for illustration. In addition, twelve chip/dies 1430A are labeled (1A-12A), and these chip/dies can be used to define the location of the measurement sites for the illustrated post-processing prediction map 1420A. In addition, two circular lines (1401A and 1402A) are shown, and these lines can be used to establish three regions (1405A, 1406A, and 1407A) on the wafer 1400A. Furthermore, a reference side 1540A is shown that can indicate a notch location. Alternatively, a different number of regions having different shapes may be established on the post-processing prediction map 1420A, and a different number of measurement sites may be established at different locations on the wafer.

FIG. 14B shows a simplified view of a second post-processing prediction map 1420B on a wafer 1400B that includes a plurality of chip/dies 1410B. Rows and columns are numbered from zero to twelve for illustration. In addition, twelve chip/dies 1430B are labeled (1B-12B), and these chip/dies can be used to define the location of the measurement sites for the illustrated post-processing prediction map 1420B. In addition, two circular lines (1401B and 1402B) are shown, and these lines can be used to establish three regions (1405B, 1406B, and 1407B) on the wafer 1400B. Furthermore, a reference side 1440B is shown that can indicate a notch location. Alternatively, a different number of regions having different shapes may be established on the post-processing prediction map 1420B, and a different number of measurement sites may be established at different locations on the wafer.

FIG. 14C shows a simplified view of a third post-processing prediction map 1420C on a wafer 1400C that includes a plurality of chip/dies 1410C. Rows and columns are numbered from zero to twelve for illustration. In addition, twelve chip/dies 1430C are labeled (1C-12C), and these chip/dies can be used to define the location of the measurement sites for the illustrated post-processing prediction map 1420C. In addition, two circular lines (1401C and 1402C) are shown, and these lines can be used to establish three regions (1405C, 1406C, and 1407C) on the wafer 1400C. Furthermore, a reference side 1440C is shown that can indicate a notch location. Alternatively, a different number of regions having different shapes may be established on the post-processing prediction map 1420C, and a different number of measurement sites may be established at different locations on the wafer.

In some embodiments, curve-fitting procedures can be performed to calculate data for the sites on the wafer that are not measured. Alternatively, the prediction maps may be determined using surface estimating, surface fitting techniques, or other mathematical techniques. When prediction maps are created for a wafer, one or more measurement sites can be established in one or more wafer areas, and these measurement sites can be used to provide areas where the predicted data can be more accurate. For example, when the prediction maps are created, measurements do not have to be made at all of the measurement sites.

One or more post-processing equations can be determined using the measured data from one or more of the measurement sites. For example, a post-processing equation can be determined using the measured data from a set of the measurement sites shown in FIGS. 14A-14C, and this post-processing equation can be used and/or modified to calculate the predicted values (expected measured data) for one or more of the chip/dies on the wafer. Alternatively, other measurement sites may be used to determine a post-processing equation.

In some cases, an entire post-processing prediction map can be calculated using one or more post-processing equations and/or modified versions. Alternatively, a post-processing equation and/or a modified version may be used to calculate/predict values for a portion of the wafer. For example, the portion may include one or more radial areas and/or quadrants.

A post-processing equation can be modified as necessary to fit the measured data in one or more other measurement sites. An error condition can be declared when a post-processing equation cannot be determined and/or modified properly. In addition, an error condition can be declared when one or more of the measured values and/or calculated/predicted values are outside a uniformity limit established for the wafer.

Some errors that are generated by mapping applications can be sent to the FDC system, and the FDC system can decide how the processing system should respond to the error. Other errors can be resolved by the mapping applications.

In other cases, one or more additional post-processing equations can be determined using the measured data from other sets of measurement sites. One or more of the additional post-processing equations and/or modified versions can be used to create additional post-processing measured maps that include calculated/predicted values for one or more of the chip/dies on the wafer. An error condition can be declared when an additional post-processing equation cannot be determined and/or modified properly. In addition, an error condition can be declared when one or more of the measured values and/or calculated/predicted values are outside a uniformity limit established for the wafer. Alternatively, the one or more additional post-processing equations and/or modified versions may be used to calculate/predict values for a portion of a wafer map. For example, the portion may include one or more radial areas and/or quadrants. In addition, a post-processing prediction map can be compared to limits established for the wafer using another map or historical data.

Figure 15A:
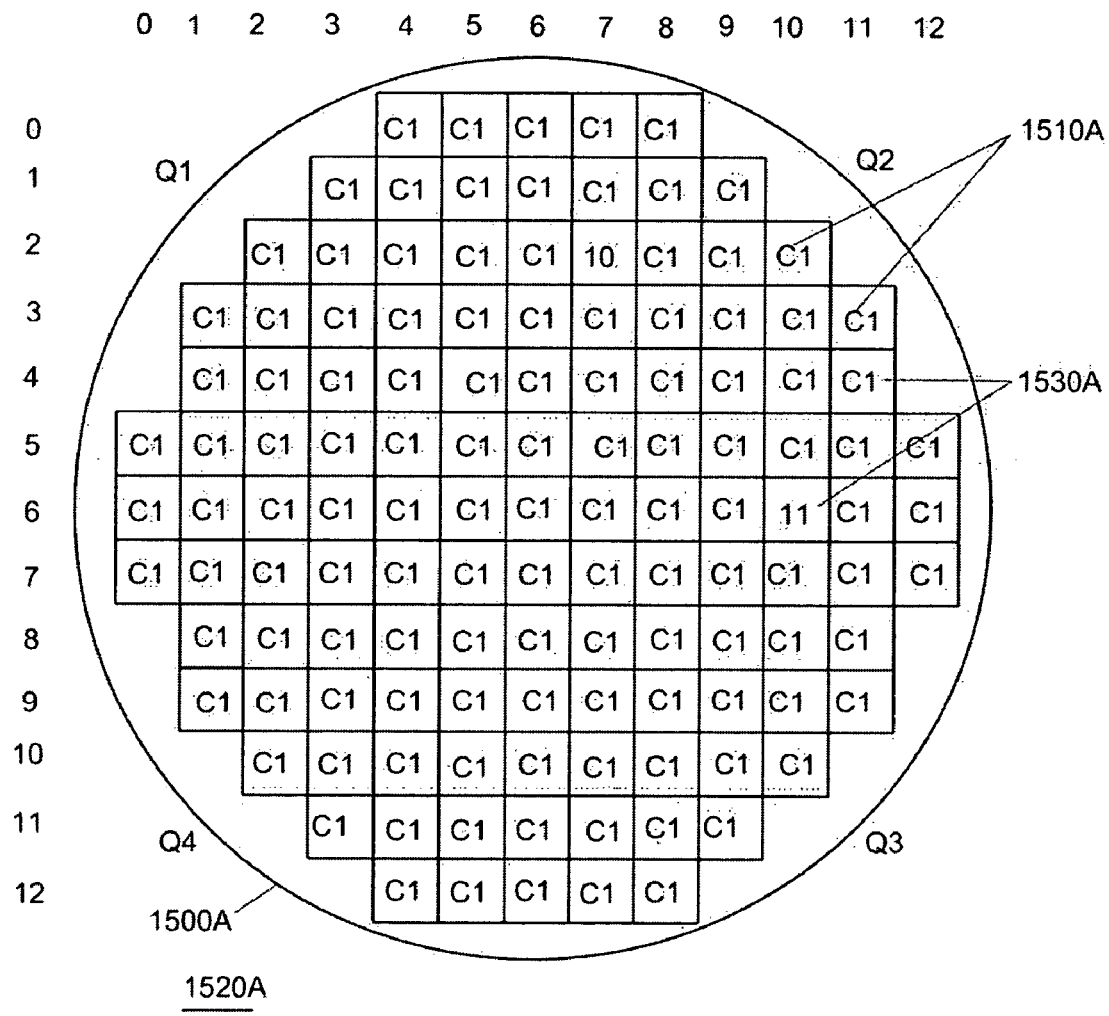
FIGS. 15A-15C illustrate exemplary views of post-processing confidence maps in accordance with embodiments of the invention.
Figure 15B:
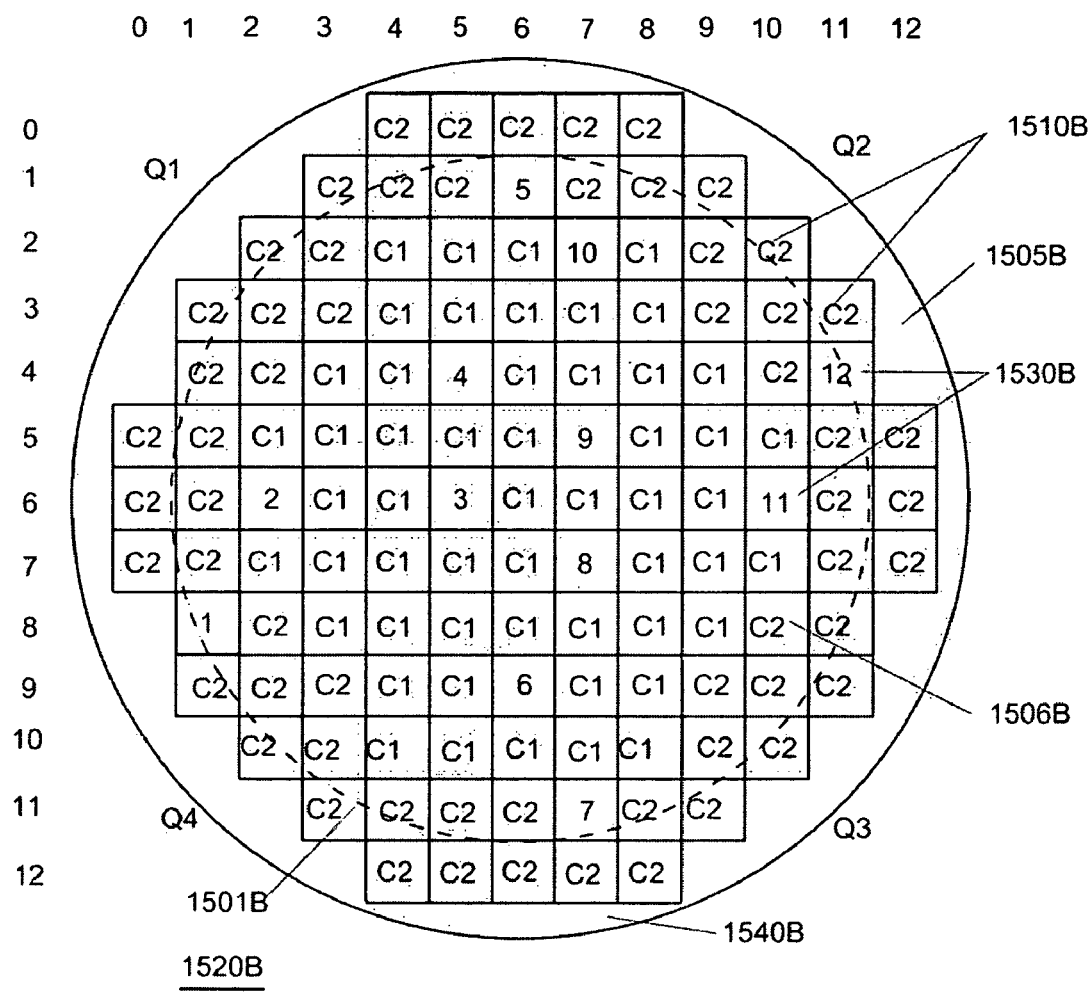
Figure 15C:
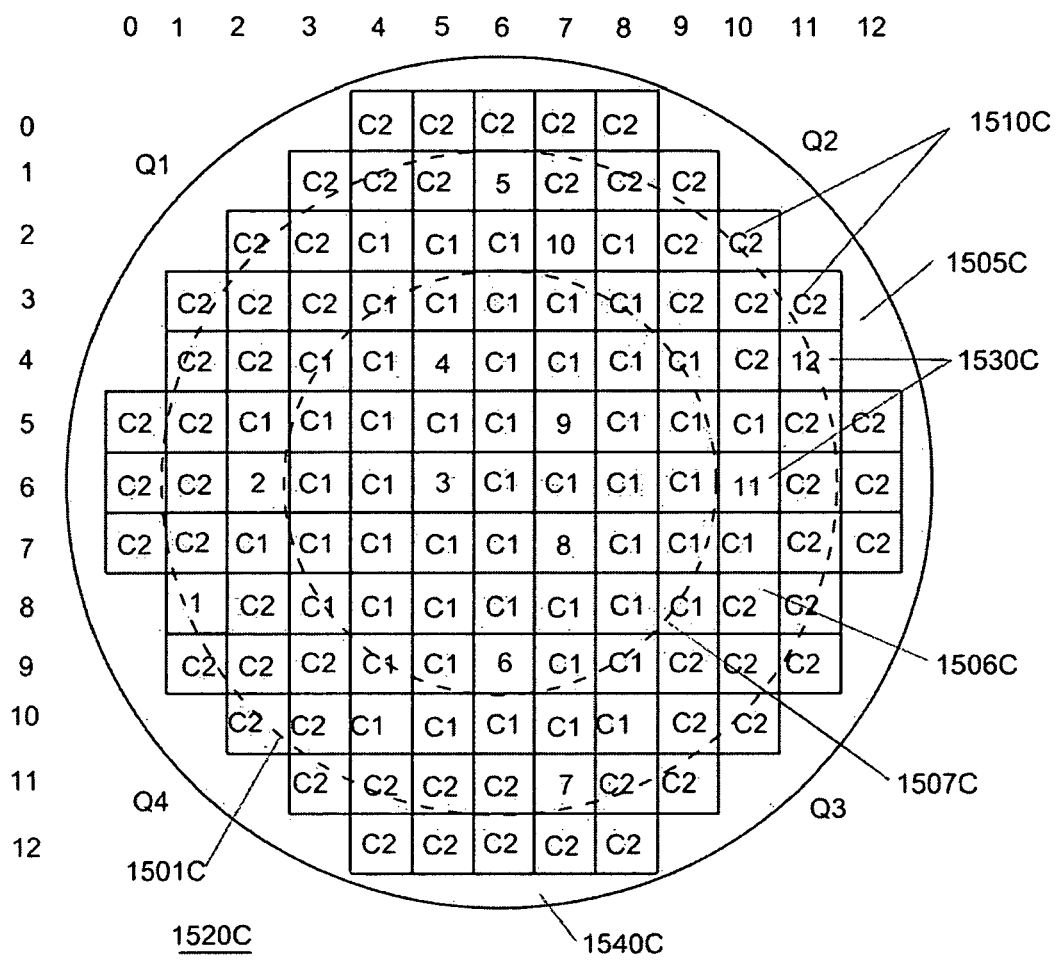

During a post-processing measurement process, one or more post-processing confidence maps can be calculated. FIGS. 15A-15C illustrate exemplary views of post-processing confidence maps in accordance with embodiments of the invention.

FIG. 15A shows a simplified view of a post-processing confidence map 1520A on a wafer 1500A including a plurality of chip/dies 1510A, twelve measurement sites 1530A labeled as (1A-12A), and a reference side 1540A that can indicate a notch location on a wafer. As shown in FIG. 15A, a post-processing confidence map can have a uniform value "C1" across the entire wafer. For example, the value "C1" can indicate a high confidence level in the predicted values for the measured post-processing data across the entire wafer. The value "C1" can indicate the data is within the limits established for the wafer:

FIG. 15B shows a simplified view of another post-processing confidence map 1520B on a wafer 1500B including a plurality of chip/dies 1510B, twelve measurement sites 1530B labeled as (1B-12B), and a reference side 1540B that can indicate a notch location on a wafer. In addition, a circular line 1501B is shown, and this line can be used to establish two regions (1505B and 1506B) on the wafer 1500B. The confidence map can be divided into two different areas as shown using the values "C1" and "C2" and different values and/or rules can be established for the different areas. For example, two areas can be used to account for differences between a center region and an edge region. Alternatively, a different number of regions having different shapes may be established on the new pre-processing confidence map, and a different number of confidence values may be established at different locations on the wafer.

FIG. 15C shows a simplified view of another post-processing confidence map 1520C on a wafer 1500C including a plurality of chip/dies 1510C, twelve measurement sites 1530C labeled as (1C-12C), and a reference side 1540C that can indicate a notch location on a wafer. In addition, two circular lines 1501C and 1502C are shown, and these lines can be used to establish three regions (1505C, 1506C, and 1507C) on the wafer 1500C. The post-processing confidence map can be divided into three different areas as shown using the values "C1", "C2", and "C3" and different values and/or rules can be established for the different areas. For example, three areas can be used to account for differences between an inner region, a mid region, and an outer region. Alternatively, a different number of regions having different shapes may be established on a new post-processing confidence map, and a different number of confidence values may be established at different locations on the wafer.

During a post-processing measurement process, one or more post-processing confidence maps can be calculated. In other embodiments, a different number of areas and/or differently shaped areas may be used. For example, a processing chamber may have unique characteristics that may affect the confidence levels in certain areas of the wafer.

In one embodiment, a post-processing confidence map can be calculated using the differences between a post-processing prediction map and a reference and/or historical prediction map. In other embodiments, a post-processing confidence map can be calculated using the differences between two post-processing prediction maps or differences between one or more post-processing prediction maps and uniformity limits established for a product line. For example, a manufacturer may allow wider limits for chips/dies in one or more regions of the wafer to maximize yield. A mapping application and/or the FDC system can use business rules to determine uniformity limits.

When a value in a prediction map is close to a uniformity limit, the confidence value may be lower than when the value in a prediction map is not close to uniformity limit.

In addition, the post-processing confidence values can be weighted for different chips/dies and/or different areas of the wafer. For example, a high confidence weight can be assigned to the calculations and/or data associated with one or more of the previously discussed measurement sites.

In addition, process results maps and/or confidence maps associated with one or more processes may be used to calculate a post-processing confidence map for a wafer. For example, values from a process results map and/or a confidence map may be used as weighting factors.

Curve-fitting procedures can be performed to calculate confidence data for the chip/dies on the wafer that do not have measured and/or predicted data associated with them. Alternatively, the confidence maps may be determined using surface estimating, surface fitting techniques, or other mathematical techniques.

During post-processing, different types of confidence maps can be created and/or modified. A first kind of post-processing confidence map can provide an estimate of the confidence in the measured data. Since it would take too long to measure the entire wafer, a smaller number of measurement sites is being used and confidence factors must be established to ensure that the predicted measured data accurately represents the data that would be obtained if more sites or a larger portion of the wafer were used to make the measurements.

A second kind of post-processing confidence map can provide an estimate of the confidence in one or more processes performed during a dual damascene procedure. Since it would take too long to measure the entire wafer after it has been processed and a semiconductor manufacturer would like to be sure that the one or more processes performed during a dual damascene procedure have been performed correctly, the actual measured data and/or the predicted measured data can be compared to the expected target values and when these numbers are within specified limits, the semiconductor manufacturer can assume that the dual damascene procedure was performed correctly even though the entire wafer has not been measured.

In task 665, a query can be performed to determine when to establish a prioritized site based on the post-processed data. When a post-processing prioritized site is required, procedure 600 can branch to task 670, and when a post-processing prioritized site is not required, procedure 600 can branch to task 685.

When the values in substantially all areas of the post-processing confidence map are high, it may not be necessary to establish a new post-processing prioritized site. In addition, when the differences between the prediction maps are small and/or when the differences between the post-processing prediction map and a reference measurement map are small, it may not be necessary to establish a new prioritized site.

In addition, when the values on a post-processing confidence map are consistently high for a particular process, a new post-processing measurement plan may be establish that uses a smaller number of measurement sites and that decreases the through-put time for each wafer.

When one or more values in one or more areas of the confidence map are low, one or more new prioritized sites can be established in those areas. In other embodiments, when the differences between the prediction maps are large and/or when the differences between the post-processing prediction map and a reference measurement map are large, one or more new prioritized sites can be established. When a process is being developed and/or modified, new prioritized sites can be established for the entire wafer or for a particular area such as a particular radial area or a particular quadrant (Q1, Q2, Q3, or Q4).

Figure 16A:
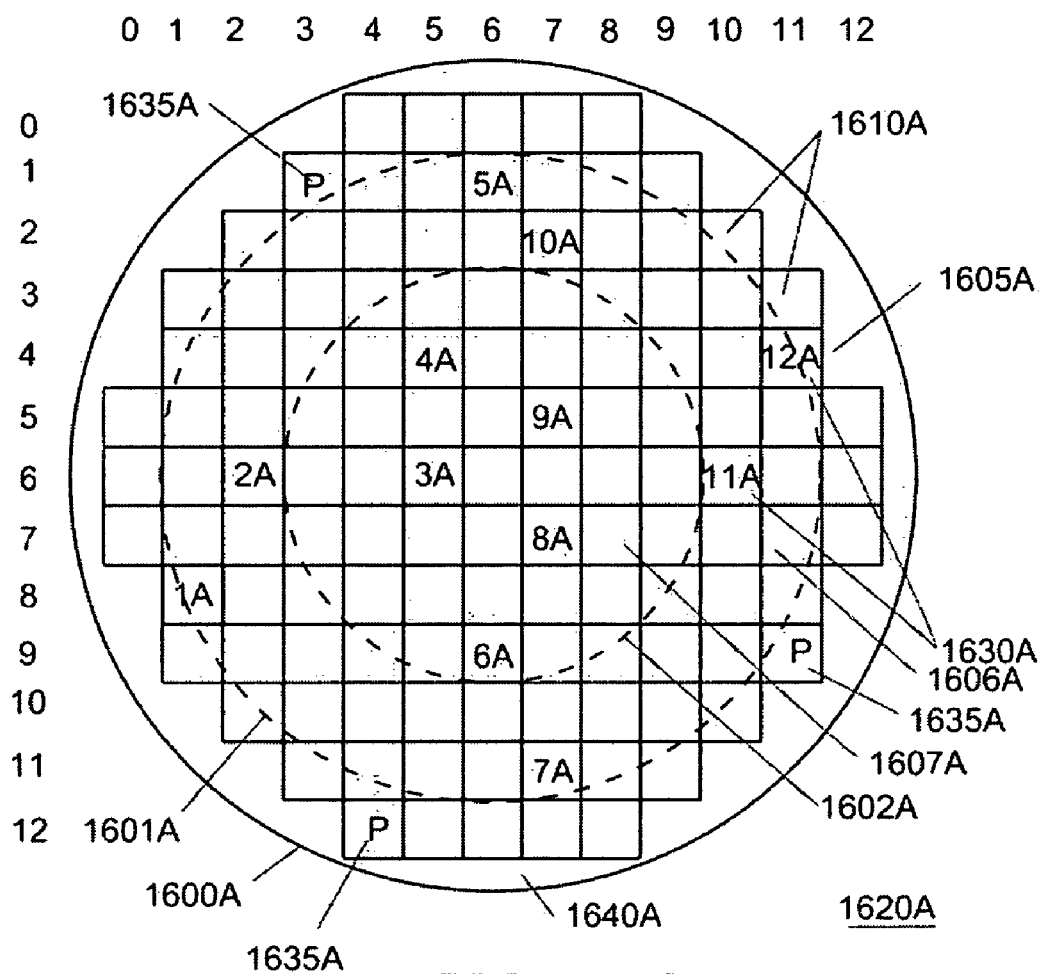
FIGS. 16A-16C illustrate exemplary views of new post-processing measurement maps in accordance with embodiments of the invention.

When a prioritized site is required, one or more new post-processing prioritized sites can be established. FIG. 16A shows a simplified view of a new post-processing measurement map 1620A on a wafer 1600A including a plurality of chip/dies 1610A, three new post-processing measurement site 1635A, the previously discussed twelve measurement sites 1630A labeled as (1A-12A), and a reference side 1640A that can indicate a notch location on a wafer.

In addition, two circular lines (1601A and 1602A) are shown, and these lines can be used to establish three regions (1605A, 1606A, and 1607A) on the wafer 1600A. Alternatively, a different number of regions having different shapes may be established on the new pre-processing measurement map, and a different number of new prioritized sites may be established at different locations on the wafer. When confidence values are low in one area of the wafer, one or more prioritized sites can be established in that area as post-processing measurement sites. For example, when the confidence values are low in the outer region 1605A one or more new prioritized sites 1635A may be established in or near the outer region as shown in FIG. 16A.

Figure 16B:
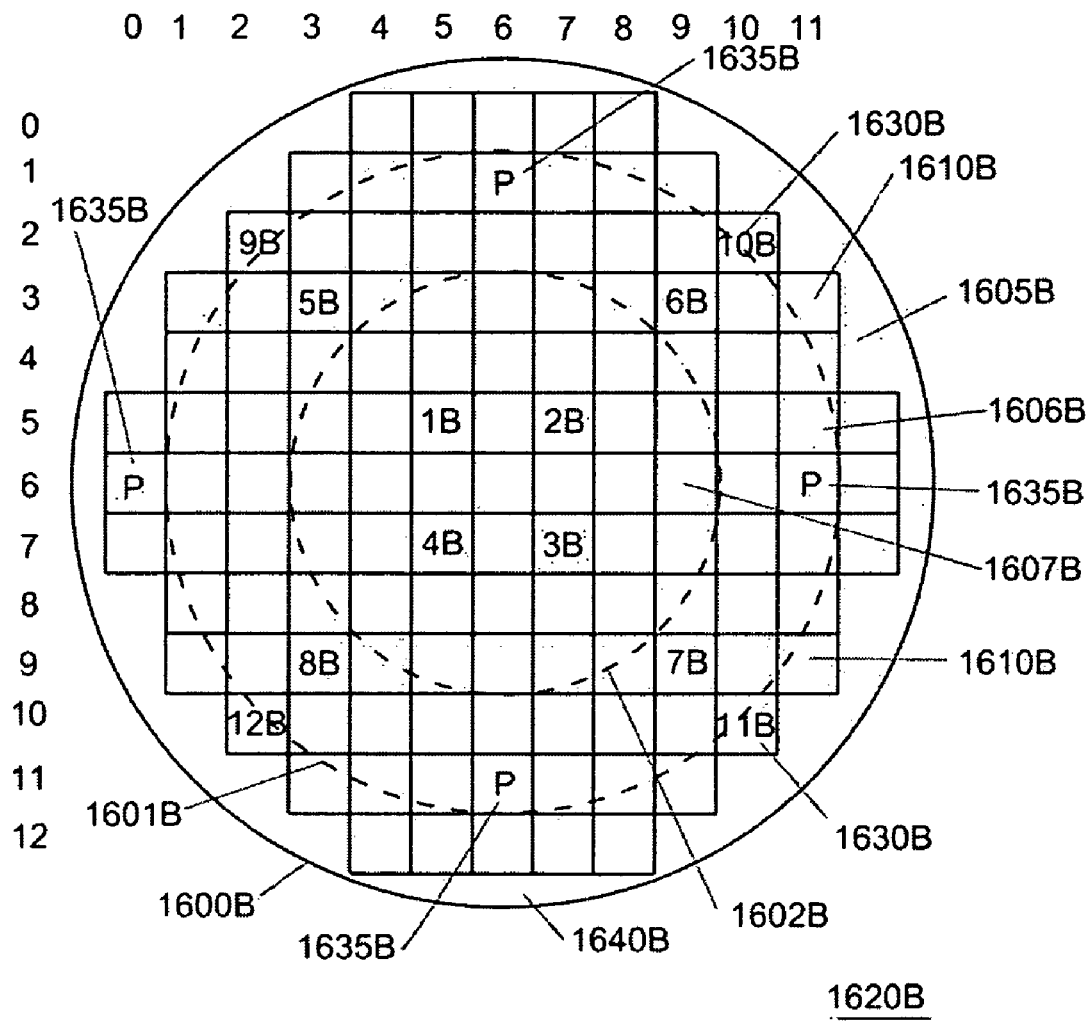

FIG. 16B shows a simplified view of another new post-processing measurement map 1620B on a wafer 1600B including a plurality of chip/dies 1610B, three new post-processing measurement site 1635B, the previously discussed twelve measurement sites 1630B labeled as (1B-12B), and a reference side 1640B that can indicate a notch location on a wafer.

In addition, two circular lines (1601B and 16702B) are shown, and these lines can be used to establish three regions (1605B, 1606B, and 1607B) on the wafer 1600B. Alternatively, a different number of regions having different shapes may be established on the new post-processing measurement map, and a different number of new prioritized sites may be established at different locations on the wafer. When confidence values are low in one area of the wafer, one or more prioritized sites can be established in that area as post-processing measurement sites. For example, when the confidence values are low in the mid region 1606B one or more new prioritized sites 1635B may be established in or near the mid region as shown in FIG. 16B.

Figure 16C:
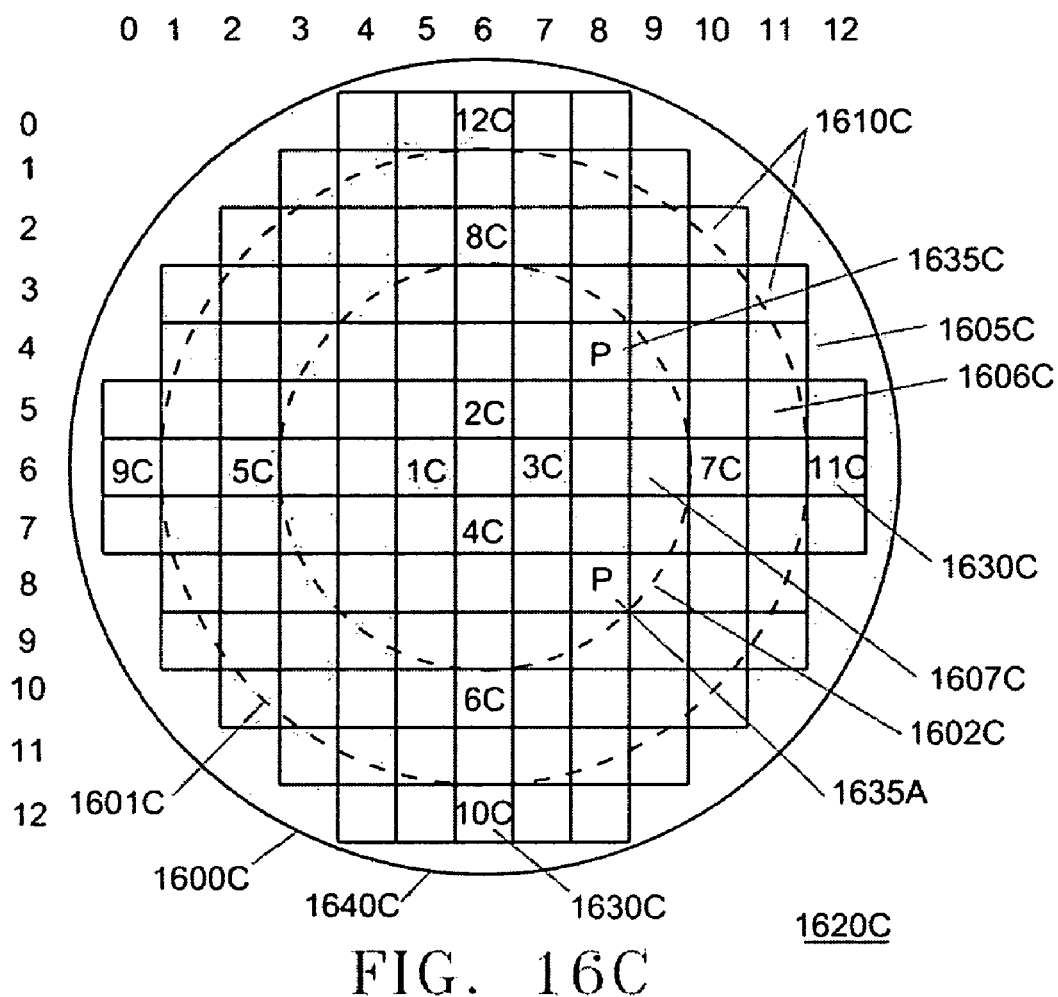

FIG. 16C shows a simplified view of another new post-processing measurement map 1620C on a wafer 1600C including a plurality of chip/dies 1610C, two new post-processing measurement site 1635C, twelve measurement sites 1630C labeled as (1C-12C), and a reference side 1640C that can indicate a notch location on a wafer.

In addition, two circular lines (1601C and 1602C) are shown, and these lines can be used to establish three regions (1605C, 1606C, and 1607C) on the wafer 1600C. Alternatively, a different number of regions having different shapes may be established on the new post-processing measurement map, and a different number of new prioritized sites may be established at different locations on the wafer. When confidence values are low in one area of the wafer, one or more prioritized sites can be established in that area as post-processing measurement sites. For example, when the confidence values are low in the inner region 1607C one or more new prioritized sites 1635C may be established in or near the inner region as shown in FIG. 16C.

When a new post-processing prioritized site is required, a new post-processing metrology recipe can be created, and the new recipe can be used to instruct the metrology tool to make additional post-processing measurements at the one or more prioritized sites. When the wafer is not in the metrology module, the new metrology recipe can be stored and can be used later to instruct the metrology module to make measurements at the one or more prioritized sites. Alternatively, when the wafer is located in the measurement module, measurements at the one or more new prioritized sites can be made is real time.

In one embodiment, the new post-processing prioritized site can be selected from a set of previously defined sites. For example, during process development and/or process verification procedures, measurements may have been made at more than forty sites, and one or more of these sites can be used. Alternatively, the new post-processing prioritized site may not be selected from a set of previously defined sites.

The post-processing confidence map can be a measure of the confidence in the calculated post-processing predicted values and can also be a measure of the confidence in the measured post-processing data and post-processing predicted data being within the required specifications.

When a new post-processing prioritized site is required, a new control strategy including a new post-processing metrology recipe can be created, and the new recipe can be used to instruct the metrology tool to make additional post-processing measurements at the one or more prioritized sites.

The new post-processing prioritized site can be selected from a set of previously defined sites. For example, during a setup and/or verification procedure, measurements may have been made at more than forty sites, and one or more of these sites can be used. Alternatively, the new post-processing prioritized site may not be selected from a set of previously defined sites.

In task 670, a query can be performed to determine when to measure the wafer using the new post-processing prioritized site. When measurements are required at the prioritized site, procedure 600 can branch to task 675, and when measurements are not required at the prioritized site, procedure 600 can branch to task 685.

When the post-processing confidence map is calculated while the wafer is in the metrology tool, the additional measurements at newly established prioritized sites can be performed with the minimum amount of delay. When the post-processing confidence map is calculated after the wafer has left the metrology tool, the new recipe can be used at a later time, and the additional measurements at the prioritized sites can be performed after some delay time.

In one embodiment, when the measured data for a prioritized site is created, it can be compared to the data in the post-processing prediction maps. Alternatively, when the measured data for a prioritized site is created, it can be stored and compared to the data in the post-processing prediction maps at a later time. An error condition can be declared when the measured data for a prioritized site is outside a limit established by a wafer uniformity specification.

When the measured data for a prioritized site is close to the value in a particular prediction map, that prediction map can be used in the area around the prioritized site. For example, when the one or more prioritized sites are in the first quadrant and the measured value(s) are close to the value(s) in the first post-processing prediction map, then the first post-processing prediction map can be used in the first quadrant.

When the measured data for a prioritized site is not close to the value in a particular prediction map, a new prediction map can be created and can be used in the area around the prioritized site. For example, when the one or more prioritized sites are in the first quadrant and the measured value(s) are not close to the value(s) in the pre-processing prediction maps, then a new pre-processing prediction map can be created and used in the first quadrant.

Whenever a post-processing prediction map changes, a new post-processing confidence map or a new portion of a post-processing confidence map can be calculated.

When a new post-processing measurement recipe is created for the metrology tool, the new measurement recipe can be used at a later time to instruct the metrology tool to make measurements at the one or more prioritized sites. For example, the new measurement recipe can be used to measure the next wafer or some other wafer. Alternatively, the current wafer can be moved into a metrology tool, and the new post-processing measurement recipe can be used to re-measure it.

Whenever a post-processing prediction map changes, a new post-processing confidence map or a new portion of a post-processing confidence map can be calculated. In addition, an averaged post-processing prediction map may be calculated. For example, the averaged post-processing predicted map can be calculated for the entire wafer or for a particular area such as a particular quadrant (Q1, Q2, Q3, or Q4).

In task 680, a query can be performed to determine when to establish another prioritized site based on the post-processing data. When another prioritized site is required, procedure 600 can branch to task 670, and when another prioritized site is not required, procedure 600 can branch to task 685. For example, when one or more additional prioritized sites have been identified, a post-processing measurement process can be performed at the one or more prioritized sites.

In task 685, a query can be performed to determine when an additional wafer requires processing. When a process is performed, a number of wafers can be processed as a lot or a batch. When additional wafer processing is not required, procedure 600 can branch to task 690, and when an additional wafer requires processing, procedure 600 can branch to task 610.

Procedure 600 can end in 690.

Figure 17A:
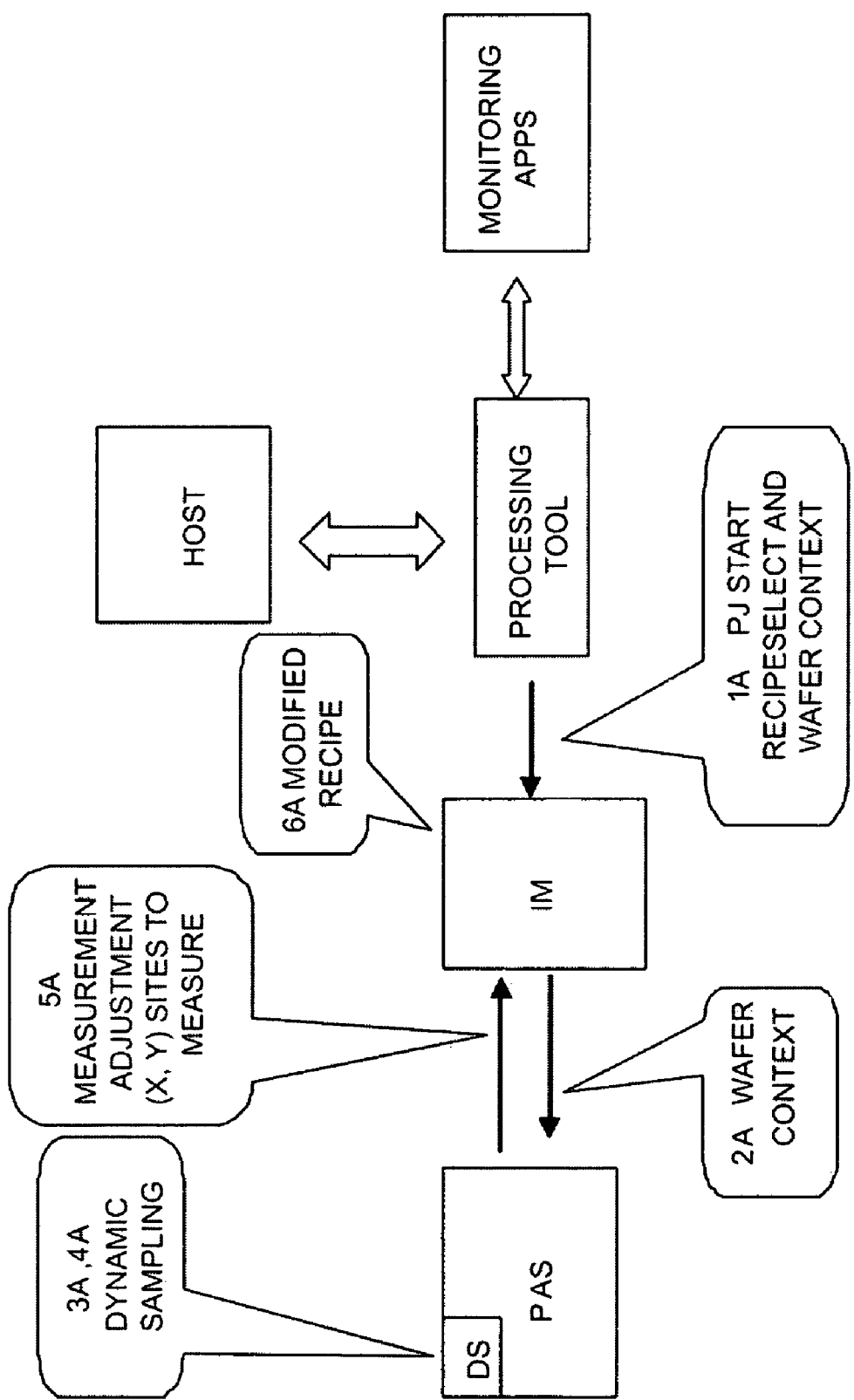
FIGS. 17A-17C illustrate different processing methods for performing dynamic sampling in accordance with embodiments of the invention.
Figure 17B:
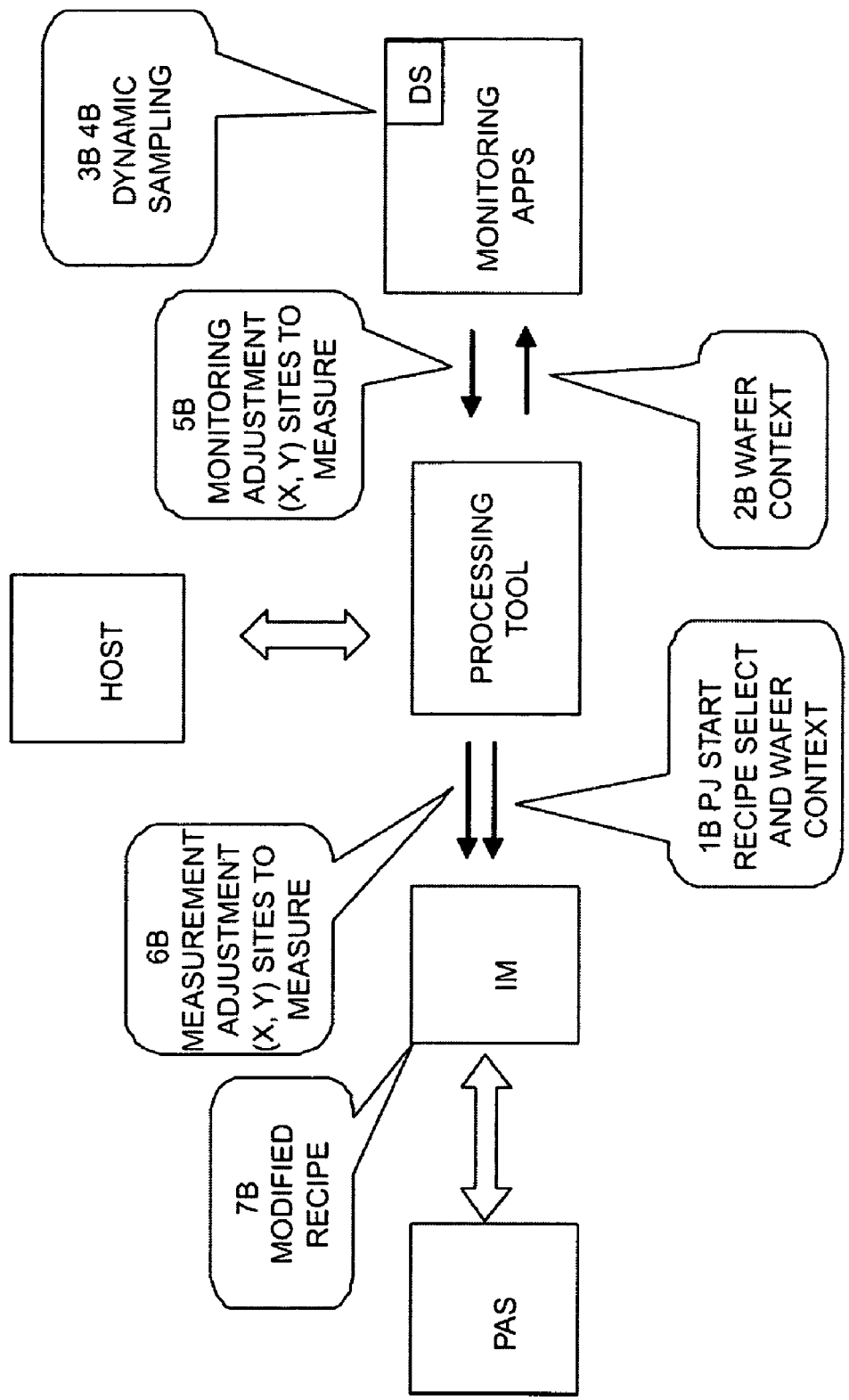
Figure 17C:
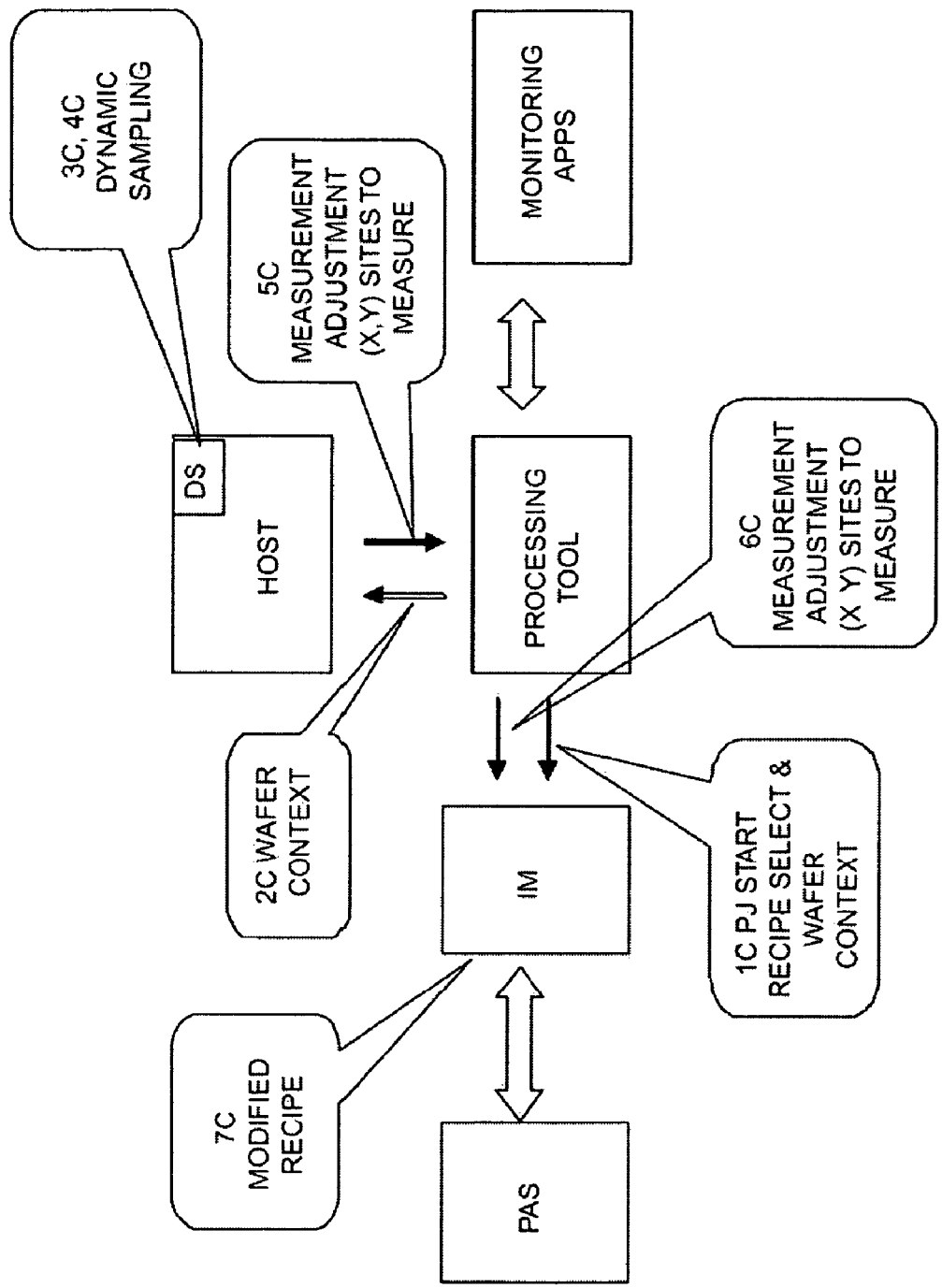

FIGS. 17A-17C illustrate different processing methods for performing dynamic sampling in accordance with embodiments of the invention. The application that computes the wafer measurement recipe settings (variable recipe adjustment for metrology) can be implemented with three different methods: the first method uses the Measurement Analysis System (Timbre PAS), the second method uses the Tool Process Control System (Telius®/Ingenio®), and the third method uses the Factory Host.

In the illustrated embodiment shown in FIG. 17A, one or more of the dynamic sampling applications can be performed by a PAS controller in the Measurement Analysis System. In 1A, a recipe list can be sent to IM with wafer context and a PJ Start command can be used. In 2A, the IM can send wafer context to a PAS controller and an optional wafer map may be included. In 3A, the PAS controller can evoke one or more Dynamic Sampling (DS) applications. In 4A, a DS application can be used to compute the wafer map site location adjustments. In 5A, the PAS controller can send a variable adjust message to IM. In 6A, the IM can make the measurements with modified recipe.

In the illustrated embodiment shown in FIG. 17B, one or more of the dynamic sampling applications can be performed by a controller in an Advanced Process Control (APC) System. In 1B, a recipe list can be sent to IM with wafer context and a PJ Start command can be used. In 2B, the tool can send wafer context to an APC controller and an optional wafer map may be included. In 3B, the APC controller can evoke one or more DS applications. In 4B, a DS application can be used to compute the wafer map site location adjustments. In 5B, the tool controller can receive a variable adjust message from the APC controller. In 6B, the tool controller can send a variable adjust message to the IM. In 7B, the IM can make the measurements with modified recipe.

In the illustrated embodiment shown in FIG. 17C, one or more of the dynamic sampling applications can be performed by a controller in a Host System. In 1C, a recipe list can be sent to the IM with wafer context and a PJ Start command can be used. In 2C, the tool can send wafer context to a Host controller and an optional wafer map may be included. In 3C, the Host controller can evoke one or more DS applications. In 4C, a DS application can be used to compute the wafer map site location adjustments. In 5C, the Host controller can send a variable adjust message to the processing tool. In 6C, the tool controller can send a variable adjust message to the IM. In 7C, the IM can make the measurements with modified recipe.

Referring back to FIG. 1, the controller 120 can use the difference between the measurement maps for the incoming material (input state) and process results maps (desired state) to predict, select, or calculate a set of process parameters to achieve the desired result of changing the state of the wafer from the input state to the desired state. For example, this predicted set of process parameters can be a first estimate of a recipe to use to provide a uniform process. In addition, measurement maps and/or process results maps can be obtained from the MES 130 and can be used to update the first estimate.

The controller 120 can compute a predicted state map for the wafer based on one or more input state maps, one or more processing module characteristics maps, and one or more process models. For example, an isolated feature etch rate map can be used along with a processing time to compute a predicted etch depth map for nested features. In addition, a nested etch rate map can be used along with a processing time to compute a predicted etch depth map for nested features, and a deposition rate map can be used along with a processing time to compute a deposition thickness map for spin-on coatings and resist layers.

In determining a confidence factor for a process, a required process result map can be used. The required process result map can comprise the difference between the desired process result map and the actual measured data map. Desired process result data, such as target data, can be compared to measured data. For example, the desired process result map can comprise at least one of a desired trench area map, a desired material thickness map, a desired sidewall angle map, a desired grating thickness map, a desired cross sectional area map, a desired CD width map, a desired CD depth map, a desired feature profile map, a desired trim amount map, a desired differential depth map, a desired uniformity map, and a desired differential width map.

The controller 120 can use the post-processing measurement maps and/or data to compute one or more process confidence maps using process deviations. This computed process confidence maps can be determined based on one or more desired process results maps and the actual process results map determined from one or more of the post-processing measurement maps obtained during the dual damascene procedure. In one case, the controller 120 obtains the required maps, and the controller 120 determines the differences between the desired state and the actual state using one or more maps. In this manner, one or more measured actual process results maps can be compared with one or more desired process results maps in order to determine a correction to the process recipe. For example, the "results" maps can include top CD maps, bottom CD maps, sidewall angle maps, and corrections can be made to the process recipes for the first damascene process, or the second damascene process, or both damascene processes.

In another case, the controller 120 can obtain one or more predicted state maps and one or more output state maps for the wafer, and the controller 120 determines the differences between the predicted state maps and the output state maps. In this manner, a measured actual process result map can be compared with a predicted process result map in order to determine corrections to one or more process model and/or maps. For example, the "results" maps can include top CD maps, bottom CD maps, sidewall angle maps, and corrections can be made to the process models for the trim processes, the BARC/ARC open etching processes, and/or the isolated/nested etching processes.

Maps can be updated using feed-back data that can be generated by running monitor, test, and/or production wafers, varying the process settings and observing the results, then updating one or more different maps. For example a map update can take place every N processing hours by measuring the before and after characteristics of a monitor wafer. By changing the settings over time to check different operating regions, the complete operating space can be validated over time, or run several monitor wafers at once with different recipe settings. The map update can take place within the controller 120, at the processing tool, or at the factory, allowing the factory to control and/or manage the monitor wafers and map updates.

The controller 120 can update maps at one or more points in a processing sequence. In one case, the controller 120 can use the feed-forward information, modeling information, and the feedback information to determine whether or not to change one or more of the currently used maps before running the current wafer, before running the next wafer, or before running the next lot.

When a mapping application is being performed, the source of the map may be important and may be identified in advance. For example, maps may be either externally generated or internally generated. The externally generated map can be provided by the MES 130. The internally generated map can be created using calculated values and/or an input from a GUI. In addition, business rules can be provided that can be used to determine when to use an externally generated map or an internally generated map. Maps must be evaluated and pre-qualified before they can be used.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed is:

1. A method of monitoring a dual damascene procedure comprising:
   receiving a wafer and/or wafer data, wherein the wafer comprises a plurality of dies and a number of measurement sites, each die having a patterned damascene layer on top of at least one other layer, and at least one measurement site having a periodic structure therein;
   calculating a pre-processing confidence map for a damascene process, the pre-processing confidence map including confidence data for a set of dies on the wafer;
   establishing an expanded pre-processing measurement recipe for the damascene process when one or more values in the pre-processing confidence map are not within confidence limits established for the damascene process, wherein the number of measurement sites is increased for the damascene process by establishing a new prioritized pre-processing measurement site for the damascene process; and
   establishing a reduced pre-processing measurement recipe for the damascene process when one or more values in the pre-processing confidence map are within confidence limits established for the damascene process, wherein the number of measurement sites is decreased for the damascene process by eliminating at least one de-prioritized pre-processing measurement site for the damascene process.

2. The method as claimed in claim 1, further comprising:
   measuring the wafer using the expanded pre-processing measurement recipe for the damascene process when new measurement data is required;
   creating an expanded pre-processing measurement map for the damascene process using the new measurement data; and
   storing the expanded pre-processing measurement recipe for the damascene process when new measurement data is not required.

3. The method as claimed in claim 1, further comprising:
   storing the reduced pre-processing measurement recipe for the damascene process; and
   performing the damascene process when one or more values in the pre-processing confidence map are within confidence limits established for the damascene process.

4. The method as claimed in claim 3, further comprising:
   calculating a second pre-processing confidence map for a second damascene process, the second pre-processing confidence map including confidence data for a second set of dies on the wafer;
   establishing an expanded pre-processing measurement recipe for the second damascene process when one or more values in the second pre-processing confidence map are not within confidence limits established for the second damascene process, wherein the number of measurement sites is increased for the second damascene process by establishing a new prioritized pre-processing measurement site for the second damascene process; and
   establishing a reduced pre-processing measurement recipe for the second damascene process when one or more values in the second pre-processing confidence map are within confidence limits established for the second damascene process, wherein the number of measurement sites is decreased for the second damascene process by eliminating at least one de-prioritized pre-processing measurement site for the second damascene process.

5. The method as claimed in claim 4, further comprising:
   measuring the wafer using the expanded pre-processing measurement recipe for the second damascene process when new measurement data is required; and
   storing the expanded pre-processing measurement recipe for the second damascene process when new measurement data is not required.

6. The method as claimed in claim 4, further comprising:
   storing the reduced pre-processing measurement recipe for the second damascene process; and
   performing the second damascene process when one or more values in the second pre-processing confidence map are within confidence limits established for the second damascene process.

7. The method as claimed in claim 6, further comprising:
   calculating a post-processing confidence map for the second damascene process, the post-processing confidence map including confidence data for a third set of dies on the wafer;
   establishing an expanded post-processing measurement recipe for the second damascene process when one or more values in the post-processing confidence map are not within confidence limits established for the second damascene process, wherein the number of measurement sites is increased for the second damascene process by establishing a new prioritized post-processing measurement site for the second damascene process; and
   establishing a reduced post-processing measurement recipe for the second damascene process when one or more values in the post-processing confidence map are within confidence limits established for the second damascene process, wherein the number of measurement sites is decreased for the second damascene process by eliminating at least one de-prioritized post-processing measurement site for the second damascene process.

8. The method as claimed in claim 7, further comprising:
   measuring the wafer using the expanded post-processing measurement recipe for the second damascene process when new measurement data is required; and
   storing the expanded post-processing measurement recipe for the second damascene process when new measurement data is not required.

9. The method as claimed in claim 7, further comprising:
   storing the reduced post-processing measurement recipe for the second damascene process;

transferring the wafer to a first holding area when one or more values in the post-processing confidence map are within confidence limits established for the second damascene process; and transferring the wafer to a second holding area when one or more values in the post-processing confidence map are not within confidence limits established for the second damascene process.

10. The method as claimed in claim 3, further comprising:

calculating a post-processing confidence map for the damascene process, the post-processing confidence map including confidence data for a second set of dies on the wafer;

establishing an expanded post-processing measurement recipe for the damascene process when one or more values in the post-processing confidence map are not within confidence limits established for the damascene process, wherein the number of measurement sites is increased for the damascene process by establishing a new prioritized post-processing measurement site for the damascene process; and establishing a reduced post-processing measurement recipe for the damascene process when one or more values in the post-processing confidence map are within confidence limits established for the damascene process, wherein the number of measurement sites is decreased for the damascene process by eliminating at least one de-prioritized post-processing measurement site for the damascene process.

11. The method as claimed in claim 10, further comprising:

measuring the wafer using the expanded post-processing measurement recipe for the damascene process when new measurement data is required; and storing the expanded post-processing measurement recipe for the damascene process when new measurement data is not required.

12. The method as claimed in claim 10, further comprising:

storing the reduced post-processing measurement recipe for the damascene process; and performing a second damascene process when one or more values in the post-processing confidence map are within confidence limits established for the damascene process.

13. The method as claimed in claim 12, further comprising:

calculating a post-processing confidence map for the second damascene process, the post-processing confidence map including confidence data for a third set of dies on the wafer;

establishing an expanded post-processing measurement recipe for the second damascene process when one or more values in the post-processing confidence map are not within confidence limits established for the second damascene process, wherein the number of measurement sites is increased for the second damascene process by establishing a new prioritized post-processing measurement site for the second damascene process; and establishing a reduced post-processing measurement recipe for the second damascene process when one or more values in the post-processing confidence map are within confidence limits established for the second damascene process, wherein the number of measurement sites is decreased for the second damascene process by eliminating at least one de-prioritized post-processing measurement site for the second damascene process.

14. The method as claimed in claim 13, further comprising:

measuring the wafer using the expanded post-processing measurement recipe for the second damascene process when new measurement data is required; and storing the expanded post-processing measurement recipe for the second damascene process when new measurement data is not required.

15. The method as claimed in claim 14, further comprising:

storing the reduced post-processing measurement recipe for the second damascene process;

transferring the wafer to a first holding area when one or more values in the post-processing confidence map are within confidence limits established for the second damascene process; and transferring the wafer to a second holding area when one or more values in the post-processing confidence map are not within confidence limits established for the second damascene process.

16. The method as claimed in claim 1, wherein the calculating of the pre-processing confidence map further comprises:

calculating a pre-processing prediction map for the wafer, wherein the pre-processing prediction map is determined using a pre-processing map, a post-processing map, a reference map, a process map, a process results map, or a historical map, or a combination of two or more thereof;

calculating the pre-processing confidence map for the damascene process, the pre-processing confidence map including confidence data for a first set of dies on the wafer, wherein the confidence map is determined using a difference between the pre-processing prediction map and historical data.

17. The method as claimed in claim 1, wherein the calculating of the pre-processing confidence map further comprises:

calculating the first pre-processing confidence map using a pre-processing map, a post-processing map, a reference map, a process map, a process results map, or a historical map, or a combination of two or more thereof.

18. The method as claimed in claim 1, wherein the calculating of the pre-processing confidence map further comprises:

creating a pre-processing measurement map for a first region of the wafer using measured data for at least one of the measurement sites on the wafer;

calculating a pre-processing prediction map for the first region of the wafer using the pre-processing measurement map for a first region of the wafer, the pre-processing prediction map including a first set of predicted measured data for at least one die in the first region of the wafer;

calculating the pre-processing confidence map for the first damascene process using a difference between the pre-processing prediction map and historical data.

19. The method as claimed in claim 18, wherein the first region comprises a circular shape, an annular shape, a pie shape, a square shape, or a rectangular shape.

20. The method as claimed in claim 7, wherein the calculating of the post-processing confidence map for the second damascene process further comprises:

calculating a post-processing prediction map for the wafer, wherein the post-processing prediction map is determined using a pre-processing map, a post-processing map, a reference map, a process map, a process results map, or a historical map, or a combination of two or more thereof;

calculating the post-processing confidence map for the second damascene process, the post-processing confidence map including confidence data for a second set of dies on the wafer, wherein the post-processing confidence map is determined using a difference between the post-processing prediction map and historical data.

21. The method as claimed in claim 7, wherein the calculating of the post-processing confidence map for the second damascene further comprises:
calculating the post-processing confidence map using a pre-processing map, a post-processing map, a reference map, a process map, a process results map, or a historical map, or a combination of two or more thereof.

22. The method as claimed in claim 7, wherein the calculating of the post-processing confidence map for the second damascene further comprises:
creating a post-processing measurement map for a first region of the wafer using measured data for at least one of the measurement sites on the wafer;
calculating a post-processing prediction map for the first region of the wafer using the post-processing measurement map for a first region of the wafer, the post-processing prediction map including a first set of predicted measured data for at least one die in the first region of the wafer;
calculating the post-processing confidence map for the second damascene process using a difference between the post-processing prediction map and historical data.

23. The method as claimed in claim 22, wherein the first region comprises a circular shape, an annular shape, a pie shape, a square shape, or a rectangular shape.

24. The method as claimed in claim 1, further comprising:
measuring the periodic structure in at least one of the measurement sites using polarizing reflectometry, spectroscopic ellipsometry, reflectometry, and/or optical digital profilometry (ODP) techniques; and
calculating measured data for at least one of the first set of dies on the wafer that is proximate to the at least one of the measurement sites.

25. The method as claimed in claim 1, further comprising:
positioning at least one of the measurement sites in a scribe line on the wafer.

26. The method as claimed in claim 1, wherein a confidence value associated with the first set of dies on the wafer is higher than a confidence value for the other dies on the wafer.

27. The method as claimed in claim 1, wherein the pre-processing confidence map for the wafer is created in real-time when the wafer is received by a measurement module.

28. The method as claimed in claim 1, wherein the wafer data includes critical dimension (CD) data, depth data, sidewall data, sidewall angle data, thickness data, material data, trench data, via data, or n and k value data or any combination of two or more thereof.

29. The method as claimed in claim 1, wherein the dual damascene procedure comprises a Via First Trench Last (VFTL) and the damascene process comprise a via etching process.

30. The method as claimed in claim 1, wherein the dual damascene procedure comprises a Trench First Via Last (TFVL) and the damascene process comprises a trench etching process.

31. The method as claimed in claim 1, wherein the calculating of the pre-processing confidence map comprises:
comparing one or more uniformity limits to a first pre-processing prediction map, a second pre-processing prediction map, or a averaged pre-processing prediction map.

32. The method as claimed in claim 31, further comprising:
calculating the first pre-processing prediction map for the wafer using a first pre-processing equation, the first pre-processing equation being determined using measured data from two or more measurement sites located in a first direction; and
calculating the second pre-processing prediction map for the wafer using a second pre-processing equation, the second pre-processing equation being determined using measured data from two or more measurement sites located in a second direction.

33. The method as claimed in claim 31, further comprising:
calculating the first pre-processing prediction map for the wafer using a first pre-processing surface, the first pre-processing surface being determined using measured data from two or more measurement sites located in a first radial direction; and
calculating the second pre-processing prediction map for the wafer using a second pre-processing surface, the second pre-processing surface being determined using measured data from two or more measurement sites located in a second radial direction.

* * * * *